(12) United States Patent
Yamanaka et al.

(10) Patent No.: US 11,688,743 B2
(45) Date of Patent: Jun. 27, 2023

(54) ACTIVE MATRIX SUBSTRATE AND METHOD FOR MANUFACTURING SAME

(71) Applicant: Sharp Kabushiki Kaisha, Sakai (JP)

(72) Inventors: Masamitsu Yamanaka, Sakai (JP); Yoshimasa Chikama, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 106 days.

(21) Appl. No.: 17/364,938

(22) Filed: Jul. 1, 2021

(65) Prior Publication Data

US 2022/0005838 A1 Jan. 6, 2022

(30) Foreign Application Priority Data

Jul. 6, 2020 (JP) .............................. JP2020-116270

(51) Int. Cl.
*H01L 21/02* (2006.01)
*H01L 27/115* (2017.01)
(Continued)

(52) U.S. Cl.
CPC .... *H01L 27/1225* (2013.01); *H01L 21/02565* (2013.01); *H01L 27/127* (2013.01);
(Continued)

(58) Field of Classification Search
CPC ........... H01L 21/02565; H01L 27/1251; H01L 27/02631; H01L 27/02617; H01L 27/1225; H01L 27/1255; H01L 27/127; H01L 27/3262; H01L 29/66969; H01L 29/7869; H01L 29/78696; H01L 21/30604; H01L 21/02617; H01L 21/78838;
(Continued)

(56) References Cited

U.S. PATENT DOCUMENTS 10,269,832 B2 * 4/2019 Hayashi .............. H01L 29/4908
2008/0225024 A1 9/2008 Ito
(Continued)

FOREIGN PATENT DOCUMENTS

JP 2006-119404 A 5/2006
JP 2008-225036 A 9/2008
(Continued)

*Primary Examiner* — Nikolay K Yushin
(74) *Attorney, Agent, or Firm* — Keating & Bennett, LLP

(57) ABSTRACT

An active matrix substrate includes a first TFT and a second TFT, each of TFTs includes an oxide semiconductor layer and a gate electrode arranged on a part of the oxide semiconductor layer with a gate insulating layer therebetween, in which in the first TFT, the oxide semiconductor layer, in a first region covered with the gate electrode with the gate insulating layer interposed between the oxide semiconductor layer and the gate electrode, has a layered structure including a lower oxide semiconductor film and an upper oxide semiconductor film throughout and a mobility of the upper oxide semiconductor film is higher than a mobility of the lower oxide semiconductor film, and in the second TFT, in at least a part of a first region of the oxide semiconductor layer, of the lower oxide semiconductor film and the upper oxide semiconductor film, one oxide semiconductor film is provided, and another oxide semiconductor film is not provided.

20 Claims, 56 Drawing Sheets

(51) Int. Cl.
  *H01L 29/66* (2006.01)
  *H01L 27/12* (2006.01)
  *H01L 29/786* (2006.01)
  *H10K 59/121* (2023.01)

(52) U.S. Cl.
  CPC ...... *H01L 27/1251* (2013.01); *H01L 27/1255* (2013.01); *H01L 29/66969* (2013.01); *H01L 29/7869* (2013.01); *H01L 29/78696* (2013.01); *H10K 59/1213* (2023.02)

(58) Field of Classification Search
  CPC ........... H10K 59/1213; H10K 59/1201; H10K 59/00; H10K 59/12
  See application file for complete search history.

(56) References Cited

U.S. PATENT DOCUMENTS

| | | |
|---|---|---|
| 2012/0138922 A1 | 6/2012 | Yamazaki et al. |
| 2013/0038518 A1 | 2/2013 | Tagawa et al. |
| 2013/0320334 A1 | 12/2013 | Yamazaki et al. |
| 2014/0286076 A1 | 9/2014 | Aoki et al. |
| 2017/0309649 A1* | 10/2017 | Hayashi ............ H01L 29/78645 |
| 2019/0280126 A1 | 9/2019 | Kikuchi et al. |

FOREIGN PATENT DOCUMENTS

| | | |
|---|---|---|
| JP | 2012-134475 A | 7/2012 |
| JP | 2014-007399 A | 1/2014 |
| JP | 2014-209727 A | 11/2014 |
| JP | 2015-109315 A | 6/2015 |
| JP | 2019-160829 A | 9/2019 |
| NO | 2011/118079 A1 | 9/2011 |

\* cited by examiner

ACTIVE MATRIX SUBSTRATE AND METHOD FOR MANUFACTURING SAME

CROSS-REFERENCE TO RELATED APPLICATIONS

This application claims the benefit of priority to Japanese Patent Application Number 2020-116270 filed on Jul. 6, 2020. The entire contents of the above-identified application are hereby incorporated by reference.

BACKGROUND

Technical Field

The disclosure relates to an active matrix substrate and a manufacturing method of the active matrix substrate.

An active matrix substrate used in a liquid crystal display device, an organic electroluminescence (EL) display device, or the like includes a display region including a plurality of pixels, and a region other than the display region (a non-display region or a frame region). The display region includes a switching element such as a Thin Film Transistor (hereinafter referred to as a "TFT") for each of the pixels. As such a switching element, a TFT including an amorphous silicon film serving as an active layer (hereinafter referred to as an "amorphous silicon TFT") and a TFT including a polycrystalline silicon film serving as an active layer (hereinafter referred to as a "polycrystalline silicon TFT") have been widely used.

Use of an oxide semiconductor as a material of the active layer of the TFT, in place of amorphous silicon and polycrystalline silicon has been proposed. Such a TFT is referred to as an "oxide semiconductor TFT". The oxide semiconductor has a higher mobility than amorphous silicon. Thus, the oxide semiconductor TFT can operate at a higher speed than the amorphous silicon TFT.

A structure of the TFT is roughly classified into a bottom gate structure and a top gate structure. Currently, the bottom gate structure is often adopted for the oxide semiconductor TFT, but it is also proposed to use the top gate structure (see, for example, JP 2015-109315 A). In the top gate structure, the gate insulating layer can be thinned, resulting in high current supply performance.

In the non-display region of the active matrix substrate, peripheral circuits such as a drive circuit may be monolithically (integrally) formed. By forming the drive circuit monolithically, the non-display region is narrowed and the mounting process is simplified, resulting in cost reduction. For example, in the non-display region, the gate driver circuit may be formed monolithically, and the source driver circuit may be mounted by a chip on glass (COG) process.

In devices such as smartphones, where there is a high demand for narrowing the frame, in addition to the gate driver, a demultiplexer circuit such as a source shared driving (SSD) circuit may be formed monolithically. The SSD circuit is a circuit that distributes video data from one video signal line connected to each terminal of the source driver to a plurality of source wiring lines. By mounting the SSD circuit, the region in which the terminal portions and the wiring lines are arranged in the non-display region (terminal portion and wiring line formation region) can be further narrowed. Additionally, the number of outputs from the source driver can be reduced and the circuit size can be reduced, thereby reducing the cost of the driver IC.

Peripheral circuits such as a drive circuit, an SSD circuit and the like include TFTs. In the description, a TFT arranged as a switching element in each pixel in the display region is referred to as a "pixel TFT", and a TFT configuring the peripheral circuit is referred to as a "circuit TFT". Further, among the circuit TFTs, a TFT configuring the drive circuit is referred to as a "drive circuit TFT", and a TFT configuring the SSD circuit is referred to as an "SSD circuit TFT".

In an active matrix substrate using an oxide semiconductor TFT as the pixel TFT, from the perspective of the manufacturing process, it is preferable that the circuit TFT be also formed by using the same oxide semiconductor film as the pixel TFT and by using a common process. Therefore, the circuit TFT and the pixel TFT usually have the same structure. The characteristics of these TFTs are also substantially the same.

SUMMARY

However, the characteristics required for the pixel TFT and the circuit TFT are different from each other. Further, among the circuit TFTs, for example, the drive circuit TFT and the SSD circuit TFT have different required characteristics. In recent years, the types of peripheral circuits formed monolithically in the active matrix substrate have been increasing, which further diversifies the performance required for the circuit TFTs.

Further, in an organic EL display device, a pixel circuit including at least two types of pixel TFTs (referred to as a "drive TFT" and a "selection TFT") and a capacitance element is provided in one pixel. The selection TFT has a function of selecting a pixel by changing the voltage applied to the drive TFT. The drive TFT functions to supply a current required for light emission. Since the selection TFT and the drive TFT have different functions, the characteristics required for the selection TFT and the drive TFT may also be different.

As described above, in an active matrix substrate provided with a plurality of TFTs having different uses, it is necessary to separately produce a plurality of oxide semiconductor TFTs having different characteristics so that each TFT can have the required characteristics according to the use.

An embodiment of the present disclosure has been conceived in light of the above-described circumstances, and an object of the present disclosure is to provide an active matrix substrate having a top gate structure and including a plurality of oxide semiconductor TFTs having different characteristics from one another.

An active matrix substrate and a manufacturing method of an active matrix substrate are disclosed herein in the following items.

Item 1

An active matrix substrate having a display region including a plurality of pixel areas and a non-display region arranged around the display region, the active matrix substrate including a substrate and a plurality of oxide semiconductor TFTs supported on the substrate and provided in the display region or the non-display region, each of the plurality of oxide semiconductor TFTs includes an oxide semiconductor layer and a gate electrode arranged on a part of the oxide semiconductor layer with a gate insulating layer interposed between the oxide semiconductor layer and the gate electrode, in which the oxide semiconductor layer has a first region covered with the gate electrode with the gate insulating layer interposed between the oxide semiconductor layer and the gate electrode, a first TFT and a second TFT are included in the plurality of oxide semiconductor TFTs, in the first TFT, in the first region, the oxide semiconductor layer has a layered structure including a lower oxide semiconductor film and an upper oxide semiconductor film arranged on the lower oxide semiconductor film throughout and a mobility of the upper oxide semiconductor film is higher than a mobility of the lower oxide semiconductor film, and in the second TFT, in at least a part of the first region of the oxide semiconductor layer, of the lower oxide semiconductor film and the upper oxide semiconductor film, one oxide semiconductor film is provided and another oxide semiconductor film is not provided.

Item 2

The active matrix substrate according to item 1, in which in the at least a part of the first region in the second TFT, the lower oxide semiconductor film is provided and the upper oxide semiconductor film is not provided.

Item 3

The active matrix substrate according to item 1, in which in the at least a part of the first region in the second TFT, the upper oxide semiconductor film is provided and the lower oxide semiconductor film is not provided.

Item 4

An active matrix substrate having a display region including a plurality of pixel areas and a non-display region arranged around the display region, the active matrix substrate including a substrate and a plurality of oxide semiconductor TFTs supported on the substrate and provided in the display region or the non-display region, each of the plurality of oxide semiconductor TFTs includes an oxide semiconductor layer, a gate electrode arranged on a part of the oxide semiconductor layer with a gate insulating layer interposed between the oxide semiconductor layer and the gate electrode, a source electrode, and a drain electrode, in which the oxide semiconductor layer has a first region covered with the gate electrode with the gate insulating layer interposed between the oxide semiconductor layer and the gate electrode, and a first contact region and a second contact region located on both sides of the first region, and the first contact region is electrically connected to the source electrode, and the second contact region is electrically connected to the drain electrode, a first TFT and a second TFT are included in the plurality of oxide semiconductor TFTs, in the first TFT, in the first region, the oxide semiconductor layer has a layered structure including a lower oxide semiconductor film and an upper oxide semiconductor film arranged on the lower oxide semiconductor film throughout, and mobilities of the upper oxide semiconductor film and the lower oxide semiconductor film are different from each other, and in the second TFT, in the first contact region and the second contact region, the oxide semiconductor film has the layered structure, but in at least a part of the first region, of the lower oxide semiconductor film and the upper oxide semiconductor film, one oxide semiconductor film is provided and another oxide semiconductor film is not provided.

Item 5

The active matrix substrate according to item 4, in which in the at least a part of the first region in the second TFT, the lower oxide semiconductor film is provided and the upper oxide semiconductor film is not provided.

Item 6

The active matrix substrate according to item 4, in which in the at least a part of the first region in the second TFT, the upper oxide semiconductor film is provided and the lower oxide semiconductor film is not provided.

Item 7

The active matrix substrate according any one of items 4 to 6, in which in the second TFT, the oxide semiconductor layer has the layered structure in a part of the first region, and includes the one oxide semiconductor film and does not include the other oxide semiconductor film, in another part of the first region.

Item 8

The active matrix substrate according any one of items 4 to 6, in which in the second TFT, in the entirety of the first region of the oxide semiconductor layer, the one oxide semiconductor film is provided, and the other oxide semiconductor film is not provided.

Item 9

The active matrix substrate according to any one of items 4 to 8, in which a mobility of the upper oxide semiconductor film is higher than a mobility of the lower oxide semiconductor film.

Item 10

The active matrix substrate according to any one of items 4 to 8, in which a mobility of the upper oxide semiconductor film is lower than a mobility of the lower oxide semiconductor film.

Item 11

The active matrix substrate according to any one of items 4 to 10, in which each of the plurality of oxide semiconductor TFTs further includes an insulating layer covering the oxide semiconductor layer and the gate electrode, and the source electrode is in contact with the first contact region in a first opening formed in the insulating layer, and the drain electrode is in contact with the second contact region in a second opening formed in the insulating layer.

Item 12

The active matrix substrate according to any one of items 1 to 11, in which in the first TFT, the gate insulating layer is in contact with an upper face of the upper oxide semiconductor film, and in the second TFT, the gate insulating layer is in contact with an upper face of the one oxide semiconductor film.

Item 13

The active matrix substrate according to any one of items 4 to 6, in which a third TFT is further included in the plurality of oxide semiconductor TFTs, in the second TFT, in the entirety of the first region, of the lower oxide semiconductor film and the upper oxide semiconductor film, one oxide semiconductor film is provided and another oxide semiconductor film is not provided, and in the third TFT, in the first contact region, the second contact region, and a part of the first region, the oxide semiconductor layer has the layered structure, in another part of the first region, the one oxide semiconductor film is provided and the other oxide semiconductor film is not provided.

Item 14

The active matrix substrate according to any one of items 1 to 12, in which a third TFT is further included in the plurality of oxide semiconductor TFTs, in the third TFT, in the at least a part of the first region in the oxide semiconductor layer, the other oxide semiconductor film is provided, and the one oxide semiconductor film is not provided.

Item 15

The active matrix substrate according to any one of items 1 to 14, in which the first TFT is arranged in each of the plurality of pixel areas, and the second TFT is included in a peripheral circuit arranged in the non-display region.

Item 16

The active matrix substrate according to any one of items 1 to 14, in which in each of the plurality of pixel areas, a pixel circuit including at least a drive TFT, a selection TFT, and a capacitance element is provided, and of the first TFT and the second TFT, one TFT is the drive TFT and another TFT is the selection TFT.

Item 17

A manufacturing method of an active matrix substrate having a display region including a plurality of pixels and a non-display region provided around the display region, in which the active matrix substrate includes a plurality of oxide semiconductor TFTs arranged in the display region or the non-display region, and a first TFT to be formed in a first TFT formation region and a second TFT to be formed in a second TFT formation region are included in the plurality of oxide semiconductor TFTs, the manufacturing method including (A) a step of forming a lower oxide semiconductor film on a substrate in both of the first TFT formation region and the second TFT formation region, (B) a step of removing at least a part of the lower oxide semiconductor film located in the second TFT formation region by patterning the lower oxide semiconductor film, (C) after the step (B), a step of forming an upper oxide semiconductor film so as to cover the lower oxide semiconductor film in both of the first TFT formation region and the second TFT formation region, (D) a step of forming a first oxide semiconductor layer having a layered structure including the lower oxide semiconductor film and the upper oxide semiconductor film in the first TFT formation region and forming a second oxide semiconductor layer including a first portion including the upper oxide semiconductor film and not including the lower oxide semiconductor film in the second TFT formation region by patterning the lower oxide semiconductor film and the upper oxide semiconductor film, and (E) a step of forming a gate insulating layer and a gate electrode, in which the gate electrode is arranged on a part of the first oxide semiconductor layer with the gate insulating layer interposed between the first oxide semiconductor layer and the gate electrode in the first TFT formation region, and the gate electrode is arranged on at least a part of the first portion of the second oxide semiconductor layer with the gate insulating layer interposed between the first portion and the gate electrode in the second TFT formation region.

Item 18

A manufacturing method of an active matrix substrate having a display region including a plurality of pixels and a non-display region provided around the display region, in which the active matrix substrate includes a plurality of oxide semiconductor TFTs arranged in the display region or the non-display region, and a first TFT to be formed in a first TFT formation region and a second TFT to be formed in a second TFT formation region are included in the plurality of oxide semiconductor TFTs, the manufacturing method including (a) a step of forming a layered film including a lower oxide semiconductor film and an upper oxide semiconductor film arranged on the lower oxide semiconductor film on a substrate in both of the first TFT formation region and the second TFT formation region, (b) a step of forming a first oxide semiconductor layer having a layered structure including the lower oxide semiconductor film and the upper oxide semiconductor film in the first TFT formation region and forming a layered body having a layered structure including the lower oxide semiconductor film and the upper oxide semiconductor film in the second TFT formation region by patterning the layered film, (c) a step of removing at least a part of the upper oxide semiconductor film in the layered body in the second TFT formation region, in which a second oxide semiconductor layer including a first portion that includes the lower oxide semiconductor film and does not include the upper oxide semiconductor film is formed in the second TFT formation region, and (d) a step of forming a gate insulating layer and a gate electrode, in which the gate electrode is arranged on a part of the first oxide semiconductor layer with the gate insulating layer interposed between the first oxide semiconductor layer and the gate electrode in the first TFT formation region, and the gate electrode is arranged on at least a part of the first portion of the second oxide semiconductor layer with the gate insulating layer interposed between the first portion and the gate electrode in the second TFT formation region.

Item 19

The manufacturing method of an active matrix substrate according to item 17 or 18, in which the second oxide semiconductor layer further includes a layered portion having the layered structure, and in the second TFT formation region, the gate electrode is arranged so as to cover at least a part of the first portion and a part of the layered portion of the second oxide semiconductor layer with the gate insulating layer interposed between the gate electrode and the second oxide semiconductor layer.

Item 20

The manufacturing method of an active matrix substrate according to item 17 or 18, in which the second oxide semiconductor layer further includes a layered portion having the layered structure, and, in the second TFT formation region, the gate electrode is arranged so as to cover the first portion of the second oxide semiconductor layer with the gate insulating layer interposed between the gate electrode and the first portion and so as not to cover the layered portion of the second oxide semiconductor layer.

Item 21

The active matrix substrate according to item 13 or 14, the active matrix substrate further including a drive circuit and an SSD circuit arranged in the non-display region, in which the first TFT is arranged in each of the plurality of pixel areas, and of the second TFT and the third TFT, at least one TFT is included in the drive circuit, and another TFT is included in the SSD circuit.

Item 22

The active matrix substrate according to any one of items 1 to 16, in which each of the upper oxide semiconductor film and the lower oxide semiconductor film contains In and/or Sn, and of the upper oxide semiconductor film and the lower oxide semiconductor film, a sum of atomic ratios of In and Sn to all metal elements in an oxide semiconductor film having a lower mobility is smaller than a sum of atomic ratios of In and Sn to all metal elements in another oxide semiconductor film having a higher mobility.

Item 23

The active matrix substrate according to any one of items 1 to 16, in which, of the upper oxide semiconductor film and the lower oxide semiconductor film, an oxide semiconductor film having a higher mobility contains Sn, and another oxide semiconductor film having a lower mobility does not contain Sn or contains Sn at a lower concentration than the oxide semiconductor film having the higher mobility.

Item 24

The active matrix substrate according to any one of items 1 to 16, in which each of the upper oxide semiconductor film and the lower oxide semiconductor film contains an In—Ga—Zn—O based semiconductor, and of the upper oxide semiconductor film and the lower oxide semiconductor film, an atomic ratio of In to all metal elements in an oxide semiconductor film having a higher mobility is larger than an atomic ratio of In to all metal elements in another oxide semiconductor film having a lower mobility.

Item 25

The active matrix substrate according to item 24, in which the In—Ga—Zn—O based semiconductor in the upper oxide semiconductor film and/or the lower oxide semiconductor film contains a crystalline portion.

Item 26

The active matrix substrate according to any one of items 1 to 16 and 22 to 25, in which, when viewed from a normal direction of the substrate, in the oxide semiconductor layer of the first TFT, the upper oxide semiconductor film is located within an upper face of the lower oxide semiconductor film.

Item 27

The active matrix substrate according to any one of items 1 to 16 and 22 to 25, in which, in the oxide semiconductor layer of the first TFT, the upper oxide semiconductor film covers an upper face and a side surface of the lower oxide semiconductor film.

Item 28

The manufacturing method of an active matrix substrate according to item 18, in which the lower oxide semiconductor film contains Sn, and the upper oxide semiconductor film does not contain Sn or contains Sn at a lower concentration than the lower oxide semiconductor film, and the step (c) includes a step of selectively etching the upper oxide semiconductor film in the layered body by wet etching using a PAN-based etching solution.

According to an embodiment of the disclosure, an active matrix substrate having a top gate structure and including a plurality of oxide semiconductor TFTs having different characteristics is provided. Further, according to an embodiment of the disclosure, provided is a manufacturing method of an active matrix substrate capable of producing a plurality of oxide semiconductor TFTs having different characteristics by using the same oxide semiconductor film.

BRIEF DESCRIPTION OF DRAWINGS

The disclosure will be described with reference to the accompanying drawings, wherein like numbers reference like elements.

DESCRIPTION OF EMBODIMENTS

Figure 1:
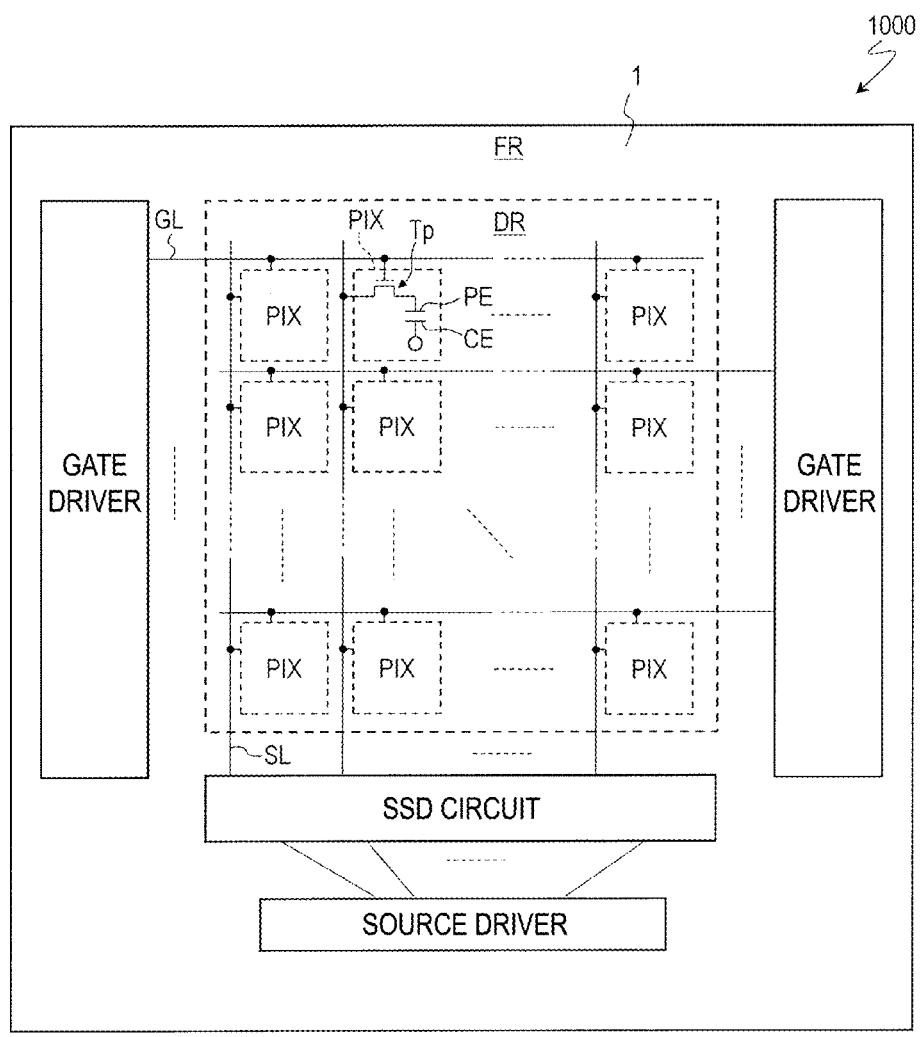
FIG. 1 is a schematic diagram illustrating an example of a planar structure of an active matrix substrate 1000 according to a first embodiment.

As described above, the TFTs provided in the active matrix substrate have different required characteristics depending on the respective uses. Hereinafter, an example of suitable TFT characteristics will be described using an active matrix substrate used in a liquid crystal display device as an example.

Since the oxide semiconductor TFT has excellent off-characteristics when the bias voltage to the gate is zero volts, no charge is emitted from the oxide semiconductor TFT when the gate is off, and discharge through the oxide semiconductor TFT is unlikely to occur. However, the charge without being released (residual charge) may cause liquid crystal to operate, thereby causing poor display (charge unevenness). In order to suppress the poor display, when the oxide semiconductor TFT is used as a pixel TFT, the threshold voltage of the oxide semiconductor TFT may be lowered to increase an off-leakage current.

In contrast, when the oxide semiconductor TFT is used in a drive circuit such as a gate driver, it is preferable that the threshold voltage be shifted in a positive direction from the threshold voltage of the pixel TFT to reduce the off-leakage current. A large off-leakage current may result in increased power consumption, operation failure or malfunction of the drive circuit, or the like. The drive circuit TFT may have, for example, enhancement characteristics of having a positive threshold voltage.

On the other hand, an SSD circuit TFT used in an SSD circuit is required to flow a relatively large on current and have a large current driving force. Therefore, it is preferable to lower the threshold voltage to further increase the on current. The SSD circuit TFT may have, for example, depletion characteristics of having a negative threshold voltage.

Further, in the active matrix substrate used in an organic EL display device, a pixel circuit including at least a drive TFT and a selection TFT is provided in one pixel. The drive TFT preferably has enhancement characteristics. Further, in order to suitably perform multi-gray scale display, it is preferable that the Vg-Id (Vg represents a gate voltage and Id represents a drain current) characteristic of the drive TFT be gentle (that is, not steep) to some extent. Therefore, the drive TFT is required to have a large subthreshold coefficient (S value). In order to increase the threshold voltage in the positive direction and increase the S value, for example, an oxide semiconductor with a low mobility may be used. On the other hand, the selection TFT preferably has a high mobility (i.e., a large on current). The threshold voltage of the selection TFT may be negative (depression characteristics). Further, the selection TFT may not be required to have the large S value. Rather, the selection TFT is required to have a small S value and a high switching speed.

Note that the uses and required characteristics of the TFT are not limited to the examples described above, and diversify.

However, it is difficult to form a plurality of TFTs with different characteristics by using the same oxide semiconductor film. For example, it is preferable to use an oxide semiconductor having a high mobility for the SSD circuit TFT and the pixel TFT, but when the mobility of the oxide semiconductor increases, the threshold voltage of the TFT shifts in a negative direction, resulting in depletion characteristics. Therefore, the oxide semiconductor having the high mobility may not be suitable for the drive circuit TFT. On the other hand, in order to obtain enhancement characteristics, an oxide semiconductor having a relatively low mobility is preferably used for the drive circuit TFT. However, since it is difficult to further increase the on current with the TFT having enhancement characteristics, it may not be suitable for other peripheral circuits such as, for example, the SSD circuit.

Further, in a TFT having a top gate structure (hereinafter, abbreviated as a "top gate TFT"), an oxide semiconductor layer and source/drain electrodes are electrically connected in openings (contact holes) provided in an interlayer insulating layer covering the oxide semiconductor layer in many cases. However, depending on the structure of the oxide semiconductor layer, a part of the oxide semiconductor layer may also be removed when forming the contact hole. As a result, the contact resistance may increase and desired on-characteristics may not be obtained.

Based on the above knowledge, the present inventors have found a method for producing a plurality of top gate TFTs using the same oxide semiconductor film and having different characteristics from one another. Further, the present inventors have found a method for producing a plurality of top gate TFTs that can suppress an increase in contact resistance between the oxide semiconductor layer and the source/drain electrodes and have different characteristics from one another.

First Embodiment

Hereinafter, an active matrix substrate according to a first embodiment will be described with reference to the drawings, using an active matrix substrate used in a liquid crystal display device as an example.

Basic Configuration of Active Matrix Substrate 1000

FIG. 1 is a schematic diagram illustrating an example of a planar structure of an active matrix substrate 1000 according to the present embodiment.

The active matrix substrate 1000 has a display region DR, and a region (a non-display region or a frame region) FR other than the display region DR. The display region DR is constituted of a plurality of pixel areas PIX arranged in a matrix shape. Each of the plurality of pixel areas PIX (also referred to as a "pixel") is an area corresponding to a pixel of the display device. The non-display region FR is a region positioned in a periphery of the display region DR and does not contribute to display.

In the non-display region FR, for example, a gate driver, a demultiplexer circuit functioning as an SSD circuit, and the like are integrally (monolithically) provided. A source driver is mounted on the active matrix substrate 1000, for example.

In the display region DR, a plurality of gate bus lines GL extending in a row direction (x direction), and a plurality of source bus lines SL extending in a column direction (y direction) are formed. Each of the plurality of pixel areas PIX is defined by the gate bus line GL and the source bus line SL, for example. The gate bus lines GL are connected to respective terminals of the gate driver. The source bus lines SL are connected to respective terminals of the source driver.

Each of the plurality of pixel areas PIX includes a thin film transistor Tp and a pixel electrode PE. The thin film transistor Tp is also referred to as a "pixel TFT". A gate electrode of the thin film transistor Tp is electrically connected to the corresponding gate bus line GL, and a source electrode of the thin film transistor Tp is electrically connected to the corresponding source bus line SL. A drain electrode of the thin film transistor Tp is electrically connected to the pixel electrode PE. When the active matrix substrate 1000 is applied to a display device in a transverse electrical field mode such as a fringe field switching (FFS) mode, although not illustrated, the active matrix substrate 1000 is provided with an electrode common to the plurality of pixels (common electrode).

A plurality of circuit TFTs configuring the peripheral circuits are formed in the non-display region of the active matrix substrate 1000. The circuit TFT includes a drive circuit TFT configuring the gate driver, an SSD circuit TFT configuring the SSD circuit, and the like.

TFT Structure in Active Matrix Substrate 1000

Next, the structures of the plurality of top gate TFTs included in the active matrix substrate 1000 will be described.

The characteristics of the top gate TFT in which the oxide semiconductor layer is the active layer may change depending on the structure of, in the oxide semiconductor layer, the region covered with the gate electrode with the gate insulating layer interposed therebetween, for example. In the description, in the oxide semiconductor layer, the region covered with the gate electrode with the gate insulating layer interposed therebetween is referred to as a "first region". The first region includes a region where a channel is formed. Further, the structure in the first region in the oxide semiconductor layer may be referred to as an "active layer structure".

In the present embodiment, the active matrix substrate 1000 includes a plurality of oxide semiconductor TFTs having a top gate structure. At least one first TFT and one second TFT having different active layer structures from each other are included in the plurality of oxide semiconductor TFTs.

In the first TFT, in the first region, the oxide semiconductor layer has a layered structure including the lower oxide semiconductor film and the upper oxide semiconductor film arranged on the lower oxide semiconductor film. On the other hand, in the second TFT, in at least a part of the first region of the oxide semiconductor layer, of the lower oxide semiconductor film and the upper oxide semiconductor film, one oxide semiconductor film is provided, and another oxide semiconductor film is not provided. The lower oxide semiconductor film and the upper oxide semiconductor film have different mobilities from each other.

In the description, in the oxide semiconductor layer, a portion having the layered structure including the lower oxide semiconductor film and the upper oxide semiconductor film is referred to as a "layered portion pa". In addition, in the oxide semiconductor layer, a portion including the lower oxide semiconductor film and not including the upper oxide semiconductor film is referred to as a "lower layer portion p1" and a portion including the upper oxide semiconductor film and not including the lower oxide semiconductor film is referred to as an "upper layer portion p2". Further, the lower layer portion p1 and the upper layer portion p2 may be collectively referred to as a "first portion". The lower layer portion p1 may have a single-layer structure including only the lower oxide semiconductor film, or may further include another semiconductor film. Similarly, the upper layer portion p2 may only include the upper oxide semiconductor film, or may further include another semiconductor film.

The first TFT and the second TFT may have different characteristics because the first TFT and the second TFT have different active layer structures from each other. For example, the threshold voltage of the first TFT may be lower or higher than the threshold voltage of the second TFT.

The uses of the first TFT and the second TFT do not matter. For example, the first TFT may be a pixel TFT arranged in each pixel area, and the second TFT may be, for example, a circuit TFT constituting a peripheral circuit such as a drive circuit, an SDD circuit or the like. Alternatively, the first TFT may be a circuit TFT and the second TFT may be the pixel TFT. Further, the first TFT and the second TFT may each be circuit TFTs used in different peripheral circuits.

Hereinafter, the structure of each TFT will be described more specifically with reference to the drawings.

Figure 2:
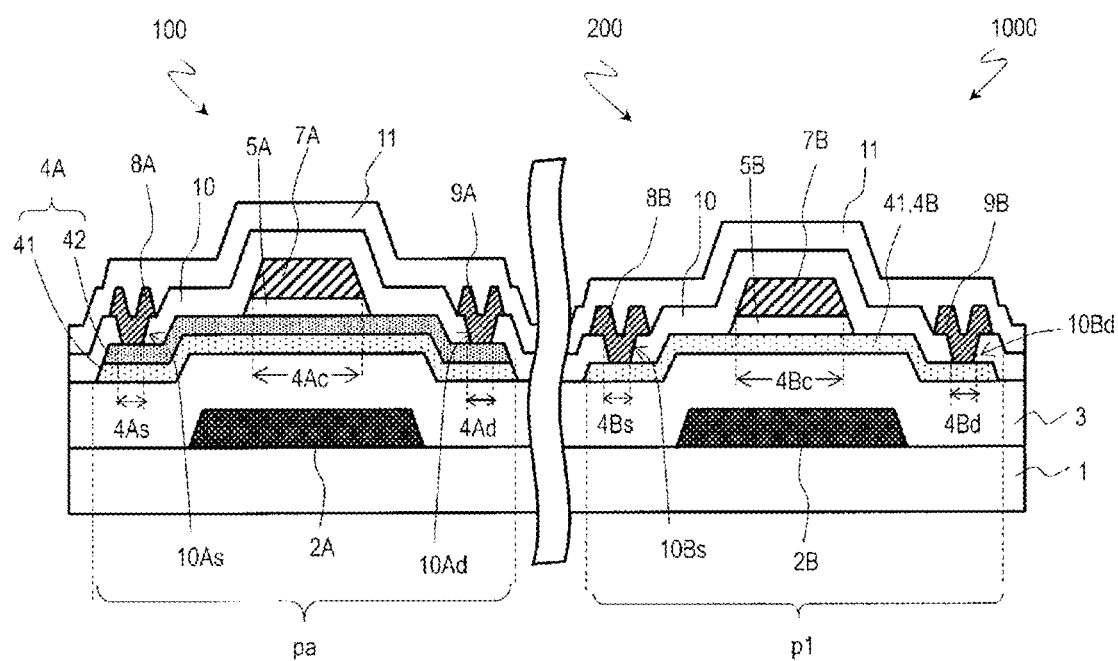
FIG. 2 is a cross-sectional view illustrating a first TFT 100 and a second TFT 200 formed in the active matrix substrate 1000.

FIG. 2 is a cross-sectional view illustrating a first TFT 100 and a second TFT 200 formed in the active matrix substrate 1000. Here, an example will be described in which the TFT 100 is the pixel TFT, and the TFT 200 is the circuit TFT (for example, a drive circuit TFT). The active matrix substrate 1000 may have a plurality of TFTs 100 and a plurality of TFTs 200, but here, only a single TFT 100 and a single TFT 200 will be illustrated and described.

The TFTs 100 and 200 are top gate TFTs supported on the substrate 1 and have an active layer including an oxide semiconductor film.

The TFT 100 includes an oxide semiconductor layer 4A arranged on the substrate 1, a gate insulating layer 5A covering the oxide semiconductor layer 4A, a gate electrode 7A arranged on the gate insulating layer 5A, and a source electrode 8A and a drain electrode 9A. The gate electrode 7A is arranged so as to cover a part of the oxide semiconductor layer 4A with the gate insulating layer 5A interposed therebetween.

The oxide semiconductor layer 4A has a first region 4Ac covered with the gate electrode 7A with the gate insulating layer 5A interposed therebetween, and a region not covered with the gate electrode 7A when viewed from a normal direction of the substrate 1 (hereinafter, referred to as a "second region").

In the entire first region 4Ac of the oxide semiconductor layer 4A, the layered portion pa having the layered structure including a lower oxide semiconductor film 41 and an upper oxide semiconductor film 42 arranged on the lower oxide semiconductor film 41 is provided. The lower oxide semiconductor film 41 and the upper oxide semiconductor film 42 have different mobilities from each other. In the present embodiment, the upper oxide semiconductor film 42 has a higher mobility than the lower oxide semiconductor film 41.

The second region of the oxide semiconductor layer 4A may be a low-resistance region having a lower specific resistance than the first region 4Ac. The low-resistance region can be formed, for example, by subjecting the oxide semiconductor layer 4A to processing for lowering the resistance using the gate electrode 7A as a mask.

The second region (low-resistance region) has a first contact region 4As and a second contact region 4Ad so as to be located on both sides of the first region 4Ac respectively when viewed from the normal direction of the substrate 1. The first contact region 4As is a region electrically connected to the source electrode 8A, and the second contact region 4Ad is a region electrically connected to the drain electrode 9A. In the first contact region 4As and the second contact region 4Ad, the layered portion pa may also be provided. In the illustrated example, the entire oxide semiconductor layer 4A includes the lower oxide semiconductor film 41 and the upper oxide semiconductor film 42. Note that in the present embodiment, it is sufficient that the layered portion pa be provided throughout in the first region 4Ac of the oxide semiconductor layer 4A, and a portion that does not include the lower oxide semiconductor film 41 or the upper oxide semiconductor film 42 may be provided in the second region.

The gate insulating layer 5A may cover the first region 4Ac and may not cover the first contact region 4As and the second contact region 4Ad. In the illustrated example, the gate insulating layer 5A is formed only in a region overlapping the gate electrode 7A when viewed from the normal direction of the substrate 1. An edge of the gate insulating layer 5A is aligned with an edge of the gate electrode 7A.

When viewed from the normal direction of the substrate 1, the gate electrode 7A is arranged on the gate insulating layer 5A so as to overlap the first region 4Ac and not to overlap the first contact region 4As and the second contact region 4Ad.

The oxide semiconductor layer 4A, the gate insulating layer 5A, and the gate electrode 7A are covered with an interlayer insulating layer 10. The interlayer insulating layer 10 may be in contact with part of upper faces of the oxide semiconductor layers 4A and 4B.

The source electrode 8A and the drain electrode 9A are arranged on, for example, the interlayer insulating layer 10. In this example, a first opening 10As that exposes the first contact region 4As of the oxide semiconductor layer 4A and a second opening 10Ad that exposes a part of the second contact region 4Ad are provided in the interlayer insulating layer 10. The source electrode 8A is arranged on the interlayer insulating layer 10 and in the first opening 10As, and is connected to the first contact region 4As in the first opening 10As. The drain electrode 9A is arranged on the interlayer insulating layer 10 and in the second opening 10Ad, and is connected to the second contact region 4Ad in the second opening 10Ad.

The TFT 100 may include a lower conductive layer 2A that functions as a light blocking layer on the substrate 1 side of the oxide semiconductor layer 4A. The lower conductive layer 2A is covered with a lower insulating layer 3. The oxide semiconductor layer 4A of the TFT 100 is arranged on the lower insulating layer 3. The lower conductive layer 2A may be arranged so as to overlap at least the first region 4Ac of the oxide semiconductor layer 4A when viewed from the normal direction of the substrate 1. This can suppress degradation in characteristics of the oxide semiconductor layer 4A caused by light from the substrate 1 side (backlight light). Note that the lower conductive layer 2A may be electrically in a floating state or may be fixed to the GND potential (0 V). Alternatively, the lower conductive layer 2A may function as a lower gate electrode by being electrically connected to the gate electrode 7A by a connection section (not illustrated).

When the TFT 100 is used as the thin film transistor Tp (pixel TFT) illustrated in FIG. 1, the gate electrode 7A is electrically connected to the corresponding gate bus line GL. The gate electrode 7A may be integrally formed with the corresponding gate bus line GL by using the same conductive film as the gate bus line GL. The source electrode 8A is electrically connected to the corresponding source bus line SL. The source electrode 8A may be integrally formed with the corresponding source bus line SL by using the same conductive film as the source bus line SL. The drain electrode 9A is electrically connected to the corresponding pixel electrode PE.

On the other hand, the TFT 200, similar to the TFT 100, includes an oxide semiconductor layer 4B, a gate electrode 7B arranged on a part of the oxide semiconductor layer 4B with a gate insulating layer 5B interposed therebetween, and a source electrode 8B and a drain electrode 9B. The TFT 200 may further include a lower conductive layer 2B on the substrate 1 side of the oxide semiconductor layer 4B.

Similar to the oxide semiconductor layer 4A, the oxide semiconductor layer 4B has a first region 4Bc that overlaps the gate electrode 7A and a second region that does not overlap the gate electrode 7A when viewed from the normal direction of the substrate 1. The second region may be a low-resistance region having a lower specific resistance than the first region 4Ac.

The oxide semiconductor layer 4B also includes a first contact region 4Bs and a second contact region 4Bd so as to be located on both sides of the first region 4Bc respectively when viewed from the normal direction of the substrate 1. The first contact region 4Bs and the second contact region 4Bd are provided in the second region (low-resistance region). The first contact region 4Bs is a region electrically connected to the source electrode 8B, and the second contact region 4Bd is a region electrically connected to the drain electrode 9B.

In the TFT 200, in the first region 4Bc of the oxide semiconductor layer 4B, the lower layer portion p1 including the lower oxide semiconductor film 41 but not including the upper oxide semiconductor film 42 is provided. As illustrated in the figure, the entire oxide semiconductor layer 4B may include the lower oxide semiconductor film 41 and may not include the upper oxide semiconductor film 42. Note that, it is sufficient that the lower layer portion p1 be provided in at least a part of the first region 4Bc of the oxide semiconductor layer 4B. For example, the lower oxide semiconductor film 41 may be provided in the second region of oxide semiconductor layer 4B.

The TFT 200 may have the same structure as the TFT 100 except for the structure of oxide semiconductor layer 4B. However, the planar shapes, sizes, channel lengths, channel widths, and the like in the respective layers in the TFT 100 and TFT 200 may be different from one another.

The lower oxide semiconductor films 41 for the oxide semiconductor layers 4A and 4B of the TFT 100 and the TFT 200 are formed of the same oxide semiconductor film. The gate insulating layers 5A and 5B of the respective TFTs may be formed of the same insulating film, the gate electrodes 7A and 7B of the respective TFTs may be formed of the same conductive film (gate conductive film), and the source electrodes 8A and 8B and the drain electrodes 9A and 9B of the respective TFTs may be formed of the same conductive film (source conductive film). This allows the TFT 100 and the TFT 200 to be manufactured by a common process.

The structures of the TFT 100 and the TFT 200 are not limited to the structures illustrated in FIG. 2. For example, the source electrode and/or the drain electrode may be provided closer to the substrate than the oxide semiconductor layer. The source electrode 8A of the TFT 100 may be formed by using the same conductive film as the lower conductive layer 2A, and the oxide semiconductor layer 4A and the source electrode 8A may be connected in an opening formed in the lower insulating layer 3.

Effect

According to the present embodiment, it is possible to manufacture the TFT 100 and the TFT 200 having different characteristics from each other by using a common oxide semiconductor film (here, the lower oxide semiconductor film 41).

Figure 3:
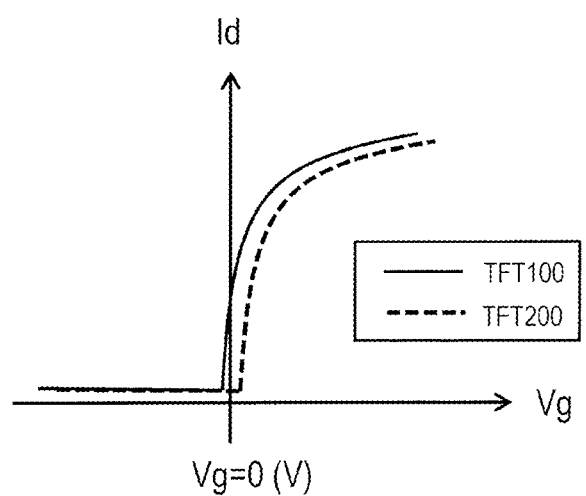
FIG. 3 is a diagram illustrating Vg-Id characteristics of the TFT 100 and the TFT 200.

FIG. 3 is a diagram illustrating Vg-Id characteristics of the TFT 100 and the TFT 200. The horizontal axis of the graph represents the potential of a gate electrode based on the potential of the drain electrode (gate-drain voltage) Vg, and the vertical axis of the graph represents a drain current Id.

From FIG. 3, it can be seen that the TFT 200 has a higher threshold voltage than the TFT 100. This is because in the TFT 200, in the first region 4Bc (channel region) of the oxide semiconductor layer 4B, the lower oxide semiconductor film 41 having a low mobility is provided and the upper oxide semiconductor film 42 having a high mobility is not provided, so that the mobility in the entire first region is lower than that of the oxide semiconductor layer 4A including the upper oxide semiconductor film 42, and the threshold voltage is shifted in the positive direction.

When the TFT 200 is used, for example, in a drive circuit, circuit malfunction can be suppressed, so that a decrease in yield can be suppressed. The TFT 200 preferably has enhancement characteristics that the threshold voltage is positive. As a result, the circuit malfunction can be suppressed more effectively.

In the TFT 100, the threshold voltage is lower and the off-leakage current is increased as compared with the TFT 200. When the TFT 100 is used for, for example, a pixel TFT, display unevenness due to residual charge can be reduced. The TFT 100 may have enhancement characteristics that the threshold voltage is positive, or may have depletion characteristics that the threshold voltage is negative.

Alternatively. the TFT 100 may be used as an SSD circuit TFT, and the TFT 200 may be used as a drive circuit TFT.

Alternatively, the TFT 100 and the TFT 200 may be mixed in the drive circuit. For example, the TFT 100 may be used as an output transistor (described later with reference to FIG. 25) in a gate drive circuit, and the TFT 200 may be used as another transistor.

In an active matrix substrate used as a backplane for an organic EL display device, the TFT 100 and the TFT 200 may be mixed in a pixel circuit provided in each pixel area (described later with reference to FIG. 27). For example, in the pixel circuit, the TFT 100 having a large on current may be used as a selection TFT and the TFT 200 having enhancement characteristics may be used as a drive TFT.

Lower Oxide Semiconductor Film 41 and Upper Oxide Semiconductor Film 42

It is sufficient that the lower oxide semiconductor film 41 and the upper oxide semiconductor film 42 have different mobilities from each other, and the composition, thickness, crystal structure, forming method, and the like are not particularly limited. In the description, of the lower oxide semiconductor film and the upper oxide semiconductor film, one with a higher mobility is referred to as a "high mobility oxide semiconductor film", and another with a lower mobility is referred to as a "low mobility oxide semiconductor film". The high mobility oxide semiconductor film and/or the low mobility oxide semiconductor film may be a single-layer film or a layered film including a plurality of oxide semiconductor films. The "mobility" of each oxide semiconductor film refers to the mobility of the entire layered film when the oxide semiconductor film is a layered film.

The low mobility oxide semiconductor film and the high mobility oxide semiconductor film may have different compositions or composition ratios from each other. When forming the oxide semiconductor layer 4B of the TFT 200, by utilizing the difference in etch rate due to making different in the metal elements or ratios of metal elements contained in the oxide semiconductor of the low mobility oxide semiconductor film and the high mobility oxide semiconductor film, it may be possible to etch more easily only the upper oxide semiconductor film 42.

As an example, each of the high mobility oxide semiconductor film and the low mobility oxide semiconductor film may include In and/or Sn, and a sum of atomic ratios of In and Sn to all metal elements in the low mobility oxide semiconductor film may be smaller than a sum of atomic ratios of In and Sn to all metal elements in the high mobility oxide semiconductor film.

For example, each of the high mobility oxide semiconductor film and the low mobility oxide semiconductor film may be made of In—Ga—Zn—O based oxide semiconductor layer, and an atomic ratio of In in the low mobility oxide semiconductor film may be smaller than an atomic ratio of In in the high mobility oxide semiconductor film. Alternatively, an atomic ratio of Ga in the low mobility oxide semiconductor film may be larger than an atomic ratio of Ga in the high mobility oxide semiconductor film. In such a case, for example, the etch rate for an oxalic acid-based etching solution is larger in the high mobility oxide semiconductor film than in the low mobility oxide semiconductor film. Accordingly, when forming a high mobility oxide semiconductor film as the upper oxide semiconductor film 42, it is possible to etch only the upper oxide semiconductor film 42 by utilizing the difference in etch rate.

Further, the high mobility oxide semiconductor film may contain Sn, and the low mobility oxide semiconductor film may not contain Sn. Instead, the low mobility oxide semiconductor film may contain Sn at a lower concentration than the high mobility oxide semiconductor film. In other words, an atomic ratio of Sn to all metal elements in the low mobility oxide semiconductor film may be smaller than an atomic ratio of Sn to all metal elements in the high mobility oxide semiconductor film. In such a case, only the low mobility oxide semiconductor film can be selectively etched by using a PAN-based etching solution containing phosphoric acid, nitric acid, and acetic acid. Accordingly, it is particularly advantageous when the low mobility oxide semiconductor film is used as the upper oxide semiconductor film 42 as in the embodiment described later. The atomic ratio of Sn to all metal elements in the low mobility oxide semiconductor film may be, for example, 10 at % or less, and the atomic ratio of Sn to all metal elements in the high mobility oxide semiconductor film may be 11 at % or more. As a result, it is possible to selectively etch the low mobility oxide semiconductor more reliably.

As the low mobility oxide semiconductor film, for example, an In—Ga—Zn—O based semiconductor film (e.g., In:Ga:Zn=1:1:1) can be used. As the high mobility oxide semiconductor film, for example, an In—Ga—Zn—O based semiconductor film (for example, In:Ga:Zn=5:1:4), an In—Sn—Zn—O based semiconductor film, an In—Al—Sn—Zn—O based semiconductor film, an In—W—Zn—O based semiconductor film, an In—Sn—O based semiconductor film, an In—Zn—O based semiconductor film, an In—Ga—Sn—O based semiconductor film, an In—Sn—Ti—Zn—O based semiconductor film, or the like can be used.

Further, the low mobility oxide semiconductor film and the high mobility oxide semiconductor film may have different crystal structures from each other. For example, one of the low mobility oxide semiconductor film and the high mobility oxide semiconductor film may be an amorphous oxide semiconductor film, and the other may be a crystalline oxide semiconductor film containing a crystalline portion.

Further, even when the ratio of each metal element of the low mobility oxide semiconductor film and the ratio of each metal element of the high mobility oxide semiconductor film are the same, the mobilities of these oxide semiconductor films can be made different from each other by changing the film formation method or the film formation conditions. For example, the atmosphere in the chamber (for example, the flow ratio of oxygen to argon supplied to the chamber) when forming an oxide semiconductor film by sputtering may be different between the low mobility oxide semiconductor film and the high mobility oxide semiconductor film. Specifically, when forming the low mobility oxide semiconductor film, the flow ratio of oxygen to argon may be set to be large (for example, 80%), and when forming the high mobility oxide semiconductor film, the flow ratio of oxygen to argon may be set to be smaller than the low mobility oxide semiconductor film (for example, 20%).

The thicknesses of the low mobility oxide semiconductor film and the high mobility oxide semiconductor film may be substantially the same or different. The high mobility oxide semiconductor film may be thinner than the low mobility oxide semiconductor film. By thinning the high mobility oxide semiconductor film, the threshold voltage of the TFT using the high mobility oxide semiconductor film can be set near 0 V. As a result, the TFT with a high on current is obtained while having the enhancement characteristics. A thickness of the high mobility oxide semiconductor film may be 5 nm or more and 20 nm or less, for example. A thickness of the low mobility oxide semiconductor film may be 20 nm or more and 100 nm or less, for example.

Further, from the perspective of the manufacturing process, the lower oxide semiconductor film 41 may be thicker than the upper oxide semiconductor film 42. This has an advantage that only the upper oxide semiconductor film 42 can be patterned while suppressing damage to the lower oxide semiconductor film 41. In addition, when only the upper oxide semiconductor film 42 is patterned by dry etching, the lower oxide semiconductor film 41 can maintain a predetermined thickness even when the surface portion of the lower oxide semiconductor film 41 is etched (over-etched). The thickness of the lower oxide semiconductor film 41 is preferably 20 nm or more, for example.

Manufacturing Method of Active Matrix Substrate 1000

The TFT 100 and the TFT 200 in the active matrix substrate 1000 can be manufactured, for example, by the following method.

FIGS. 4A to 4M are process cross-sectional views of steps for explaining the manufacturing method of the active matrix substrate 1000, respectively. In these figures, a TFT formation region R1 in which the TFT 100 is formed and a TFT formation region R2 in which the TFT 200 is formed are illustrated. Here, a case in which the TFT 100 is used as a pixel TFT and the TFT 200 is used as a circuit TFT in the active matrix substrate applied to an FFS mode liquid crystal display device will be described as an example. Accordingly, the TFT formation region R1 is a part of each pixel area, and the TFT formation region R2 is a part of the non-display region.

Figure 4A:
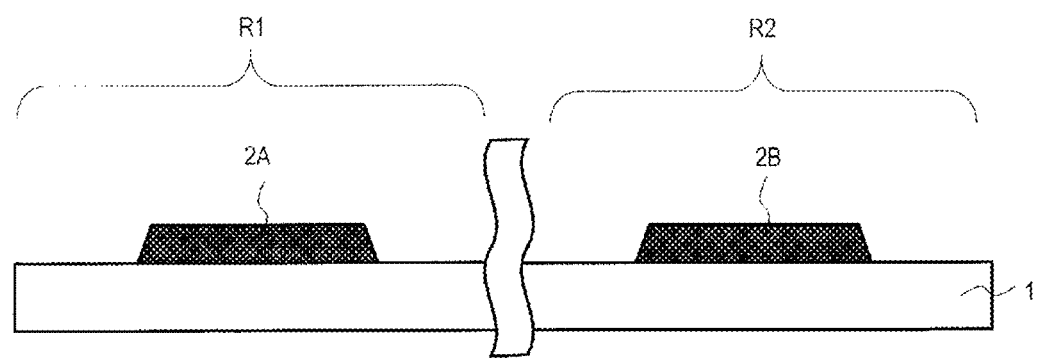
FIG. 4A is a process cross-sectional view illustrating a manufacturing method of the active matrix substrate 1000.

STEP 1: Formation of Lower Conductive Layer (FIG. 4A)

A lower conductive film (having a thickness, for example, 50 nm or more and 500 nm or less) is formed on the substrate 1 by, for example, sputtering. Next, the lower conductive film is patterned by a known photolithography process. In this way, as illustrated in FIG. 4A, the lower conductive layers 2A and 2B of the TFTs are formed in the TFT formation region R1 and the TFT formation regions R2, respectively.

As the substrate 1, a transparent substrate with insulating property, for example, a glass substrate, a silicon substrate, a heat-resistant plastic substrate (resin substrate), or the like can be used.

The material of the lower conductive film is not particularly limited, and a film containing a metal such as aluminum (Al), tungsten (W), molybdenum (Mo), tantalum (Ta), chromium (Cr), titanium (Ti), copper (Cu) or the like, or an alloy thereof, or a metal nitride thereof can be appropriately used. Further, a layered film obtained by layering such a plurality of films may be used.

Here, a single-layer film of a metal film (or an alloy film) containing Cu or Al is used as the lower conductive film. Alternatively, a layered film having a metal film containing Cu or Al as a top layer may be used.

STEP 2: Formation of Lower Insulating Layer 3 (FIG. 4B)

Figure 4B:
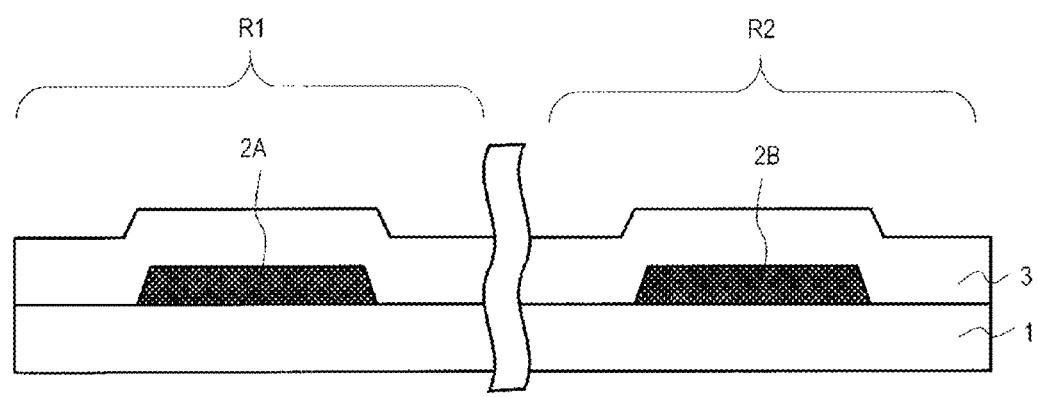
FIG. 4B is a process cross-sectional view illustrating the manufacturing method of the active matrix substrate 1000.

Subsequently, as illustrated in FIG. 4B, the lower insulating layer 3 (having a thickness of, for example, 200 nm or more and 600 nm or less) is formed so as to cover the lower conductive layers 2A and 2B.

The lower insulating layer 3 is formed by CVD, for example. As the lower insulating layer 3, a silicon oxide (SiOx) layer, a silicon nitride (SiNx) layer, a silicon oxynitride (SiOxNy; x>y) layer, a silicon nitride oxide (SiNxOy; x>y) layer, or the like may be used as appropriate. The lower insulating layer 3 may be a single-layer or may include a layered structure. For example, a silicon nitride (SiNx) layer, a silicon nitride oxide layer, or the like may be formed on a substrate side (lower layer) in order to prevent diffusion of impurities and the like from the substrate 1, and a silicon dioxide ($SiO_2$) layer, a silicon oxynitride layer, or the like may be formed on a layer (upper layer) on the former layer in order to ensure insulating properties.

Figure 4C:
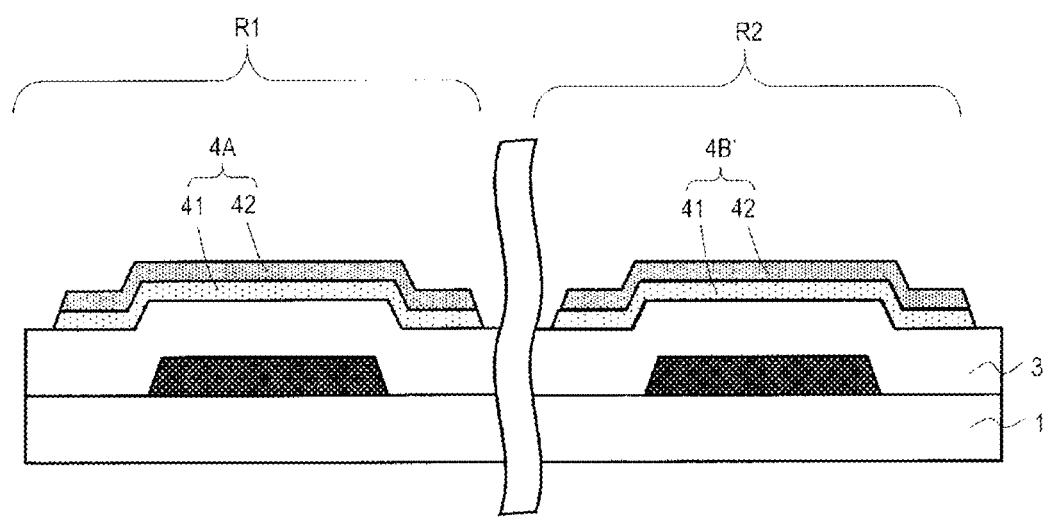
FIG. 4C is a process cross-sectional view illustrating the manufacturing method of the active matrix substrate 1000.

STEP 3: Formation of Lower Oxide Semiconductor Film 41 and Upper Oxide Semiconductor Film 42 (FIG. 4C)

Subsequently, the lower oxide semiconductor film 41 (having a thickness of, for example, 15 nm or more and 200 nm or less) and the upper oxide semiconductor film 42 (having a thickness of, for example, 15 nm or more and 200 nm or less) are formed on the lower insulating layer 3 in this order, and the obtained layered film is patterned. As a result, as illustrated in FIG. 4C, the oxide semiconductor layer 4A to be the active layer of the TFT 100 is formed in the TFT formation region R1. A layered body 4B' including the lower oxide semiconductor film 41 and the upper oxide semiconductor film 42 is formed in the TFT formation region R2.

The lower oxide semiconductor film 41 and the upper oxide semiconductor film 42 can be formed by sputtering, for example. Here, an In—Ga—Zn—O based semiconductor film (for example, In:Ga:Zn=1:1:1) having a thickness of 40 nm is formed as the lower oxide semiconductor film 41, and an In—Ga—Zn—O based semiconductor film (for example, In:Ga:Zn=5:1:4) having a thickness of 10 nm is formed as the upper oxide semiconductor film 42. Note that the composition ratios of the respective oxide semiconductor films are not limited to the above, but it is preferable that the upper oxide semiconductor film 42 have a larger atomic ratio of In (or smaller atomic ratio of Ga) than the lower oxide semiconductor film 41. The patterning of the layered film may be performed by, for example, wet etching using the oxalic acid-based etching solution. As a result, the lower oxide semiconductor film 41 and the upper oxide semiconductor film 42 can be simultaneously (collectively) etched. In this case, a side surface of the lower oxide semiconductor film 41 and a side surface of the upper oxide semiconductor film 42 are aligned with each other in the oxide semiconductor layer 4A.

Note that, as the lower oxide semiconductor film 41, an oxide semiconductor film that does not contain Sn, for example, an In—Ga—Zn—O based semiconductor film having a thickness of 40 nm may be formed, and as the upper oxide semiconductor film 42, an oxide semiconductor film containing Sn, for example, an In—Sn—Zn—O based semiconductor film (for example, $In_2O_3$—$SnO_2$—ZnO) having a thickness of 10 nm may be formed. In this case as well, the lower oxide semiconductor film 41 and the upper oxide semiconductor film 42 can be simultaneously etched using the oxalic acid-based etching solution.

The lower oxide semiconductor film 41 and the upper oxide semiconductor film 42 may be annealed before or after patterning the lower oxide semiconductor film 41 and the upper oxide semiconductor film 42.

STEP 4: Etching of Upper Oxide Semiconductor Film 42 (FIG. 4D)

Figure 4D:
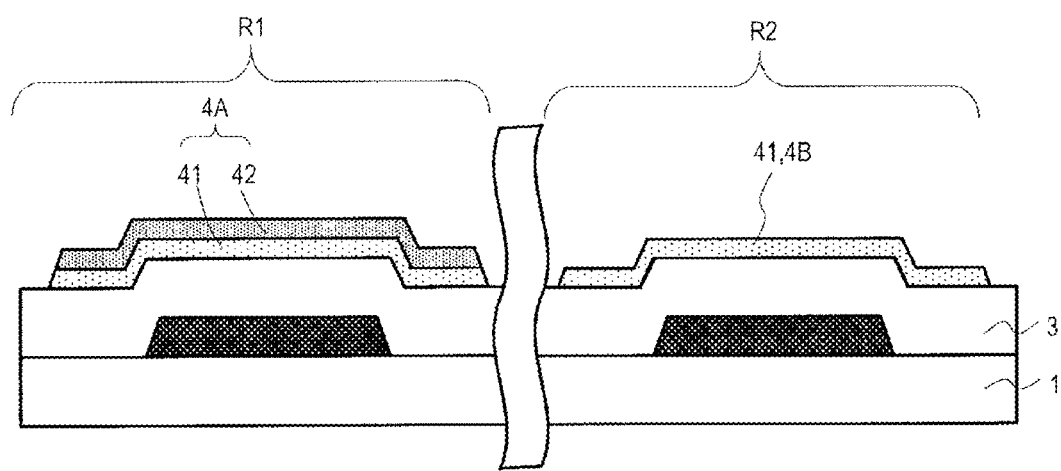
FIG. 4D is a process cross-sectional view illustrating the manufacturing method of the active matrix substrate 1000.

Subsequently, as illustrated in FIG. 4D, the upper oxide semiconductor film 42 is etched to remove only the upper oxide semiconductor film 42 and leave the lower oxide semiconductor film 41 in the TFT formation region R2. As a result, the oxide semiconductor layer 4B to be the active layer of the TFT 200 is formed in the TFT formation region R2. The oxide semiconductor layer 4B includes the lower oxide semiconductor film 41 and does not include the upper oxide semiconductor film 42.

Etching of the upper oxide semiconductor film 42 is performed under a manner and conditions such that the upper oxide semiconductor film 42 is selectively removed and the lower oxide semiconductor film 41 remains without being removed. When the upper oxide semiconductor film 42 and the lower oxide semiconductor film 41 are In—Ga—Zn—O based semiconductor films, the upper oxide semiconductor film 42 may be wet-etched using the PAN-based etching solution or the oxalic acid-based etching solution. The upper oxide semiconductor film 42 has a higher In ratio (or lower Ga ratio) than the lower oxide semiconductor film 41, and has a higher etching rate than the lower oxide semiconductor film 41. Thus, the difference in etching rate can be utilized to selectively etch the upper oxide semiconductor film 42.

When the upper oxide semiconductor film 42 is a film containing Sn such as an In—Sn—Zn—O based semiconductor film, and the lower oxide semiconductor film 41 is a film that does not contain Sn such as an In—Ga—Zn—O based semiconductor film, for example, by using the oxalic acid-based etching solution and controlling etching conditions such as etching time, the upper oxide semiconductor film 42 can be removed while leaving the lower oxide semiconductor film 41.

The etching in this step is not limited to wet etching, and may be performed by dry etching. In this case, the surface portion of the lower oxide semiconductor film 41 may be etched (over-etched).

STEP 5: Formation of Gate Insulating Film 50 (FIG. 4E)

Figure 4E:
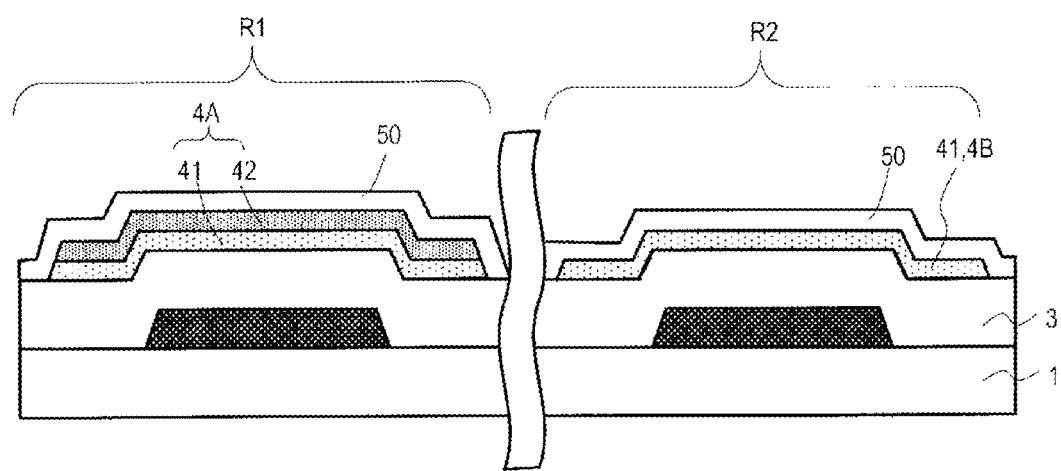
FIG. 4E is a process cross-sectional view illustrating the manufacturing method of the active matrix substrate 1000.

Subsequently, as illustrated in FIG. 4E, the gate insulating film 50 is formed so as to cover the oxide semiconductor layers 4A and 4B.

As the gate insulating film 50, an insulating film similar to the lower insulating layer 3 (insulating film exemplified as the lower insulating layer 3) can be used. Here, a silicon oxide ($SiO_2$) film is formed as the gate insulating film 50. when an oxide film such as a silicon oxide film is used as the gate insulating film 50, oxidation deficiencies generated in the channel regions of the oxide semiconductor layers 4A and 4B can be reduced by the oxide film, so that the resistance reduction in the channel region can be suppressed.

Figure 4F:
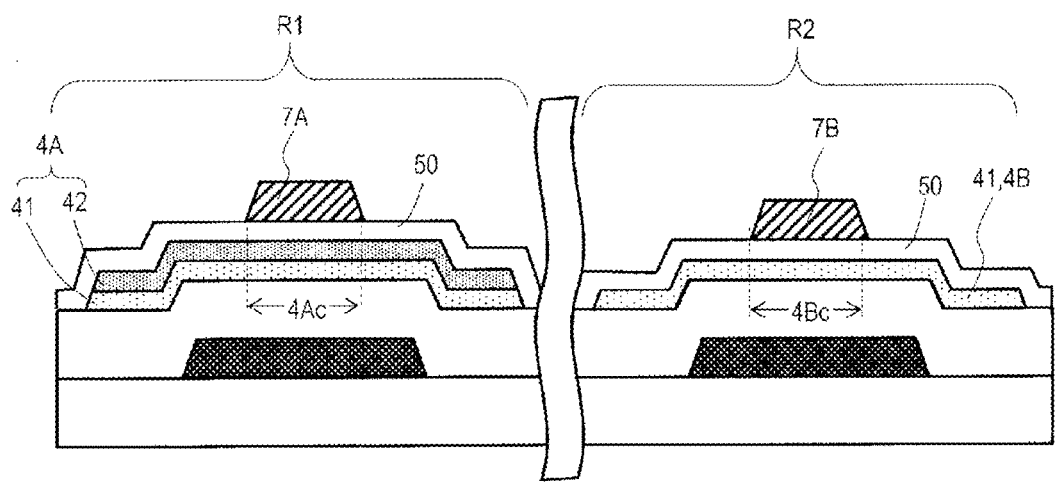
FIG. 4F is a process cross-sectional view illustrating the manufacturing method of the active matrix substrate 1000.

STEP 6: Formation of Gate Electrodes 7A and 7B (FIG. 4F)

Subsequently, a gate conductive film (having a thickness of, for example, 50 nm or more and 500 nm or less) (not illustrated) is formed on the gate insulating film 50. Thereafter, the gate conductive film is patterned by a known photolithography process. As a result, the gate electrodes 7A and 7B are formed in the TFT formation region R1 and the TFT formation region R2, respectively. Although not illustrated, the gate bus line is also formed by using the gate conductive film. In the oxide semiconductor layers 4A and 4B, the portions overlapping the gate electrodes 7A and 7B when viewed from the normal direction of the substrate 1 are the first regions 4Ac and 4Bc including the channel region, respectively.

As the gate conductive film, for example, a metal such as molybdenum (Mo), tungsten (W), aluminum (Al), copper (Cu), titanium (Ti), tantalum (Ta) and the like or an alloy thereof can be used. The gate conductive film may have a layered structure including a plurality of layers made of different conductive materials. Here, as the gate conductive film, a Cu/Ti layered film having a Ti film as a lower layer and a Cu film as an upper layer, or a Cu/Mo layered film having a Mo film as a lower layer and a Cu film as an upper layer is used.

Figure 4G:
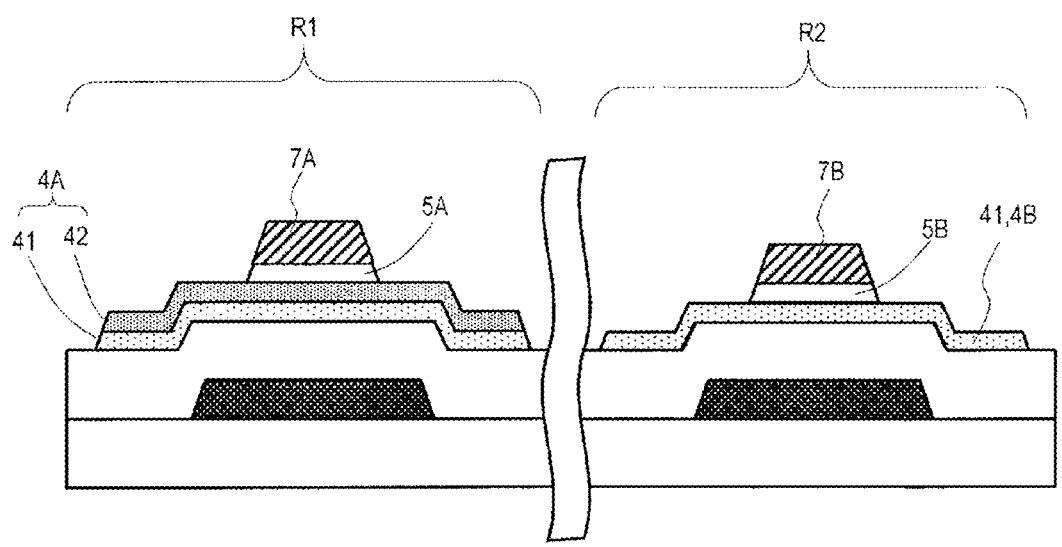
FIG. 4G is a process cross-sectional view illustrating the manufacturing method of the active matrix substrate 1000.

STEP 7: Formation of Gate Insulating Layers 5A and 5B (FIG. 4G)

Subsequently, the gate insulating film 50 is patterned using a resist mask used for patterning the gate conductive film or using the gate electrodes 7A and 7B as masks to form the gate insulating layers 5A and 5B. In this way, when viewed from the normal direction of the substrate 1, side surfaces of the gate electrodes 7A and 7B are aligned with side surfaces of the gate insulating layers 5A and 5B, respectively. However, it may not be aligned depending on the etching conditions of the respective films. For example, the gate electrodes 7A and 7B are over-etched to greatly shift the side surfaces of the gate electrodes 7A and 7B from the side surfaces of the resist mask. Thereafter, when the gate insulating film 50 is dry etched using a resist mask, the side surfaces of the gate electrodes 7A and 7B may be located inside the side surfaces of the gate insulating layers 5A and 5B when viewed from the normal direction of the substrate 1.

Note that after patterning the gate insulating film 50, the gate conductive film may be formed and patterned.

After forming the gate electrodes 7A and 7B, the oxide semiconductor layers 4A and 4B may be subjected to lowering the resistance. Plasma processing may be performed as the processing for lowering the resistance, for example. As a result, when viewed from the normal direction of the main surface of the substrate 1, in the oxide semiconductor layers 4A and 4B, regions overlapping neither the gate electrodes 7A and 7B nor the gate insulating layers 5A and 5B (exposed regions) are low-resistance regions having a lower specific resistance than the regions overlapping the gate electrodes 7A and 7B and the gate insulating layers 5A and 5B (including the channel regions). The low-resistance region may be a conductive region (e.g., sheet resistance of 200Ω/□ or less). In the present embodiment, when viewed from the normal direction of the substrate 1, the oxide semiconductor layers 4A and 4B that include the first regions 4Ac and 4Bc overlapping the gate electrodes 7A and 7B and low-resistance regions that are located on both sides of the first regions and have a specific resistance lower than that of the first regions 4Ac and 4Bc are obtained. Note that the method of the processing for lowering the resistance is not limited to plasma processing.

Figure 4H:
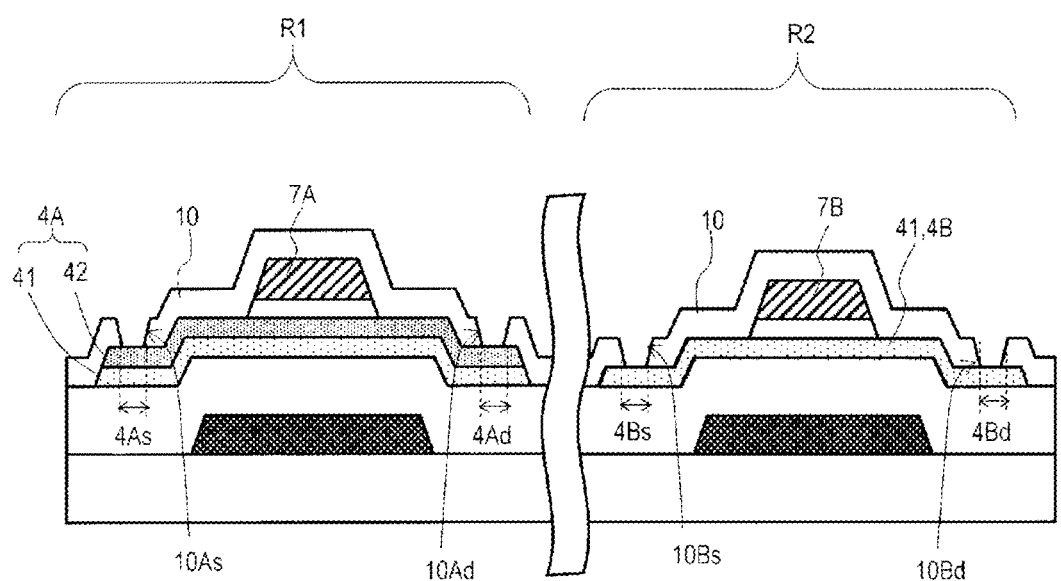
FIG. 4H is a process cross-sectional view illustrating the manufacturing method of the active matrix substrate 1000.

STEP 8: Formation of Interlayer Insulating Layer 10 (FIG. 4H)

Subsequently, the interlayer insulating layer 10 covering the oxide semiconductor layers 4A and 4B, the gate insulating layers 5A and 5B, and the gate electrodes 7A and 7B is formed. Thereafter, the interlayer insulating layer 10 is patterned by the known photolithography process. As a result, as illustrated in FIG. 4H, in the TFT formation region R1, the interlayer insulating layer 10 is formed with the first opening 10As and the second opening 10Ad that expose the first contact regions 4As and 4Ad that are parts of the low-resistance region of the oxide semiconductor layer 4A, and in the TFT formation region R2, the interlayer insulating layer 10 is formed with a first opening 10Bs and a second opening 10Bd that expose the contact regions 4Bs and 4Bd that are parts of the low-resistance region of the oxide semiconductor layer 4B.

The interlayer insulating layer 10 can be formed with a single-layer or a multi-layer of an inorganic insulating layer such as a silicon oxide film, a silicon nitride film, a silicon oxynitride film, a silicon nitride oxide film and the like. The thickness of the inorganic insulating layer may be 100 nm or more and 500 nm or less. It is preferable to form the interlayer insulating layer 10 by using an insulating film that reduces an oxide semiconductor such as a silicon nitride film, because the specific resistance of the regions of the oxide semiconductor layers 4A and 4B in contact with the interlayer insulating layer 10 (here, the low-resistance regions) can be maintained low. Here, an SiNx layer (having a thickness of 300 nm) is formed as the interlayer insulating layer 10 by the CVD.

When an insulating layer capable of reducing an oxide semiconductor (for example, a hydrogen donating layer such as a silicon nitride layer) is used as the interlayer insulating layer 10, even when the above-mentioned processing for lowering resistance is not performed, in the oxide semiconductor layers 4A and 4B, the portions being in contact with the interlayer insulating layer 10 can be made lower in resistance than the portions that are not contact with the interlayer insulating layer 10.

Figure 4I:
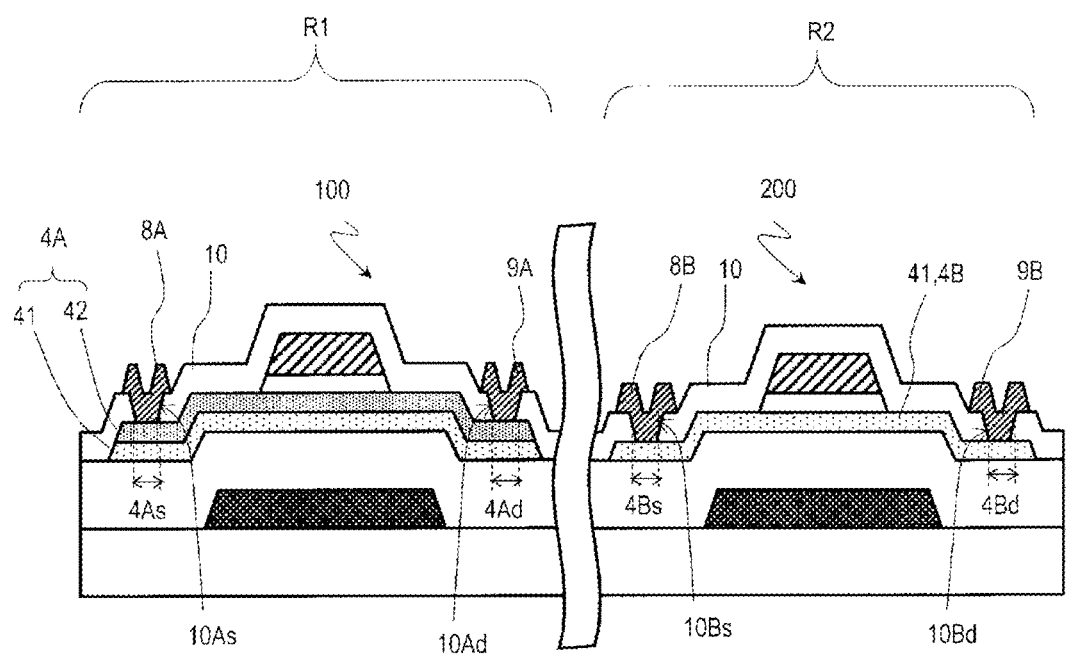
FIG. 4I is a process cross-sectional view illustrating the manufacturing method of the active matrix substrate 1000.

STEP 9: Formation of Source Electrodes 8A and 8B and Drain Electrodes 9A and 9B (FIG. 4I)

Subsequently, the source conductive film (having a thickness of, for example, 50 nm or more and 500 nm or less) (not illustrated) is formed on the interlayer insulating layer 10, and the source conductive film is patterned. As a result, as illustrated in FIG. 4I, the source electrodes 8A and 8B and the drain electrodes 9A and 9B are formed. Although not illustrated, the source bus line is also formed of the source conductive film.

The source electrodes 8A and 8B are arranged on the interlayer insulating layer 10 and in the openings 10As and 10Bs, respectively, and are connected to the first contact regions 4As and 4Bs of the oxide semiconductor layers 4A and 4B in the openings 10As and 10Bs, respectively. The drain electrodes 9A and 9B are arranged on the interlayer insulating layer 10 and in the openings 10Ad and 10Bd, respectively, and are connected to the second contact regions 4Ad and 4Bd of the oxide semiconductor layers 4A and 4B in the openings 10Ad and 10Bd, respectively.

As the source conductive film, an element selected from aluminum (Al), chromium (Cr), copper (Cu), tantalum (Ta), titanium (Ti), molybdenum (Mo), and tungsten (W), or an alloy containing these elements as components can be used. For example, the second conductive film may have a triple-layer structure of titanium film-aluminum film-titanium film, or a triple-layer structure of molybdenum film-aluminum film-molybdenum film can be used. Note that the source conductive film is not limited to the triple-layer structure, and may have a single-layer or a dual-layer structure, or a layered structure of four or more layers. Here, a layered film having a Ti film (having a thickness of 15 to 70 nm) as a lower layer and a Cu film (having a thickness of 50 to 400 nm) as an upper layer are used. By using a layered film using an ohmic conductive film such as a Ti film as the lowest layer, the contact resistance with the oxide semiconductor layers 4A and 4B can be reduced more effectively.

STEP 10: Formation of Inorganic Insulating Layer 11 and Organic Insulating Layer 12 (FIG. 4J)

Figure 4J:
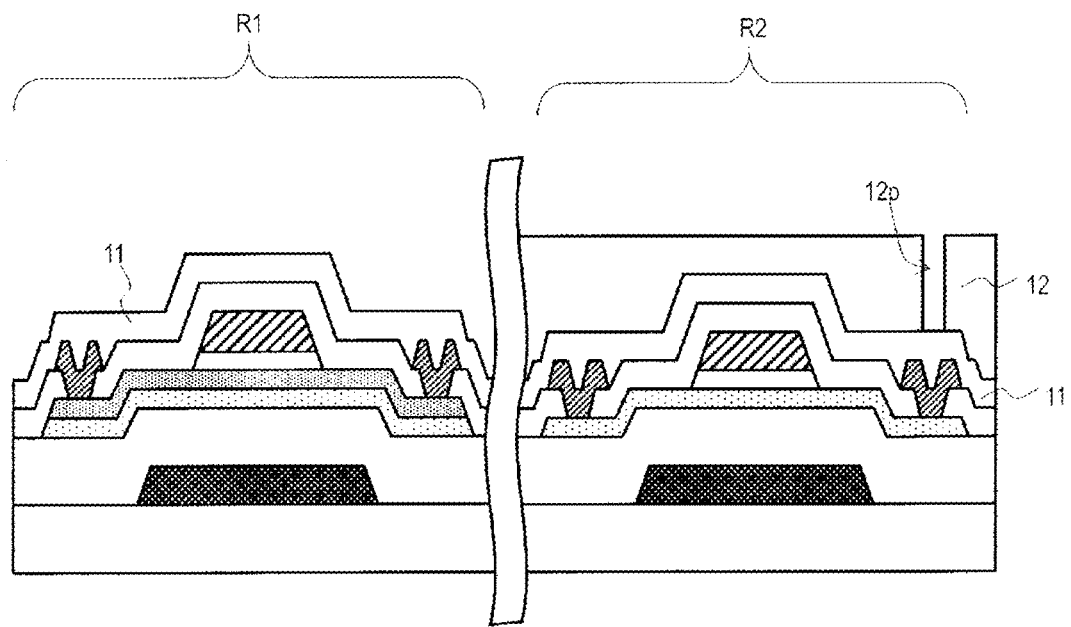
FIG. 4J is a process cross-sectional view illustrating the manufacturing method of the active matrix substrate 1000.

Subsequently, as illustrated in FIG. 4J, an inorganic insulating layer 11 (having a thickness of 100 nm or more and 500 nm or less, for example) and an organic insulating layer 12 (having a thickness of 1 to 4 µm, preferably 2 to 3 µm, for example) are formed in this order so as to cover the interlayer insulating layer 10, the source electrodes 8A and 8B, and the drain electrodes 9A and 9B.

As the inorganic insulating layer 11, an inorganic insulating film similar to that of the interlayer insulating layer 10 can be used. Here, as the inorganic insulating layer 11, for example, an SiNx layer (having a thickness of 300 nm) is formed by the CVD. The organic insulating layer 12 may be, for example, an organic insulating film containing a photosensitive resin material (for example, an acrylic resin film).

Thereafter, the organic insulating layer 12 is patterned. In this manner, in each pixel area, an opening 12p for exposing a part of the inorganic insulating layer 11 is formed in the organic insulating layer 12. When viewed from the normal direction of the substrate 1, the opening 12p is arranged so as to overlap the drain electrode 9B of the TFT 200 to be the pixel TFT. By this patterning, the entire portion of the organic insulating layer 12 located in the non-display region may be removed.

STEP 11: Formation of Common Electrode CE (FIG. 4K)

Figure 4K:
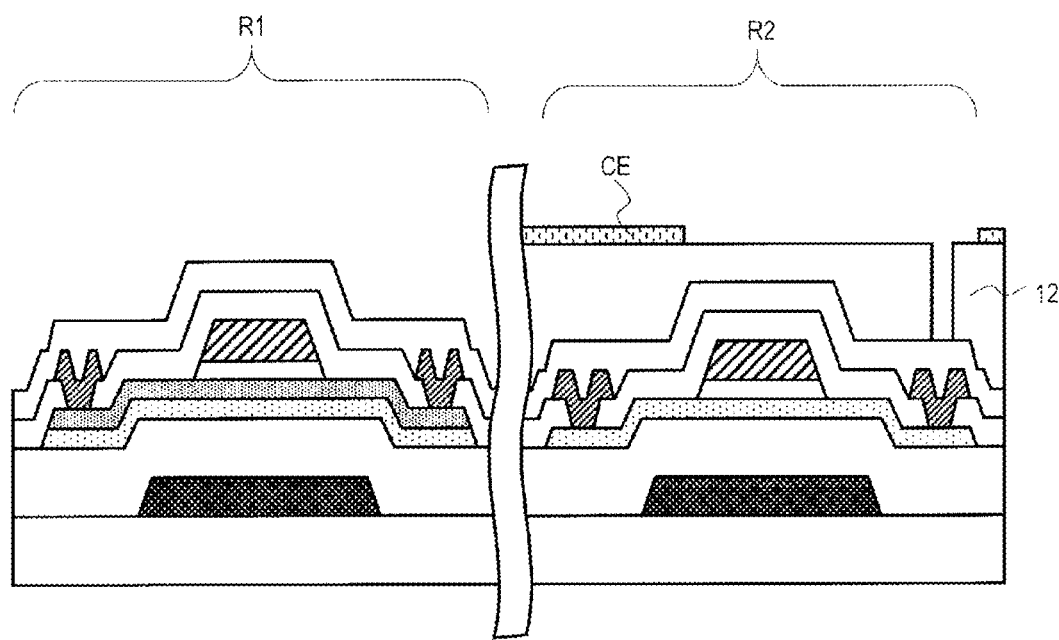
FIG. 4K is a process cross-sectional view illustrating the manufacturing method of the active matrix substrate 1000.

Subsequently, as illustrated in FIG. 4K, a first transparent conductive film (having a thickness of, 20 to 300 nm) (not illustrated) is formed on the organic insulating layer 12, and patterned. As a result, a common electrode CE is formed in the display region. As the first transparent conductive film, a metal oxide such as indium-zinc oxide, indium-tin oxide (ITO), ZnO or the like can be used.

STEP 12: Formation of Dielectric Layer 17 (FIG. 4L)

Figure 4L:
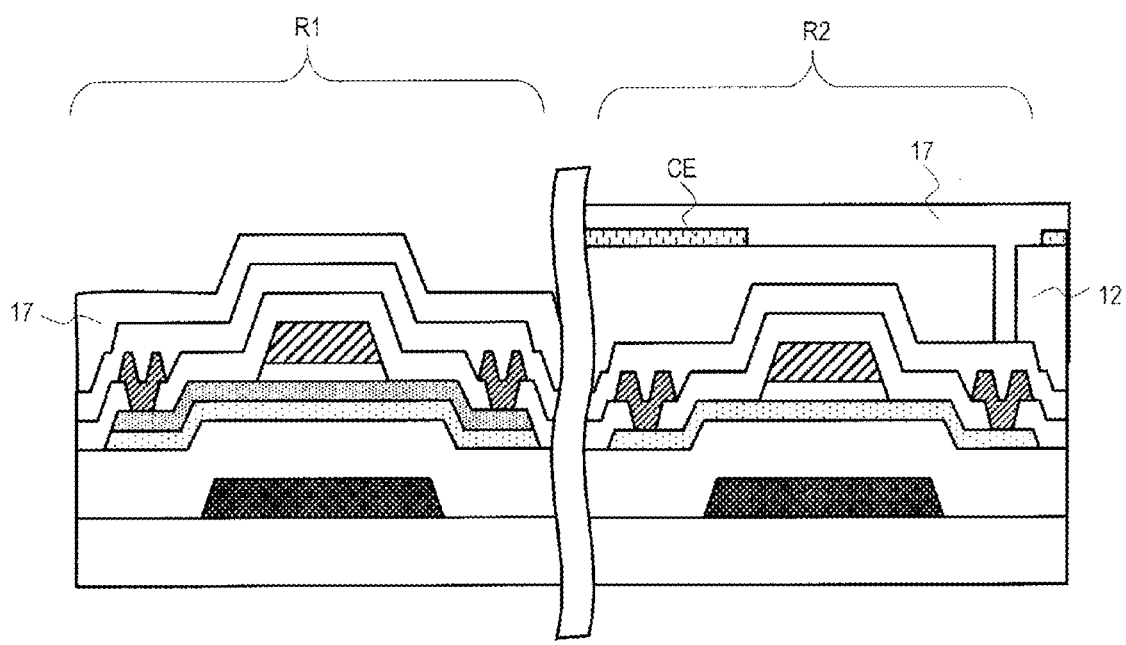
FIG. 4L is a process cross-sectional view illustrating the manufacturing method of the active matrix substrate 1000.

Subsequently, as illustrated in FIG. 4L, a dielectric layer 17 (having a thickness of 50 to 500 nm) is formed so as to cover the common electrode CE.

A material of the dielectric layer 17 may be the same as the material exemplified as the material of the inorganic insulating layer 11. Here, as the dielectric layer 17, for example, a SiN film is formed by the CVD.

Figure 4M:
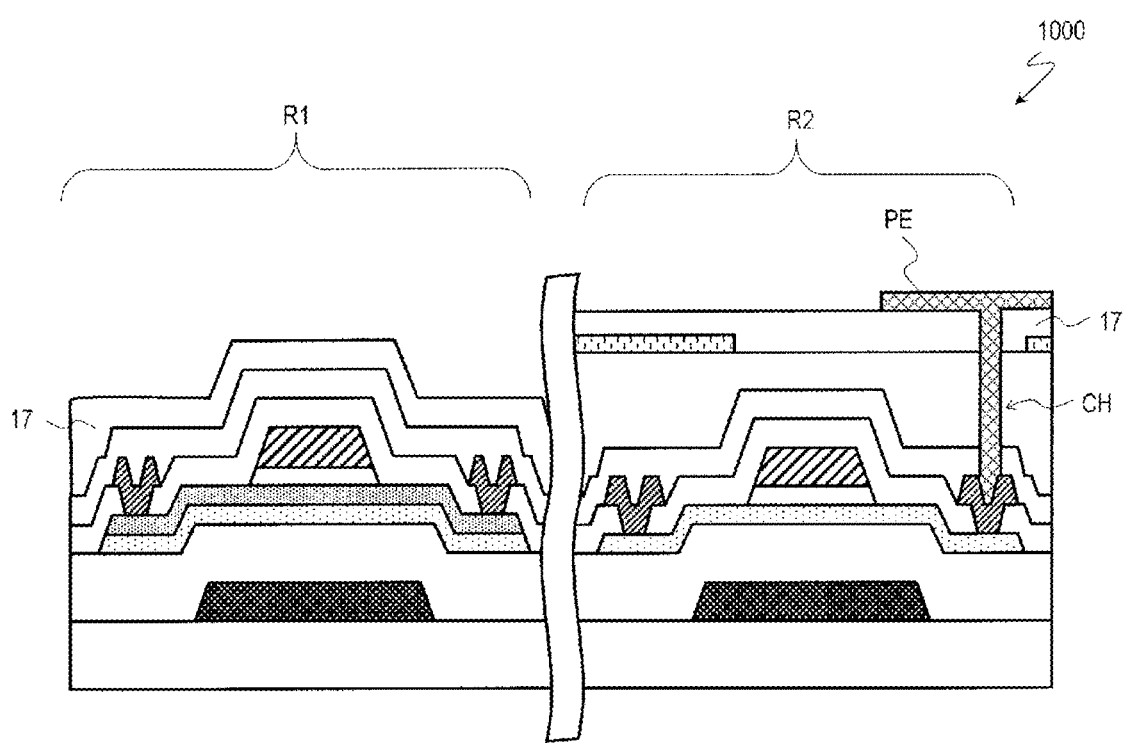
FIG. 4M is a process cross-sectional view illustrating the manufacturing method of the active matrix substrate 1000.

STEP 13: Formation of Pixel Electrode PE (FIG. 4M)

Subsequently, the dielectric layer 17 and the inorganic insulating layer 11 are patterned to form a pixel contact hole CH that exposes the drain electrode 9B of the TFT 200. In this example, the pixel contact hole CH is constituted of an opening of the dielectric layer 17, an opening of the organic insulating layer 12, and an opening of the inorganic insulating layer 11.

Then, a second transparent conductive film (having a thickness of 20 to 300 nm) (not illustrated) is formed on the dielectric layer 17 and in the pixel contact hole CH. The second transparent conductive film can be formed by using a material similar to that of the first transparent conductive film. Thereafter, the second transparent conductive film is patterned. As a result, as illustrated in FIG. 4M, the pixel electrode PE is formed in each pixel area. The pixel electrode PE is connected to the drain electrode 9B of the TFT 200 to be the pixel TFT in the pixel contact hole CH. In this manner, the active matrix substrate 1000 is manufactured.

The pixel electrode PE and the common electrode CE may be arranged so as to face with each other with the dielectric layer 17 interposed therebetween. Here, an example in which the common electrode CE is arranged on the substrate 1 side of the pixel electrode PE is illustrated, but the common electrode CE may be arranged on the pixel electrode PE with the dielectric layer 17 interposed therebetween.

The manufacturing method of the active matrix substrate 1000 of the present embodiment is not limited to the above method. In the patterning step of the layered film illustrated in FIG. 4C, the upper oxide semiconductor film 42 and the lower oxide semiconductor film 41 may not be simultaneously etched. For example, after forming the layered film, first, only the upper oxide semiconductor film 42 may be etched, and then the lower oxide semiconductor film 41 may be etched separately.

In addition, instead of the steps illustrated in FIGS. 4C and 4D, the oxide semiconductor layers 4A and 4B may be formed as follows. First, the lower oxide semiconductor film 41 is formed and patterned to form the lower layer (first layer) of the oxide semiconductor layer 4A and the oxide semiconductor layer 4B. Next, the upper oxide semiconductor film 42 is formed so as to cover the patterned lower oxide semiconductor film 41. Thereafter, only the upper oxide semiconductor film 42 is patterned to form the upper layer (second layer) of the oxide semiconductor layer 4A.

Figure 20A:
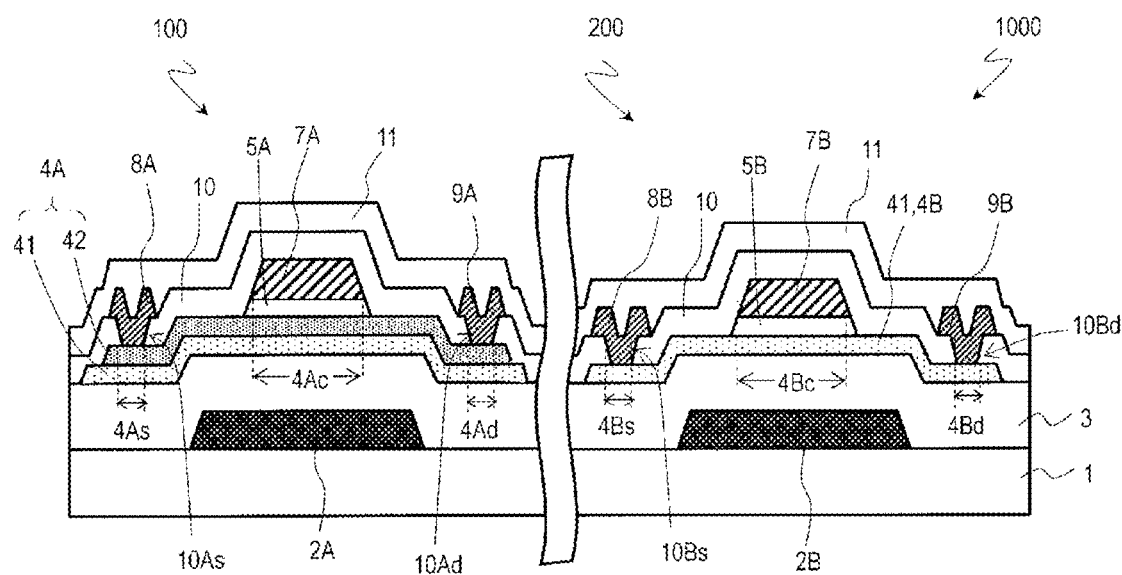
FIG. 20A is a cross-sectional view for explaining another example of the first TFT 100 according to the first embodiment.
Figure 20B:
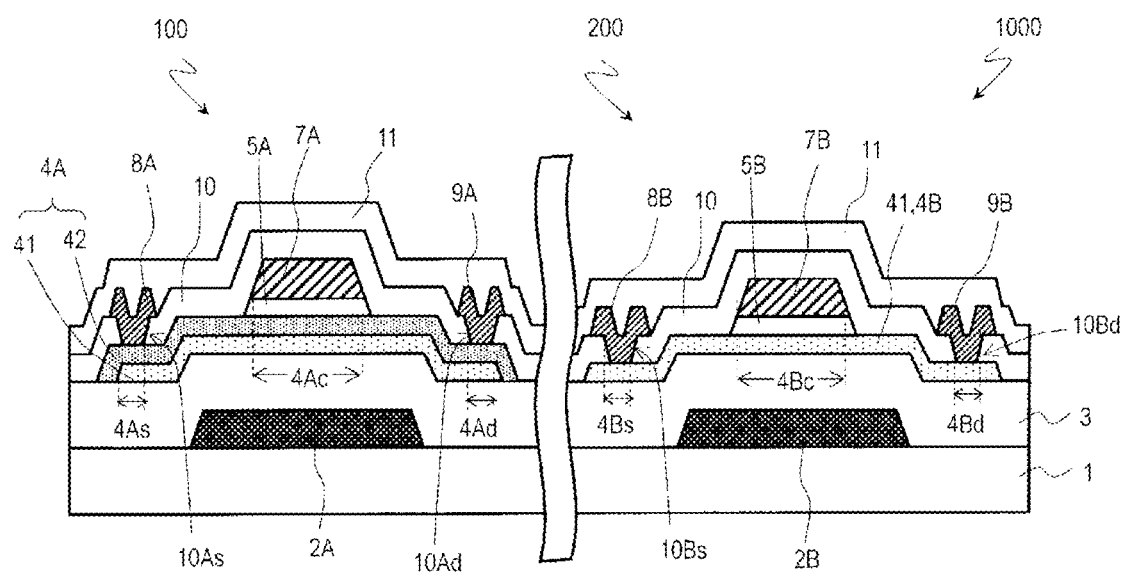
FIG. 20B is a cross-sectional view for explaining still another example of the first TFT 100 according to the first embodiment.

When the upper oxide semiconductor film 42 and the lower oxide semiconductor film 41 are separately etched, the side surface of the lower oxide semiconductor film 41 and the side surface of the upper oxide semiconductor film 42 may not be aligned with each other in the oxide semiconductor layer 4A. For example, as illustrated in FIG. 20A, the width of the upper oxide semiconductor film 42 may be smaller than that of the lower oxide semiconductor film 41, and when viewed from the normal direction of the substrate 1, the upper oxide semiconductor film 42 may be located within the upper face of the lower oxide semiconductor film 41. By making the size of the upper oxide semiconductor film having a high mobility smaller than that of the lower oxide semiconductor film having a low mobility, the TFT 100 is less likely to have depletion characteristics. Alternatively, as illustrated in FIG. 20B, the width of the upper oxide semiconductor film 42 may be larger than that of the lower oxide semiconductor film 41, and the upper oxide semiconductor film 42 may cover the upper face and the side surface of the lower oxide semiconductor film 41. As a result, the upper oxide semiconductor film 42, which is a high mobility oxide semiconductor film, is exposed on the upper face and the side surface of the oxide semiconductor layer 4A. Therefore, the specific resistance of the resistance lowered region of the oxide semiconductor layer 4A can be reduced by the resistance lowering treatment.

Although the manufacturing method of the active matrix substrate used in the liquid crystal display device is described above, an active matrix substrate used in an organic EL display device can be manufactured by a similar manner.

Figure 23:
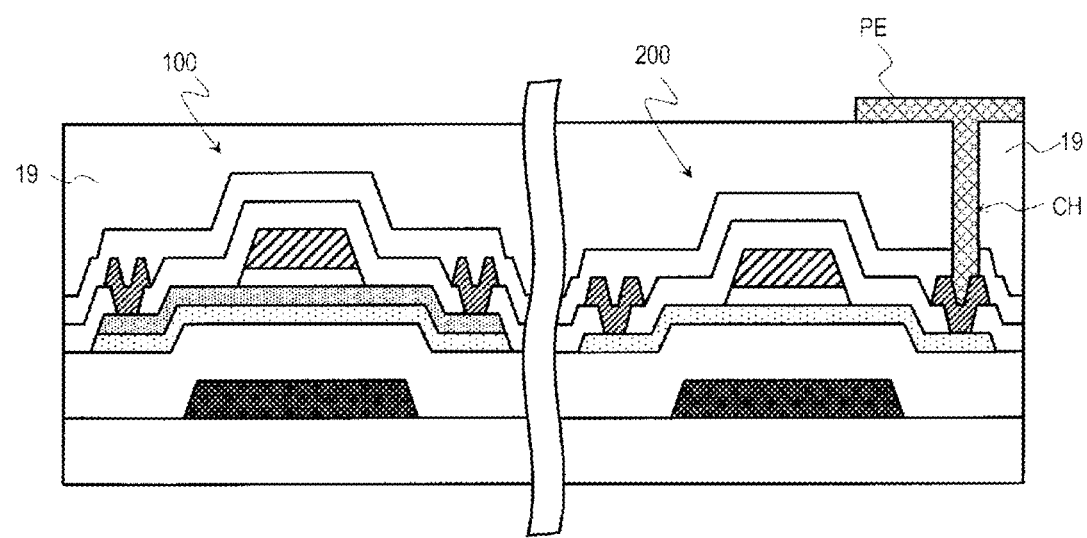
FIG. 23 is a cross-sectional view illustrating another example of the active matrix substrate 1000.

As illustrated in FIG. 23, in the active matrix substrate used in the organic EL display device, for example, the TFT 100 and the TFT 200 may be formed in each pixel area. The TFT 100 and the TFT 200 may be used as the drive TFT and the selection TFT in the pixel circuit, respectively. A flattened layer 19 is formed on the TFTs 100 and 200, and the pixel electrode PE is provided on the flattened layer 19. The pixel electrode PE is electrically connected to the drain electrode of the TFT 200, which is the selection TFT. Note that when applied to a color filter organic EL display device, a color filter layer (not illustrated) may further be provided between the flattened layer 19 and the inorganic insulating layer 11. A bank (not illustrated) formed of an insulating material is provided between adjacent pixel areas on the flattened layer 19 and the pixel electrode PE. Although not illustrated, an organic EL layer is arranged on the pixel electrode PE, and an upper electrode is provided on the organic EL layer. For example, the pixel electrode PE functions as an anode electrode and the upper electrode functions as a cathode electrode. Note that, when applied to a top-emitting organic EL display device, it is not necessary to form light blocking layers (lower conductive layers 2A and 2B) in the respective TFTs.

Modification Example 1

Figure 5:
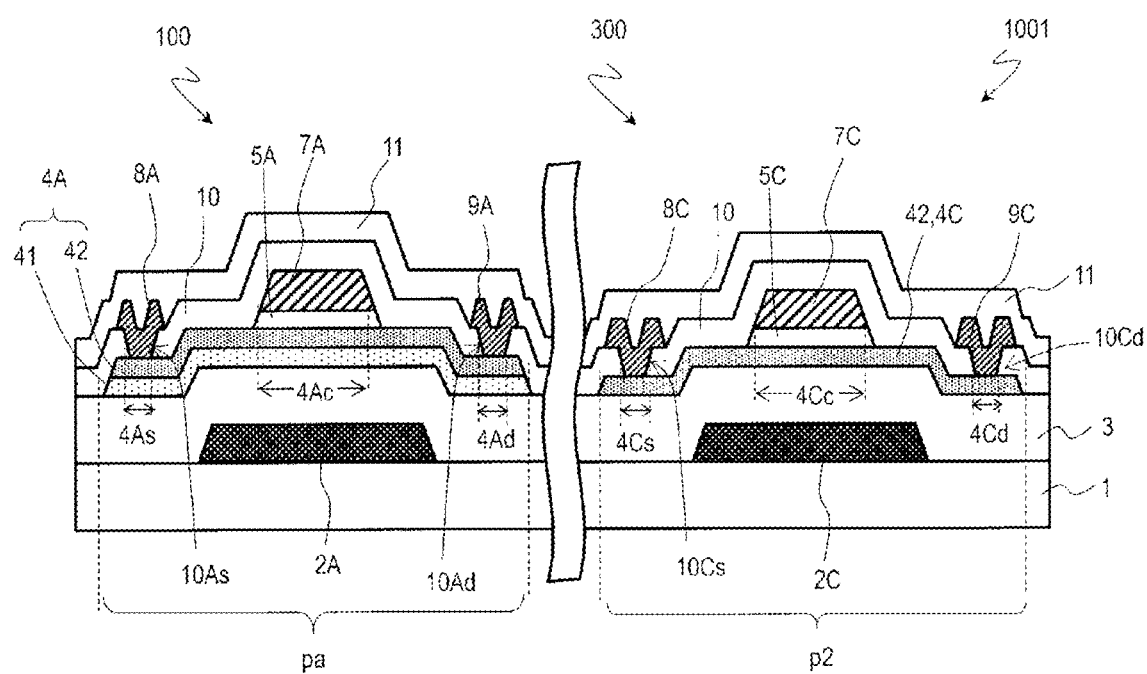
FIG. 5 is a schematic cross-sectional view of the first TFT 100 and the second TFT 300 in another active matrix substrate 1001 of the first embodiment.

FIG. 5 is a schematic cross-sectional view of the first TFT 100 and a second TFT 300 in another active matrix substrate 1001 according to the present embodiment.

The active matrix substrate 1001 of Modification Example 1 is different from the active matrix substrate 1000 illustrated in FIG. 2 in that the second TFT 300 includes the upper layer portion p2. Hereinafter, only the points different from the active matrix substrate 1000 will be described, and the description of the same configuration will be omitted.

Similar to the TFTs 100 and 200, the TFT 300 includes an oxide semiconductor layer 4C, a gate electrode 7C arranged on a part of the oxide semiconductor layer 4C with a gate insulating layer 5C interposed therebetween, and a source electrode 8C and a drain electrode 9C. The TFT 300 may further include a lower conductive layer 2C on the substrate 1 side of the oxide semiconductor layer 4C.

The oxide semiconductor layer 4C includes the upper layer portion p2 including the upper oxide semiconductor film 42 but not including the lower oxide semiconductor film 41. As illustrated in the figure, the entire oxide semiconductor layer 4C may include the upper oxide semiconductor film 42 and may not include the lower oxide semiconductor film 41. Note that in the modification example, in the oxide semiconductor layer 4C, the upper layer portion p2 may be provided over the entire first region 4Cc and the lower oxide semiconductor film 41 may be provided in another region.

Figure 6:
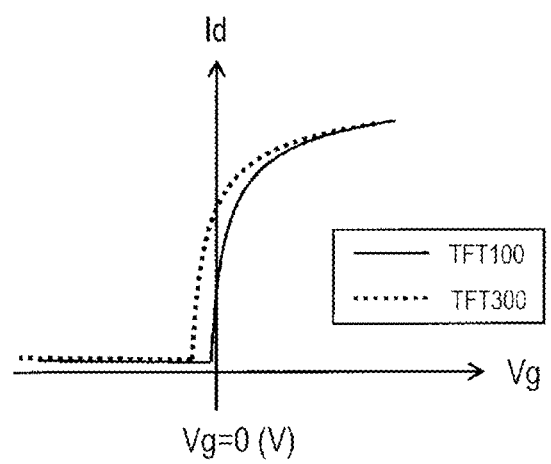
FIG. 6 is a diagram illustrating Vg-Id characteristics of the TFT 100 and the TFT 300.

FIG. 6 is a diagram illustrating Vg-Id characteristics of the TFT 100 and the TFT 300. The horizontal axis of the graph represents a gate-drain voltage Vg, and the vertical axis of the graph represents a drain current Id.

From FIG. 6, it can be seen that the TFT 300 has a lower threshold voltage than the TFT 100. This is because in the TFT 300, in the first region 4Cc of the oxide semiconductor layer 4C, the upper oxide semiconductor film 42 having a high mobility is provided and the lower oxide semiconductor film 41 having a low mobility is not provided, so that the mobility in the entire first region is higher than that of the oxide semiconductor layer 4A including the lower oxide semiconductor film 41, and the threshold voltage has shifted in the negative direction.

The TFT 100 may be used as a pixel TFT, and the TFT 300 may be used as an SSD circuit TFT. It is advantageous to use the TFT 300 in, for example, an SSD circuit because the on current can be increased. The TFT 300 may have depletion characteristics that the threshold voltage is negative. As a result, the on current of the TFT 300 can be further improved. Alternately the TFT 100 may be used as a drive circuit TFT, and the TFT 300 may be used as an SSD circuit TFT.

Alternatively, the TFT 100 and the TFT 300 may be mixed in the drive circuit. For example, the TFT 300 may be used as an output transistor in a gate drive circuit, and the TFT 100 may be used as another transistor.

In an active matrix substrate used as a backplane for an organic EL display device, the TFT 100 and the TFT 300 may be mixed in a pixel circuit provided in each pixel area. For example, in the pixel circuit, the TFT 300 having a large on current may be used as the selection TFT and the TFT 100 having a threshold voltage shifted in the positive direction relative to a threshold voltage of the TFT 300 may be used as a drive TFT.

Note that in the example illustrated in FIG. 6, the TFT 100 has depletion characteristics, but when the TFT 100 is used as a drive circuit TFT or a drive TFT in a pixel circuit, the TFT 100 preferably has enhancement characteristics.

Manufacturing Method of Active Matrix Substrate 1001

Next, an example of a manufacturing method of the active matrix substrate 1001 will be described with reference to the drawings. In the following, when the material, thickness, formation process, and the like of each layer are the same as those of the active matrix substrate 1000 (see FIGS. 4A to 4M), the description thereof will be omitted. In these drawings, the TFT formation region R1 in which the TFT 100 is formed and a TFT formation region R3 in which the TFT 300 is formed are illustrated.

Figure 7A:
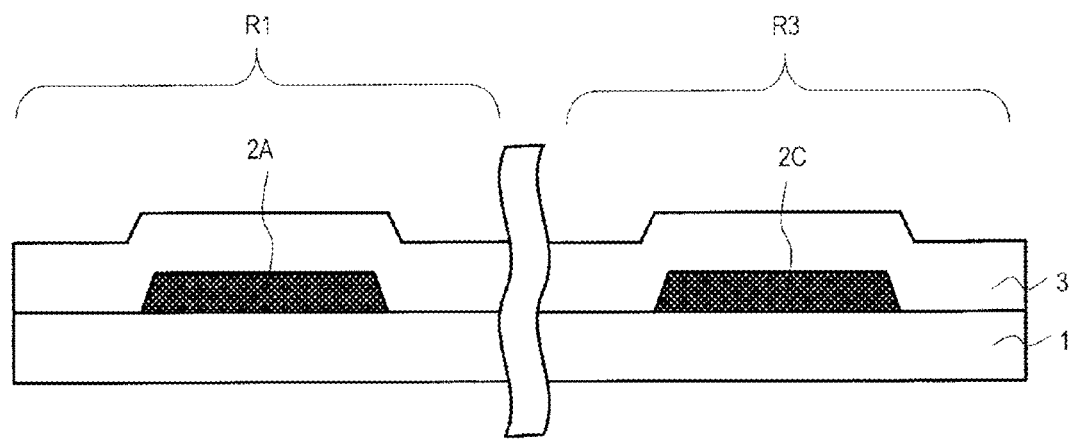
FIG. 7A is a process cross-sectional view illustrating a manufacturing method of the active matrix substrate 1001.
Figure 7B:
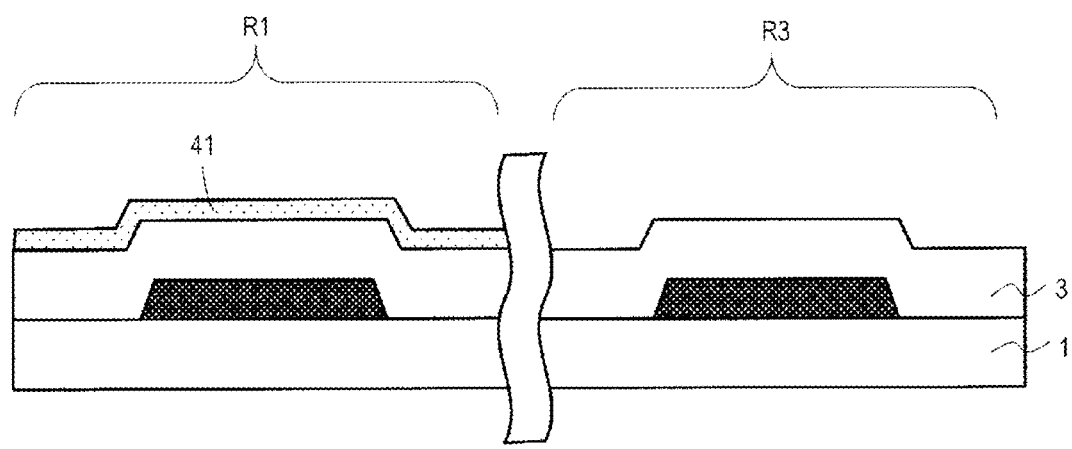
FIG. 7B is a process cross-sectional view illustrating the manufacturing method of the active matrix substrate 1001.
Figure 7C:
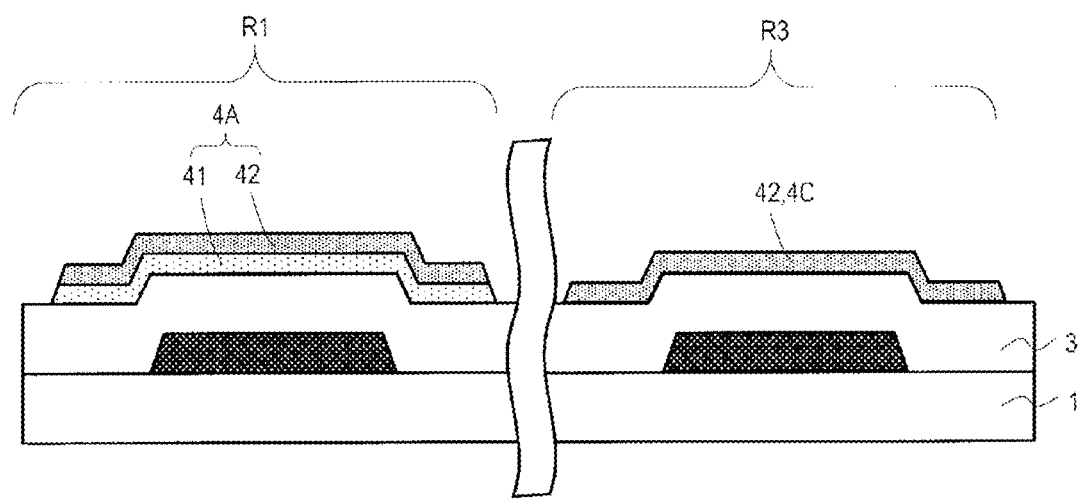
FIG. 7C is a process cross-sectional view illustrating the manufacturing method of the active matrix substrate 1001.

FIGS. 7A to 7C are schematic process cross-sectional views for explaining a manufacturing method of the active matrix substrate 1001, respectively.

As illustrated in FIG. 7A, the lower conductive layers 2A and 2C, and the lower insulating layer 3 are formed on the substrate 1. Subsequently, as illustrated in FIG. 7B, the lower oxide semiconductor film 41 is formed on the lower insulating layer 3, and then the lower oxide semiconductor film 41 is patterned. As a result, in the lower oxide semiconductor film 41, a portion located in the TFT formation region R3 is removed. In the lower oxide semiconductor film 41, a portion located in the TFT formation region R1 may be left unremoved.

The etching of the lower oxide semiconductor film 41 (for example, In—Ga—Zn—O based semiconductor film) may be performed by, for example, wet etching using the PAN-based etching solution or the oxalic acid-based etching solution.

Subsequently, as illustrated in FIG. 7C, the upper oxide semiconductor film 42 (for example, an In—Ga—Zn—O based semiconductor film) is formed so as to cover the lower insulating layer 3 and the patterned lower oxide semiconductor film 41. Then, the lower oxide semiconductor film 41 and the upper oxide semiconductor film 42 are patterned. For example, the lower oxide semiconductor film 41 and the upper oxide semiconductor film 42 may be patterned simultaneously by using the PAN-based etching solution or the oxalic acid-based etching solution. When a film containing Sn (for example, an In—Sn—Zn—O based semiconductor film) is used as the upper oxide semiconductor film 42, the lower oxide semiconductor film 41 and the upper oxide semiconductor film 42 may be patterned simultaneously by using the oxalic acid-based etching solution.

As a result, the oxide semiconductor layer 4A having the layered structure including the lower oxide semiconductor film 41 and the upper oxide semiconductor film 42 is formed in the TFT formation region R1. In the TFT formation region R3, the oxide semiconductor layer 4C including the upper oxide semiconductor film 42 and not including the lower oxide semiconductor film 41 is formed.

Thereafter, the gate insulating layer, the gate electrode, the interlayer insulating layer, the source and the drain electrodes are formed by a method similar to that for manufacturing the active matrix substrate 1000 to obtain the active matrix substrate 1001.

In the modification example, the lower oxide semiconductor film 41 and the upper oxide semiconductor film 42 may not be simultaneously etched. For example, in the patterning step of the layered film illustrated in FIG. 7C, the upper oxide semiconductor film 42 and the lower oxide semiconductor film 41 may be etched separately.

Alternatively, instead of the steps illustrated in FIGS. 7B and 7C, the oxide semiconductor layers 4A and 4C may be formed as follows. First, the lower oxide semiconductor film 41 is formed and patterned to form the first layer of the oxide semiconductor layer 4A. Next, the upper oxide semiconductor film 42 is formed so as to cover the patterned lower oxide semiconductor film 41. Thereafter, only the upper oxide semiconductor film 42 is etched to form the second layer of the oxide semiconductor layer 4A and the oxide semiconductor layer 4C.

When the upper oxide semiconductor film 42 and the lower oxide semiconductor film 41 are etched separately, as described with reference to FIGS. 20A and 20B, the side surface of the lower oxide semiconductor film 41 and the side surface of the upper oxide semiconductor film 42 may not be aligned with each other in the oxide semiconductor layer 4A.

Second Embodiment

Hereinafter, an active matrix substrate according to a second embodiment will be described with reference to the drawings. In the following, the points different from the first embodiment will be mainly described, and the description of the same configuration as that of the first embodiment will be omitted.

Figure 8A:
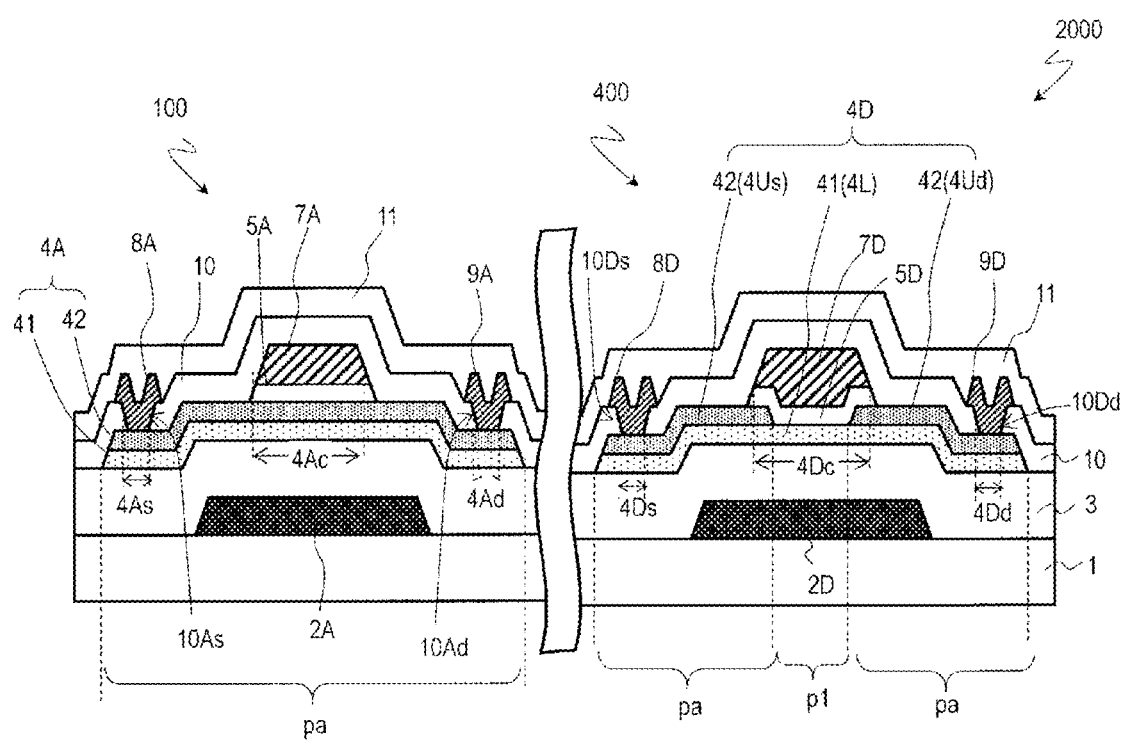
FIG. 8A is a schematic cross-sectional view illustrating the first TFT 100 and a second TFT 400 in an active matrix substrate 2000 according to a second embodiment.
Figure 8B:
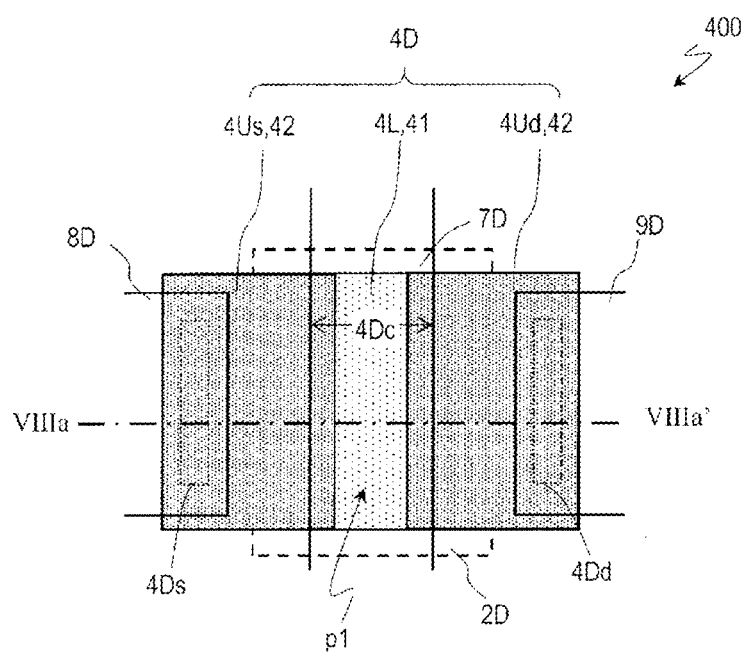
FIG. 8B is a schematic plan view of the TFT 400.

FIG. 8A is a schematic cross-sectional view illustrating the first TFT 100 and a second TFT 400 in an active matrix substrate 2000 according to the present embodiment. FIG. 8B is a schematic plan view of the TFT 400. The cross section of the TFT 400 illustrated in FIG. 8A is a cross section taken along a line VIIIa-VIIIa' of FIG. 8B.

The active matrix substrate 2000 is different from the active matrix substrate 1000 illustrated in FIG. 2 in that the second TFT 400 has an active layer structure different from the above-described embodiment. Note that the first TFT 100 has an active layer structure similar to that of the TFT 100 illustrated in FIG. 2.

Similar to the TFT 100, the TFT 400 includes an oxide semiconductor layer 4D, a gate electrode 7D arranged on a part of the oxide semiconductor layer 4D with a gate insulating layer 5D interposed therebetween, and a source electrode 8D and a drain electrode 9D. The TFT 400 may further include a lower conductive layer 2D on the substrate 1 side of the oxide semiconductor layer 4D.

In the TFT 400, the oxide semiconductor layer 4D includes the lower layer portion p1 including the lower oxide semiconductor film 41 and not including the upper oxide semiconductor film 42, and the layered portion pa including the lower oxide semiconductor film 41 and the upper oxide semiconductor film 42.

In the illustrated example, in a first region 4Dc of the oxide semiconductor layer 4D, the lower layer portion p1 is provided in a part thereof and the layered portion pa is provided in another part thereof. The layered portion pa is provided in both a first contact region 4Ds and a second contact region 4Dd of the oxide semiconductor layer 4D. The layered portion pa may be provided in the entire second region of the oxide semiconductor layer 4D.

In the illustrated example, in the oxide semiconductor layer 4D, second layers 4Us and 4Ud made of the upper oxide semiconductor film 42 are arranged facing each other at a distance on the first layer 4L made of the lower oxide semiconductor film 41. In the first layer 4L, a portion located between the second layers 4Us and 4Ud is the "lower layer portion p1". The gate insulating layer 5D is in contact with, for example, the upper faces and the side surfaces of the second layers 4Us and 4Ud, and the exposed upper face portion of the first layer 4L. The width of the gate electrode 7D in a channel length direction is larger than the width between the second layers 4Us and 4Ud (i.e., the width of the lower layer portion p1). When viewed from the normal direction of the substrate 1, the gate electrode 7D is arranged so as to cover the lower layer portion p1 and the end portions of the second layers 4Us and 4Ud on the lower layer portion p1 side. Other structures are similar to the structures of the TFTs 200 and 300 of the embodiment described above.

Oxide semiconductor films similar to those used in the embodiment described above can be used as the upper oxide semiconductor film 42 and the lower oxide semiconductor film 41. However, in the present embodiment, the mobility of the upper oxide semiconductor film 42 may be higher or lower than the mobility of the lower oxide semiconductor film 41.

Effect

When the upper oxide semiconductor film 42 is a high mobility oxide semiconductor film and the lower oxide semiconductor film 41 is a low mobility oxide semiconductor film, Vg-Id characteristics of the TFT 100 and the TFT 400 have similar tendencies to those of the TFT 100 and the TFT 200 exemplified in FIG. 3, respectively. That is, the threshold voltage of the TFT 400 shifts in a positive direction from that of the TFT 100. It is conceived that this is because in a part of the first region 4Dc of the oxide semiconductor layer 4D in the TFT 400, the low mobility oxide semiconductor film is provided and the high mobility oxide semiconductor film is not provided. Therefore, the mobility in the first region of the TFT 400 is considered to be lower than that of the oxide semiconductor layer 4A in which the high mobility oxide semiconductor film is provided in the entire first region 4Ac. When having such characteristics, the TFT 100 may be used as, for example, a pixel TFT, and the TFT 400 may be used as, for example, a drive circuit TFT. The TFT 100 may have depletion characteristics or enhancement characteristics. The TFT 400 preferably has enhancement characteristics.

On the other hand, when the upper oxide semiconductor film 42 is a low mobility oxide semiconductor film and the lower oxide semiconductor film 41 is a high mobility oxide semiconductor film, the Vg-Id characteristics of the TFT 100 and the TFT 400 have the similar tendencies to those of the TFT 100 and the TFT 300 exemplified in FIG. 6, respectively. That is, the threshold voltage of the TFT 400 shifts in a negative direction from that of the TFT 100. In this case, the TFT 100 may be used as, for example, the pixel TFT, and the TFT 400 may be used as, for example, an SSD circuit TFT.

A ratio W1 of the width of the lower layer portion p1 in the channel length direction to the width of the first region 4Dc (width of the gate electrode 7D) in the channel length direction is not particularly limited, but may be, for example, one third or more and nine tenth or less.

Alternatively, the width of the lower layer portion p1 in the channel length direction may be 3 μm or more and 30 μm or less. By adjusting the ratio W1 or the width of the lower layer portion p1, it is possible to control the threshold voltage of the TFT 400.

As described above, in the known top gate TFT, in the etching step of forming an opening exposing the oxide semiconductor layer in the interlayer insulating layer, when the oxide semiconductor layer is thin, a portion in the oxide semiconductor layer located within an opening of the interlayer insulating layer may be removed in a thickness direction. As a result, the contact resistance between the oxide semiconductor layer and the source/drain electrodes may increase, and the desired on-characteristics may not be obtained. Further, there is also a risk that the oxide semiconductor layer and the source/drain electrodes are not electrically connected, resulting in that the TFT does not operate.

In contrast, according to the present embodiment, the contact regions 4As and 4Ad, and 4Ds and 4Dd of the oxide semiconductor layers 4A and 4D have the layered structures, and have sufficient thicknesses, respectively. Thus, in the etching step of the interlayer insulating layer 10, even when the surface layer portions of the first contact region 4Ds and the second contact region 4Dd of the oxide semiconductor layer 4D are removed, portions located below the surface layer portions remain unremoved. Accordingly, an increase in contact resistance between the oxide semiconductor layers 4A and 4D and the source/drain electrodes 8A and 8D, and 9A and 9D can be suppressed.

In this manner, in the active matrix substrate 2000, the oxide semiconductor layer 4A of the TFT 100 and the oxide semiconductor layer 4D of the TFT 400 can have the layered structures in all the first contact regions 4As and 4Ds and the second contact regions 4Ad and 4Dd, while having different structures in the first regions 4Ac and 4Dc including the channel regions. Therefore, it is possible to make the characteristics of the TFT 400 and the TFT 100 different from each other while suppressing an increase in the contact resistance between the oxide semiconductor layers 4A and 4D and the source/drain electrodes.

The mobility of the upper oxide semiconductor film 42 may be higher or lower than the mobility of the lower oxide semiconductor film 41. Which of the lower oxide semiconductor film 41 and the upper oxide semiconductor film 42 is used as a high mobility oxide semiconductor film can be selected depending on uses of the TFTs 100 and 400.

When the upper oxide semiconductor film 42 has a higher mobility than the lower oxide semiconductor film 41, there are the following advantages.

By arranging the high mobility oxide semiconductor film closer to the gate electrode 7A, the threshold voltage of the TFT 100 can be made higher.

Further, when the high mobility oxide semiconductor film is lowered in resistance, a resistance lowered region having a smaller specific resistance can be obtained than when the low mobility oxide semiconductor film is lowered in resistance. Thus, when the high mobility oxide semiconductor film is removed in the second region of the oxide semiconductor layer, the specific resistance in the second region may increase and the effect on current of the TFT may decrease. In contrast, in the example illustrated in FIG. 8A, similar to the TFT 100, the TFT 400 also includes the upper oxide semiconductor film 42, which is the high mobility oxide semiconductor film, as the uppermost layer in the entire second region of the oxide semiconductor layer 4D not covered with the gate electrode 7D when viewed from the normal direction of the substrate 1. Therefore, the specific resistance in the resistance lowered region can be reduced as compared with the case in which the high mobility oxide semiconductor film is not provided in the second region (for example, the TFT 200 illustrated in FIG. 2), it is possible to suppress a decrease in the effect on current of the TFTs 100 and 400. When the interlayer insulating layer 10 is an insulating layer that can reduce the oxide semiconductor, the upper face of the upper oxide semiconductor film 42 may be in direct contact with the interlayer insulating layer 10. As a result, the specific resistance of the resistance lowered region can be further reduced.

On the other hand, when the lower oxide semiconductor film 41 has a higher mobility than the upper oxide semiconductor film 42, there are the following advantages.

When the openings 10As and 10Ad, and 10Bs and 10Bd for connecting the source and drain electrodes and the oxide semiconductor layers 4A and 4B are formed in the interlayer insulating layer 10, the surface layer portions of the oxide semiconductor layers 4A and 4B may also be etched. Even in such a case, since the lower oxide semiconductor film 41, which is the high mobility semiconductor film, remains without being etched, the contact resistance between the source and drain electrodes and the oxide semiconductor layers 4A and 4B can be kept low.

Further, when an insulating layer that can reduce the oxide semiconductor is used as the lower insulating layer 3, and the film quality of the lower insulating layer 3 is used to reduce the resistance of the oxide semiconductor layers 4A and 4B, by arranging the lower oxide semiconductor film 41 having the high mobility so as to be in contact with the lower insulating layer 3, the resistance in the low-resistance region can be further reduced.

Manufacturing Method of Active Matrix Substrate 2000

Next, an example of a manufacturing method of the active matrix substrate 2000 will be described with reference to the drawings. In the following, when the material, thickness, formation process, and the like of each layer are the same as those of the active matrix substrate 1000 (see FIGS. 4A to 4M), the description thereof will be omitted. In these drawings, the TFT formation region R1 in which the TFT 100 is formed and a TFT formation region R4 in which the TFT 400 is formed are illustrated.

FIGS. 9A to 9E are schematic process cross-sectional views for explaining the manufacturing method of the active matrix substrate 2000.

Figure 9A:
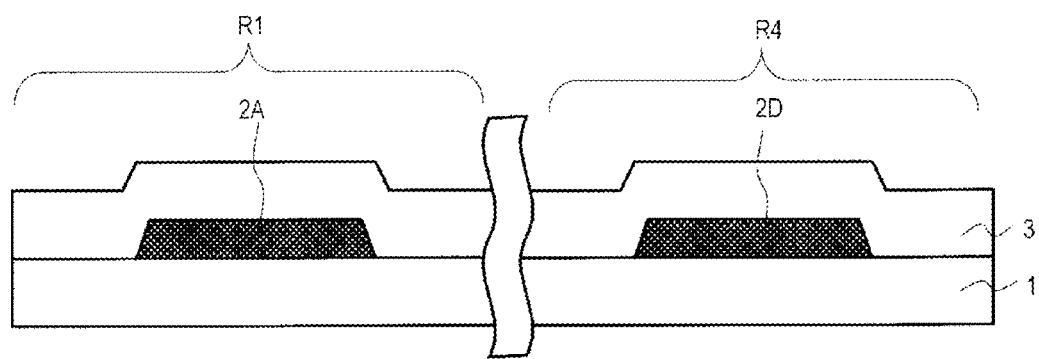
FIG. 9A is a process cross-sectional view illustrating a manufacturing method of the active matrix substrate 2000.
Figure 9B:
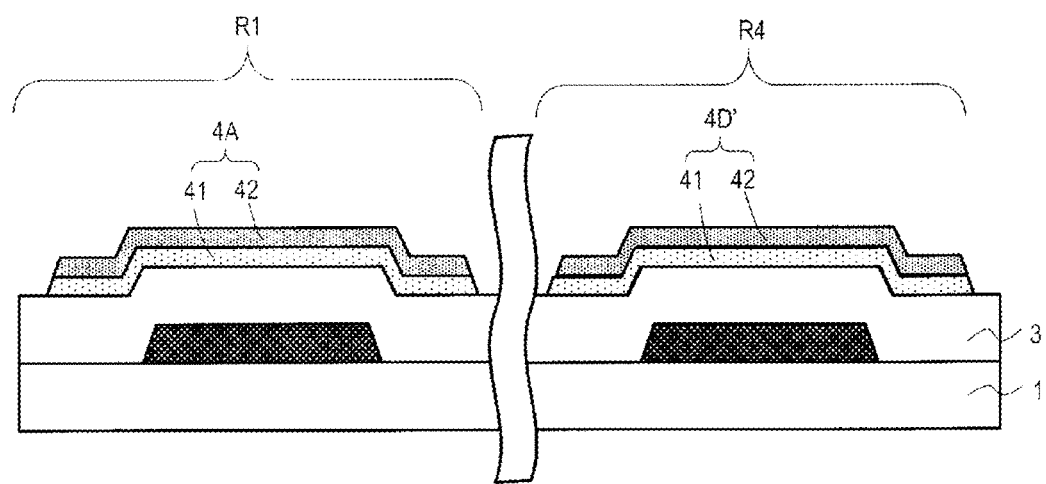
FIG. 9B is a process cross-sectional view illustrating the manufacturing method of the active matrix substrate 2000.

As illustrated in FIG. 9A, the lower conductive layers 2A and 2D, and the lower insulating layer 3 are formed on the substrate 1. Subsequently, as illustrated in FIG. 9B, the lower oxide semiconductor film 41 and the upper oxide semiconductor film 42 are formed on the lower insulating layer 3 in this order, and the layered film including the lower oxide semiconductor film 41 and the upper oxide semiconductor film 42 is patterned. As a result, the oxide semiconductor layer 4A having the layered structure including the lower oxide semiconductor film 41 and the upper oxide semiconductor film 42 is formed in the TFT formation region R1. A layered body 4D' including the lower oxide semiconductor film 41 and the upper oxide semiconductor film 42 is formed in the TFT formation region R4.

Here, of the upper oxide semiconductor film 42 and the lower oxide semiconductor film 41, as a film having a higher mobility (high mobility oxide semiconductor film), for example, an In—Ga—Zn—O based semiconductor film (for example, In:Ga:Zn=5:1:4) having a thickness of 10 nm may be formed, and as a low mobility oxide semiconductor film, for example, an In—Ga—Zn—O based semiconductor film (for example, In:Ga:Zn=1:1:1) having a thickness of 40 nm may be formed. The patterning of the layered film may be performed by, for example, wet etching using a PAN-based etching solution or an oxalic acid-based etching solution. As a result, the lower oxide semiconductor film 41 and the upper oxide semiconductor film 42 can be simultaneously etched.

Alternatively, as the high mobility oxide semiconductor film, an oxide semiconductor film containing Sn, for example, an In—Sn—Zn—O based semiconductor film (for example, $In_2O_3$—$SnO_2$—ZnO) having a thickness of 10 nm may be formed, and as the low mobility oxide semiconductor film, an oxide semiconductor film that does not contain Sn, for example, an In—Ga—Zn—O based semiconductor film having a thickness of 40 nm may be formed. In this case as well, the lower oxide semiconductor film 41 and the upper oxide semiconductor film 42 can be simultaneously etched using the oxalic acid-based etching solution.

Figure 9C:
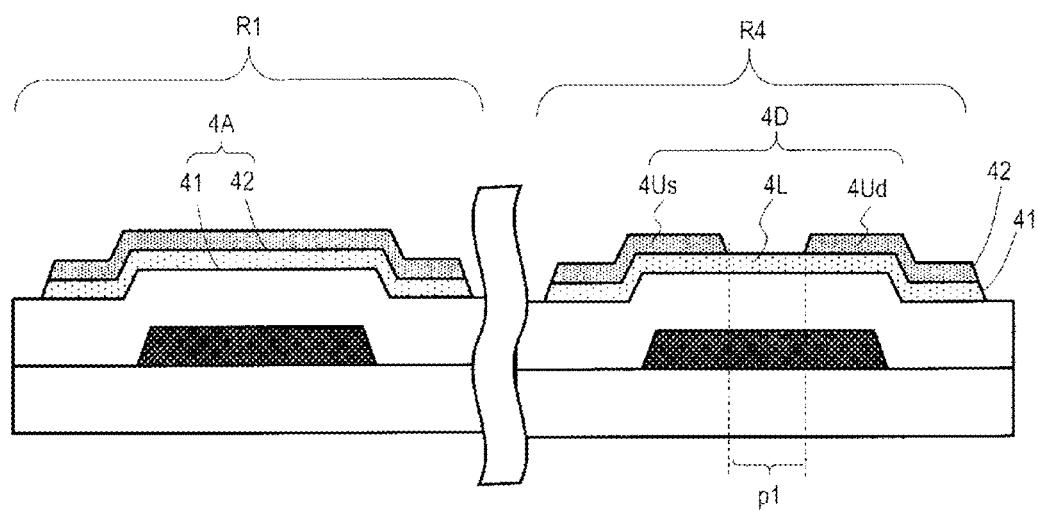
FIG. 9C is a process cross-sectional view illustrating the manufacturing method of the active matrix substrate 2000.

Subsequently, as illustrated in FIG. 9C, a part of the upper oxide semiconductor film 42 is removed in the TFT formation region R4 to expose a part of the lower layer (first layer) 4L made of the lower oxide semiconductor film 41. Here, the upper layers (second layer) 4Us and 4Ud, which are separated from each other, are formed of the upper oxide semiconductor film 42. The exposed portion of the lower oxide semiconductor film 41 is the lower layer portion p1. As a result, an oxide semiconductor layer 4D including the first layer 4L and the second layers 4Us and 4Ud is formed in the TFT formation region R4.

Etching of the upper oxide semiconductor film 42 is performed under a manner and conditions such that the upper oxide semiconductor film 42 is selectively removed and the lower oxide semiconductor film 41 remains without being removed.

When the upper oxide semiconductor film 42 is a high mobility oxide semiconductor film, the etching method of the upper oxide semiconductor film 42 may be the same as the etching method of the upper oxide semiconductor film 42 described with reference to FIG. 4D.

When the upper oxide semiconductor film 42 is a low mobility oxide semiconductor film, in a case that the lower oxide semiconductor film 41 and the upper oxide semiconductor film 42 are both In—Ga—Zn—O based semiconductor films, wet etching may be performed using the PAN-based etching solution or the oxalic acid-based etching solution. By controlling conditions such as the etching time so that the lower oxide semiconductor film 41 is not removed, the upper oxide semiconductor film 42 can be etched.

When the upper oxide semiconductor film 42 is an oxide semiconductor film not containing Sn and the lower oxide semiconductor film 41 is an oxide semiconductor film containing Sn, the upper oxide semiconductor film 42 can be selectively etched by using the PAN-based etching solution.

The etching in this step is not limited to the wet etching, and may be performed by dry etching. In this case, the surface portion of the lower oxide semiconductor film 41 may be etched (over-etched).

Table 1 shows the composition of each of the oxide semiconductor films, the etching solution used when the layered film including these oxide semiconductor films is collectively etched (FIG. 9B), and the etching solution used when etching only the upper oxide semiconductor film (FIG. 9C). Table 1 also shows the magnitude relationship between the In ratio (or Ga ratio) of the lower oxide semiconductor film 41 and the In ratio (or Ga ratio) of the upper oxide semiconductor film 42 when both of the two oxide semiconductor films are In—Ga—Zn—O based semiconductor films.

Also in the present embodiment, the upper oxide semiconductor film 42 and the lower oxide semiconductor film 41 may not be etched simultaneously. When these semiconductor films are etched separately, as described with reference to FIGS. 20A and 20B, the side surface of the lower oxide semiconductor film 41 and the side surface of the upper oxide semiconductor film 42 may not be aligned with each other.

As an example, when the upper oxide semiconductor film 42 is an In—Ga—Zn—O based semiconductor film and the lower oxide semiconductor film 41 is an oxide semiconductor film containing Sn, in the patterning step of the layered film illustrated in FIG. 9B, first, the upper oxide semiconductor film 42 may be selectively etched using the PAN-based etching solution, and then the lower oxide semiconductor film 41 may be etched using the oxalic acid-based etching solution.

Figure 21A:
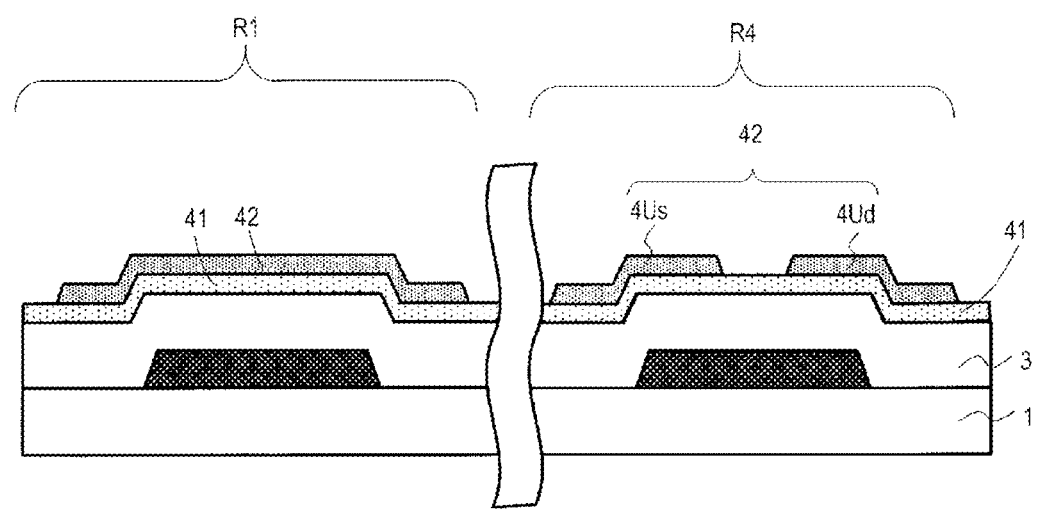
FIG. 21A is a process cross-sectional view illustrating another manufacturing method of the active matrix substrate 2000.

Alternatively, instead of the steps illustrated in FIGS. 9B and 9C, the oxide semiconductor layers 4A and 4D may be formed as follows. First, as illustrated in FIG. 21A, after the layered film is formed, only the upper oxide semiconductor film 42 is selectively etched. As a result, the second layer of the oxide semiconductor layer 4A and the second layers 4Us and 4Ud of the oxide semiconductor layer 4D are formed of the upper oxide semiconductor film 42. For example, when the upper oxide semiconductor film 42 is an oxide semiconductor film not containing Sn and the lower oxide semiconductor film 41 is an oxide semiconductor film containing Sn, it is advantageous to use the PAN-based etching solution because only the upper oxide semiconductor film 42 can be selectively etched (see Table 1). Subsequently, as illustrated

TABLE 1

| Upper oxide semiconductor film | | Lower oxide semiconductor film | | Etching of layered film | Etching upper oxide semiconductor film only |
|---|---|---|---|---|---|
| Composition | Mobility | Composition | Mobility | | |
| In—Ga—Zn—O (Large In ratio or small Ga ratio) | High | In—Ga—Zn—O (Small In ratio or large Ga ratio) | Low | PAN-based and oxalic acid-based | PAN-based and oxalic acid-based |
| In—Ga—Zn—O (Small In ratio large Ga ratio) | Low | In—Ga—Zn—O (Large In ratio or small Ga ratio) | High | PAN-based and oxalic acid-based | PAN-based and oxalic acid-based |
| Containing Sn (In—Sn—Zn—O, etc.) | High | Not containing Sn (In—Ga—Zn—O, etc.) | Low | Oxalic acid-based | Oxalic acid-based |
| Not containing Sn (In—Ga—Zn—O, etc.) | Low | Containing Sn (In—Sn—Zn—O, etc.) | High | Oxalic acid-based | PAN-based |

Figure 9D:
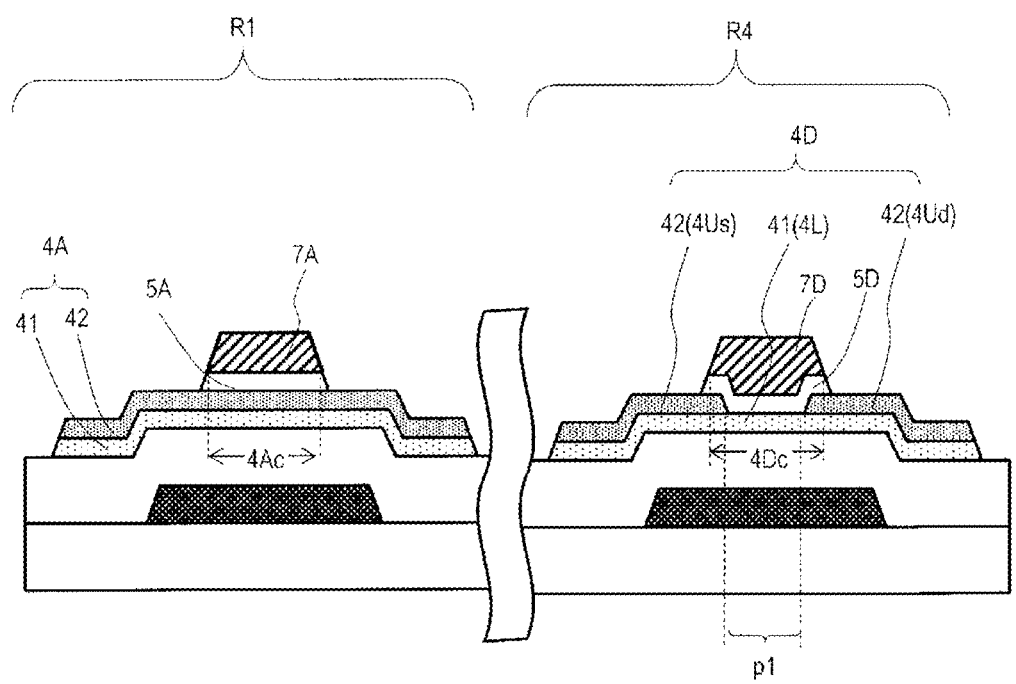
FIG. 9D is a process cross-sectional view illustrating the manufacturing method of the active matrix substrate 2000.
Figure 9E:
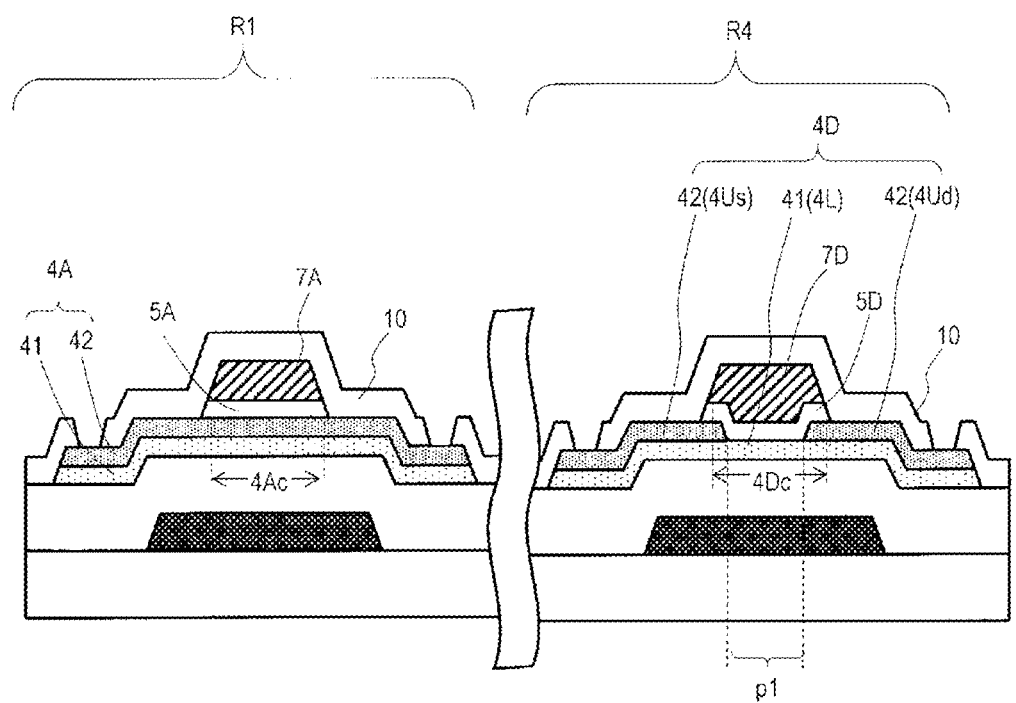
FIG. 9E is a process cross-sectional view illustrating the manufacturing method of the active matrix substrate 2000.

Subsequently, as illustrated in FIG. 9D, the gate insulating layers 5A and 5D and the gate electrodes 7A and 7D are formed on parts of the oxide semiconductor layers 4A and 4D. When viewed from the normal direction of the substrate 1, the gate electrode 7D is arranged straddling the lower layer portion p1 of the oxide semiconductor layer 4D so as to cover the end portions of the second layers 4Us and 4Ud on the lower layer portion p1 side. Thereafter, as illustrated in FIG. 9E, the interlayer insulating layer 10 is formed. Here, the interlayer insulating layer 10 is in contact with only the upper oxide semiconductor film 42 and is not in contact with the lower oxide semiconductor film 41 of the oxide semiconductor layers 4A and 4D.

Figure 21B:
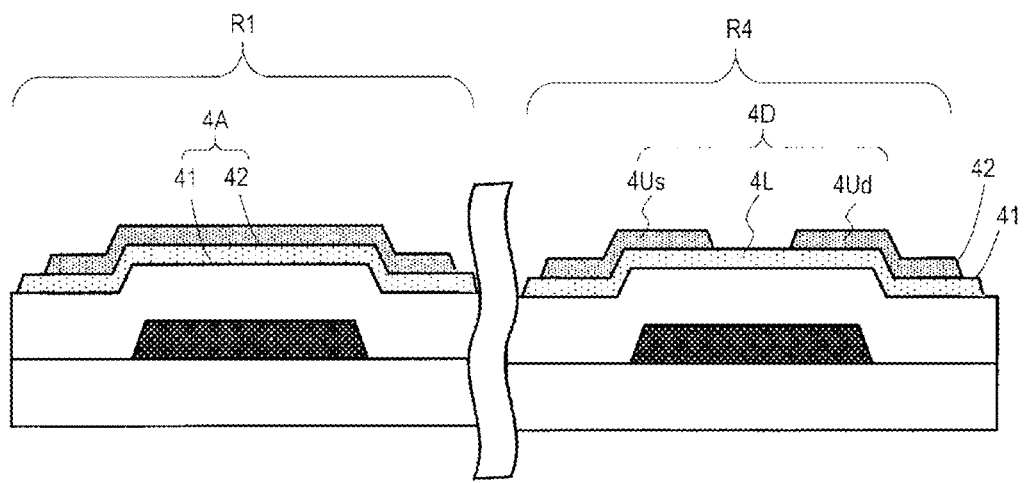
FIG. 21B is a process cross-sectional view illustrating the other manufacturing method of the active matrix substrate 2000.

Thereafter, the source and drain electrodes are formed by a method similar to that for manufacturing the active matrix substrate 1000 to obtain the active matrix substrate 2000.

in FIG. 21B, the lower oxide semiconductor film 41 is etched to form the first layers of the oxide semiconductor layers 4A and 4D.

Further, although not illustrated, instead of the steps illustrated in FIGS. 9B and 9C, the lower oxide semiconductor film 41 may be formed and patterned to form the first layers of the oxide semiconductor layers 4A and 4D, and then the upper oxide semiconductor film 42 may be formed and patterned.

Modification Example 2

Figure 10A:
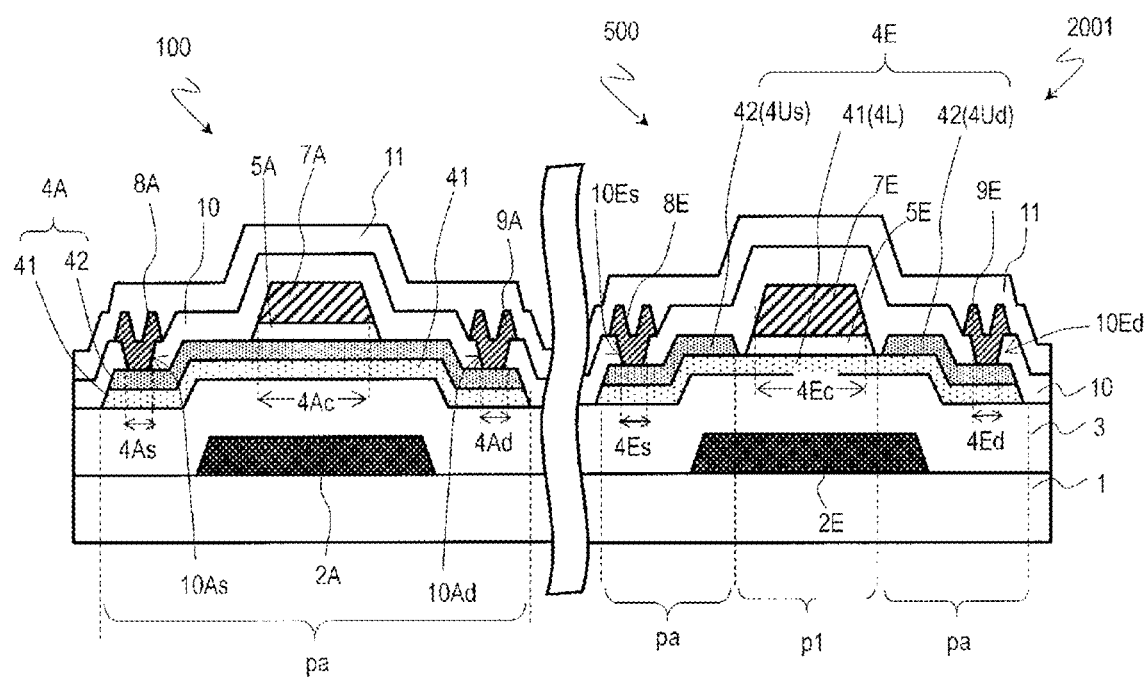
FIG. 10A is a schematic cross-sectional view illustrating the first TFT 100 and a second TFT 500 in another active matrix substrate 2001 according to the second embodiment.
Figure 10B:
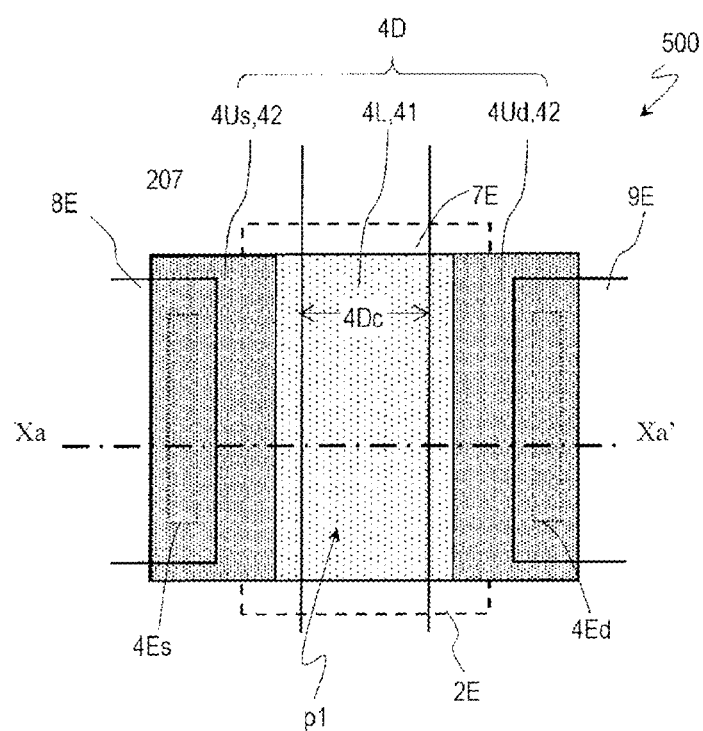
FIG. 10B is a schematic plan view of the TFT 500.

FIG. 10A is a schematic cross-sectional view illustrating the first TFT 100 and a second TFT 500 in another active matrix substrate 2001 of the present embodiment. FIG. 10B is a schematic plan view of the TFT 500. The cross section of the TFT 500 illustrated in FIG. 10A is a cross section taken along a line Xa-Xa' of FIG. 10B.

Since the first TFT 100 in Modification Example 2 has a similar structure to the TFT 100 illustrated in FIG. 2, the description thereof will be omitted.

Similar to the TFTs 100 and 400, the TFT 500 includes an oxide semiconductor layer 4E, a gate electrode 7E arranged on a part of the oxide semiconductor layer 4E with a gate insulating layer 5E interposed therebetween, and a source electrode 8E and a drain electrode 9E. The TFT 500 may further include a lower conductive layer 2E on the substrate 1 side of the oxide semiconductor layer 4E.

The TFT 500 is different from the TFT 400 illustrated in FIGS. 8A and 8B in that the lower layer portion p1 including the lower oxide semiconductor film 41 and not including the upper oxide semiconductor film 42 is provided in the entire first region 4Ec. In both a first contact region 4Es and a second contact region 4Ed in the oxide semiconductor layer 4E, the layered portions pa including the lower oxide semiconductor film 41 and the upper oxide semiconductor film 42 are provided. Note that a part of a portion that does not overlap the gate electrode 7E in the oxide semiconductor layer 4E (second region) when viewed from the normal direction of the substrate 1, the upper oxide semiconductor film 42 may not be provided.

In the illustrated example, in the oxide semiconductor layer 4E, the two second layers 4Us and 4Ud made of the upper oxide semiconductor film 42 are arranged on the first layer 4L made of the lower oxide semiconductor film 41 so as to face each other at a distance. In the first layer 4L, a portion located between the second layers 4Us and 4Ud is the "lower layer portion p1". The width of the gate electrode 7D in the channel length direction is smaller than the width between the second layers 4Us and 4Ud (i.e., the width of the lower layer portion p1). When viewed from the normal direction of the substrate 1, the gate electrode 7E is arranged on a part of the lower layer portion p1 and does not overlap the second layers 4Us and 4Ud. A part of the lower layer portion p1 and the layered portion pa are provided in the second region of the oxide semiconductor layer 4E that does not overlap the gate electrode 7E when viewed from the normal direction of the substrate 1. The structures other than the active layer are similar to the structures of the TFT 400 of the embodiment described above.

Also in the modification example, the characteristics of the TFTs 100 and 500 can be made different while suppressing an increase in contact resistance between the oxide semiconductor layers 4A and 4E and the source/drain electrodes 8A and 8E, and 9A and 9E of the TFTs 100 and 500. Also in the modification example, the mobility of the lower oxide semiconductor film 41 may be higher or lower than the mobility of the upper oxide semiconductor film 42. The magnitude relationship between the threshold voltages of the TFT 100 and the TFT 500 is similar to that in the active matrix substrate 2000.

In addition, when the upper oxide semiconductor film 42 is a high mobility oxide semiconductor film, the high mobility oxide semiconductor film is provided in a part of the second region of the TFT 500. As a result, the second region (low-resistance region) can be made smaller than that of the TFT 200 illustrated in FIG. 2, so that a decrease in the effect on current can be suppressed. Note that from the perspective of ensuring the effect on current, it is more preferable to have a structure including a high mobility oxide semiconductor film in the entire second region, as in the TFT 400 illustrated in FIGS. 8A and 8B.

The active matrix substrate 2001 of the modification example can be manufactured by a similar method to that for manufacturing the active matrix substrate 2000. However, the second layers 4Us and 4Ud are arranged at a distance sufficiently larger than the width of the gate electrode. Further, the gate insulating layer 5E and the gate electrode 7E are arranged on a part of the lower oxide semiconductor film 41 exposed from the upper oxide semiconductor film 42.

Modification Example 3

The active matrix substrate of the present embodiment may include a plurality of second TFTs in which the ratio W1 of the lower layer portion p1 to the first region of the oxide semiconductor layer is different from each other.

Figure 11:
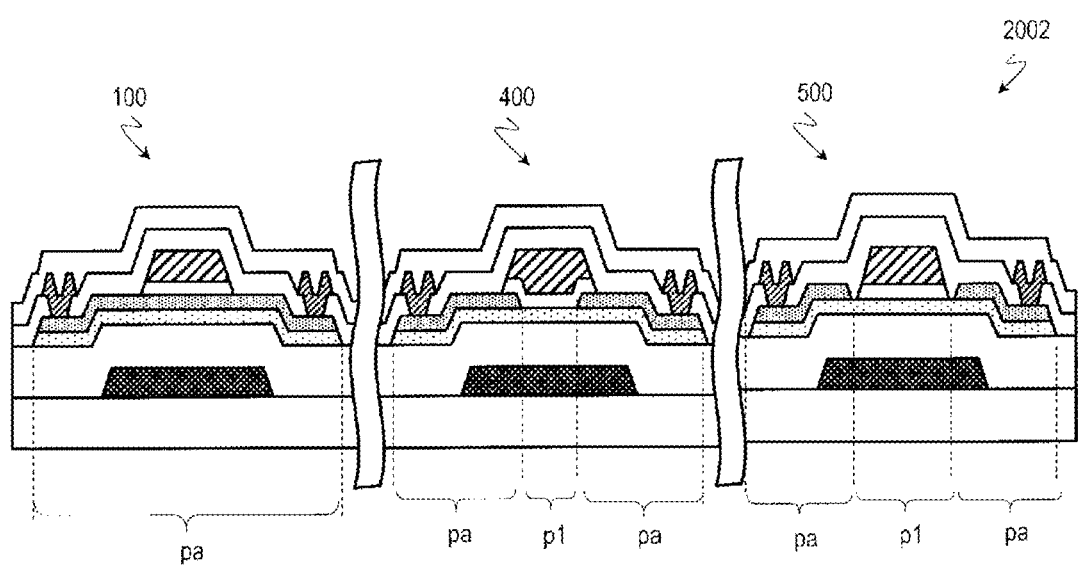
FIG. 11 is a cross-sectional view illustrating still another active matrix substrate 2002.

FIG. 11 is a cross-sectional view illustrating the three oxide semiconductor TFTs in an active matrix substrate 2002 of Modification Example 3.

In the example illustrated in FIG. 11, the active matrix substrate 2002 includes the TFT 100 (W1=0), the TFT 400 (W1 is, for example, one third or more and nine tenth or less) in which the lower layer portion p1 is provided only in a part of the first region of the oxide semiconductor layer, and the TFT 500 (W1=1), in which the lower layer portion p1 is provided in the entire first region. The TFTs 400 and 500 have the structures and characteristics described above with reference to FIGS. 8A and 8B and FIGS. 10A and 10B, respectively. Although not illustrated, instead of the TFT 500, the TFT 200 (W1=1) illustrated in FIG. 2A may be included.

When the lower oxide semiconductor film has a lower mobility than the upper oxide semiconductor film, the larger the ratio W1 becomes, the lower the mobility in the entire first region becomes, thereby increasing the shift amount of the threshold voltage in the positive direction. In this example, the threshold voltage of the TFT 100 (W=0) is the lowest, and the threshold voltage increases in the order of the TFT 400 and the TFT 500. On the other hand, when the lower oxide semiconductor film has a higher mobility than the upper oxide semiconductor film, the larger the ratio W1 becomes, the higher the mobility in the entire first region becomes, thereby increasing the shift amount of the threshold voltage in the negative direction. In this example, the threshold voltage of the TFT 100 (W=0) is the highest, and the threshold voltage is lowered in the order of the TFT 400 and the TFT 500.

As described above, according to the modification example, three TFTs having different characteristics can be manufactured using a process similar to that for the active matrix substrates 2000 and 2001 (without increasing the masking process). Note that in the description, when the active matrix substrate includes two second TFTs having different active layer structures, one of the two second TFTs may be referred to as a "third TFT".

Third Embodiment

Hereinafter, an active matrix substrate according to a third embodiment will be described with reference to the drawings. In the following description, the points different from the second embodiment will be mainly described, and the description of the same configuration as that of the second embodiment will be omitted.

Figure 12A:
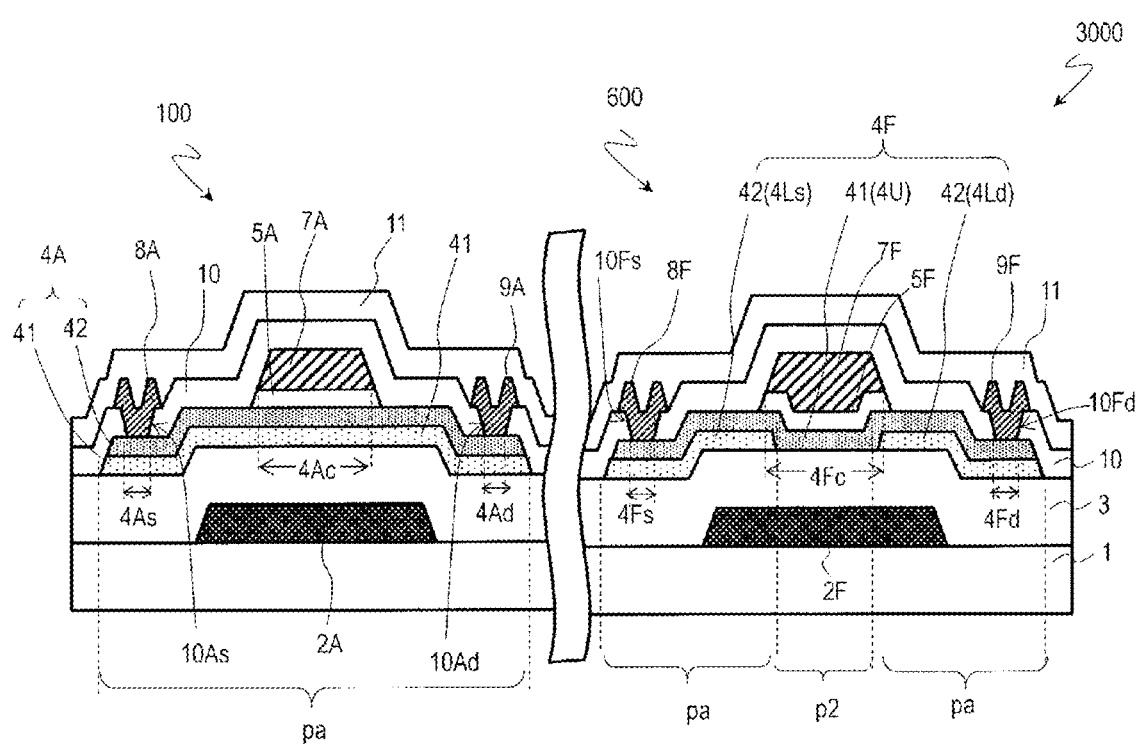
FIG. 12A is a schematic cross-sectional view illustrating the first TFT 100 and a second TFT 600 in an active matrix substrate 3000 according to a third embodiment.
Figure 12B:
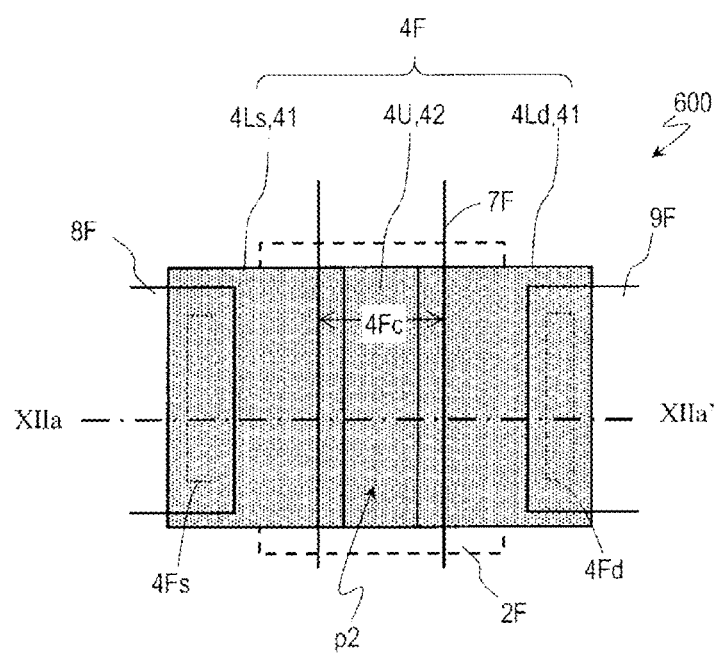
FIG. 12B is a schematic plan view of the TFT 600.

FIG. 12A is a schematic cross-sectional view illustrating the first TFT 100 and a second TFT 600 in an active matrix substrate 3000 of the present embodiment. FIG. 12B is a schematic plan view of the TFT 600. The cross section of the TFT 600 illustrated in FIG. 12A is a cross section taken along a line XIIa-XIIa' of FIG. 12B.

The active matrix substrate 3000 is different from the active matrix substrate 2000 of the above-described embodiment (FIGS. 8A and 8B) in that the second TFT 600 has an active layer structure including the upper layer portion p2. Note that the first TFT 100 has an active layer structure similar to that of the TFT 100 illustrated in FIG. 2.

Similar to the TFT 100, the TFT 600 includes an oxide semiconductor layer 4F, a gate electrode 7F arranged on a part of the oxide semiconductor layer 4F with a gate insulating layer 5F interposed therebetween, and a source electrode 8F and a drain electrode 9F. The TFT 600 may further include a lower conductive layer 2F on the substrate 1 side of the oxide semiconductor layer 4F.

In the TFT 600, the oxide semiconductor layer 4F includes the upper layer portion p2 including the upper oxide semiconductor film 42 and not including the lower oxide semiconductor film 41, and the layered portion pa including the lower oxide semiconductor film 41 and the upper oxide semiconductor film 42. Here, in a first region 4Fc of the oxide semiconductor layer 4F, the upper layer portion p2 is provided in a part thereof and the layered portion pa is provided in another part thereof. In addition, in both a first contact region 4Fs and a second contact region 4Fd in the oxide semiconductor layer 4F, the layered portion pa is provided. As illustrated in the figure, in the entire second region of the oxide semiconductor layer 4F, the layered portion pa may be provided.

In the illustrated example, in the oxide semiconductor layer 4F, two first layers 4Ls and 4Ld made of the lower oxide semiconductor film 41 are arranged so as to face each other at a distance. A second layer 4U made of the upper oxide semiconductor film 42 is formed so as to cover the first layers 4Ls and 4Ld and the gap therebetween.

In the second layer 4U, a portion located between the first layers 4Ls and 4Ld is the "upper layer portion p2". The width of the gate electrode 7F in the channel length direction is larger than the width between the first layers 4Ls and 4Ld (the width of the upper layer portion p2). When viewed from the normal direction of the substrate 1, the gate electrode 7F is arranged so as to cover the upper layer portion p2 and the end portions of the first layers 4Ls and 4Ld on the upper layer portion p2 side. The structures other than the active layer are similar to the structures of the TFT 400 of the embodiment described above.

Oxide semiconductor films similar to those used in the embodiment described above can be used as the upper oxide semiconductor film 42 and the lower oxide semiconductor film 41. In the present embodiment, the mobility of the upper oxide semiconductor film 42 may be higher or lower than the mobility of the lower oxide semiconductor film 41.

Effect

When the upper oxide semiconductor film 42 is a high mobility oxide semiconductor film and the lower oxide semiconductor film 41 is a low mobility oxide semiconductor film, Vg-Id characteristics of the TFT 100 and the TFT 600 have similar tendencies to those of the TFT 100 and TFT 300 illustrated in FIG. 6, respectively. That is, the threshold voltage of the TFT 600 shifts in a negative direction from that of the TFT 100. This is because in a part of the first region 4Fc of the oxide semiconductor layer 4F of the TFT 600, the high mobility oxide semiconductor film is provided and the low mobility oxide semiconductor film is not provided, so that the mobility in the entire first region is higher than that of the oxide semiconductor layer 4A including the low mobility oxide semiconductor film in the entire first region 4Ac. In this case, the TFT 100 may be used as, for example, a pixel TFT, and the TFT 600 may be used as, for example, an SSD circuit TFT.

On the other hand, when the upper oxide semiconductor film 42 is a low mobility oxide semiconductor film and the lower oxide semiconductor film 41 is a high mobility oxide semiconductor film, the Vg-Id characteristics of the TFT 100 and TFT 600 have similar tendencies to those of the TFT 100 and the TFT 200 illustrated in FIG. 3, respectively. That is, the threshold voltage of TFT 600 shifts in a positive direction from that of the TFT 100. In this case, the TFT 100 may be used as, for example, the pixel TFT, and the TFT 600 may be used as, for example, a drive circuit TFT. The TFT 100 may have depletion characteristics or enhancement characteristics. The TFT 600 preferably has enhancement characteristics.

A ratio W2 of the width of the upper layer portion p2 in a channel length direction to the width of the first region 4Fc (the width of the gate electrode 7F) in the channel length direction is not particularly limited, but may be, for example, one third or more and nine tenth or less. Alternatively, the width of the upper layer portion p2 in the channel length direction may be 3 μm or more and 30 μm or less. By adjusting the ratio W2 or the width of the upper layer portion p2, it is possible to control the threshold voltage of the TFT 600.

In the present embodiment, in all the first contact regions 4As and 4Fs and the second contact regions 4Ad and 4Fd of the oxide semiconductor layers 4A and 4F in the TFTs 100 and 600, the layered portions pa, which are thicker than the upper layer portion p2 are provided. Therefore, an increase in contact resistance between the oxide semiconductor layers 4A and 4F and the source/drain electrodes 8A and 8F, and 9A and 9F can be suppressed. Accordingly, it is possible to make the characteristics of the TFT 100 and the TFT 600 different from each other while suppressing an increase in contact resistance in the TFTs 100 and 600.

In the embodiment described above, when the step of etching only the upper oxide semiconductor film 42 is performed, it is preferable to select the materials of the lower oxide semiconductor film 41 and the upper oxide semiconductor film 42 in consideration of the etching method. In contrast, in the present embodiment, as described later, the oxide semiconductor layers 4A and 4F can be formed by first etching only the lower oxide semiconductor film 41 and then etching the lower oxide semiconductor film 41 and the upper oxide semiconductor film 42. Therefore, the step of etching only the upper oxide semiconductor film 42 is unnecessary, and the compositions and composition ratios of the lower oxide semiconductor film 41 and the upper oxide semiconductor film 42 can be selected at a higher degree of freedom.

Manufacturing Method of Active Matrix Substrate 3000

Next, an example of a manufacturing method of the active matrix substrate 3000 will be described with reference to the drawings. In the following, when the material, thickness, formation process, and the like of each layer are the same as those of the active matrix substrate 1001 (see FIGS. 7A to 7C), the description thereof will be omitted. In these drawings, the TFT formation region R1 in which the TFT 100 is formed and a TFT formation region R6 in which the TFT 600 is formed are illustrated.

FIGS. 13A to 13D are schematic process cross-sectional views for explaining the manufacturing method of the active matrix substrate 3000.

Figure 13A:
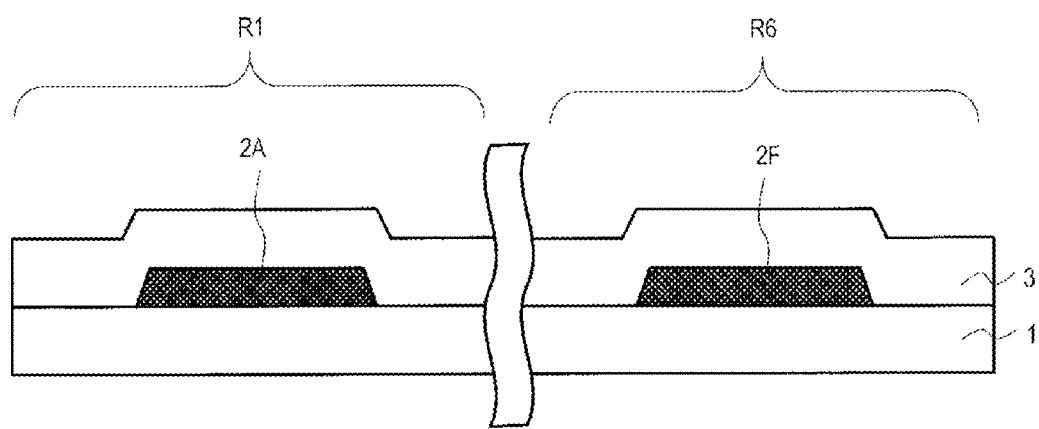
FIG. 13A is a process cross-sectional view illustrating a manufacturing method of the active matrix substrate 3000.
Figure 13B:
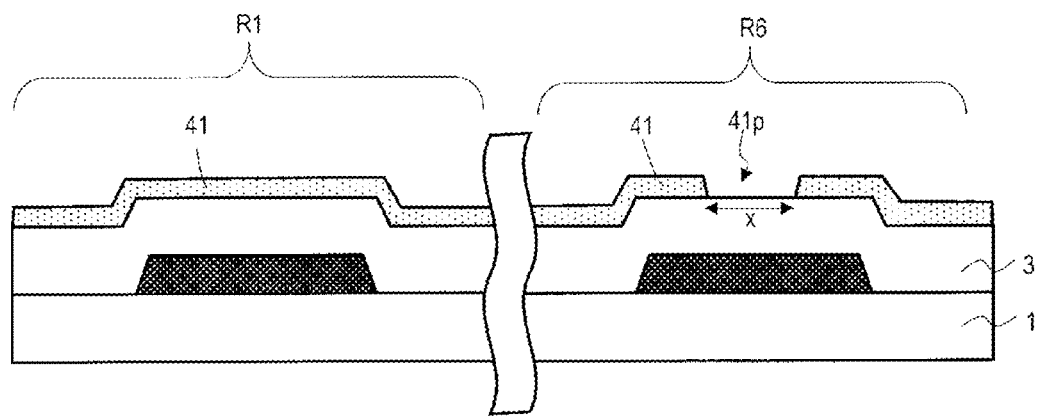
FIG. 13B is a process cross-sectional view illustrating the manufacturing method of the active matrix substrate 3000.

As illustrated in FIG. 13A, the lower conductive layers 2A and 2F and the lower insulating layer 3 are formed on the substrate 1. Subsequently, as illustrated in FIG. 13B, the lower oxide semiconductor film 41 is formed on the lower insulating layer 3, and then the lower oxide semiconductor film 41 is patterned. As a result, in the lower oxide semiconductor film 41, a part of a portion located in the TFT formation region R6 is removed to form an opening 41p. A width x of the opening 41p defines a width of the upper layer portion. The patterning of the lower oxide semiconductor film 41 may be performed by wet etching or dry etching. An oxalic acid-based etching solution or a PAN-based etching solution can be used for the wet etching.

Figure 13C:
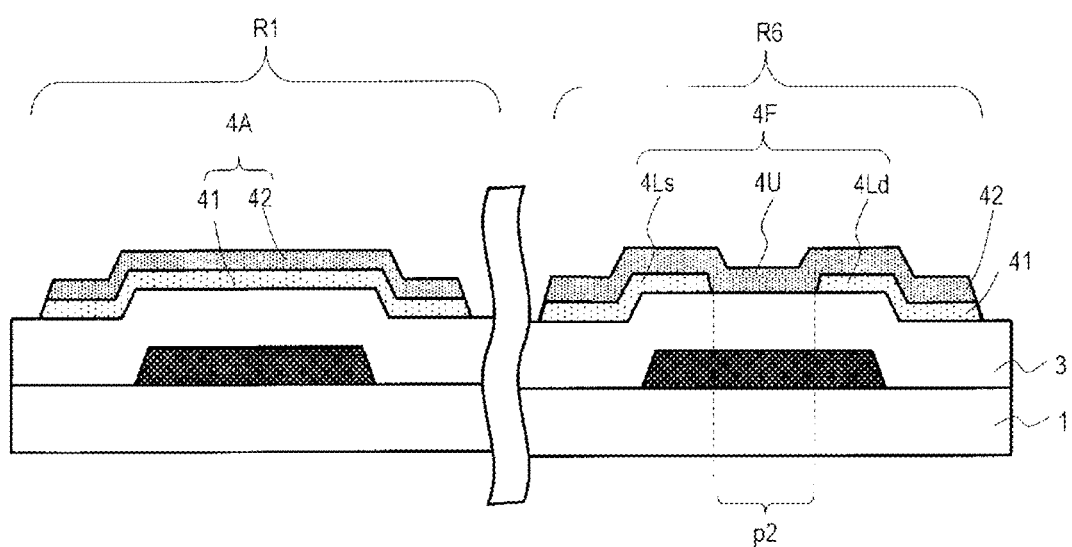
FIG. 13C is a process cross-sectional view illustrating the manufacturing method of the active matrix substrate 3000.

Subsequently, the upper oxide semiconductor film 42 is formed so as to cover the lower oxide semiconductor film 41. The upper oxide semiconductor film 42 is formed on the lower insulating layer 3, on the lower oxide semiconductor film 41, and in the opening 41p. Thereafter, the lower oxide semiconductor film 41 and the upper oxide semiconductor film 42 are patterned. The lower oxide semiconductor film 41 and the upper oxide semiconductor film 42 may be etched simultaneously. When simultaneously etching, an etching solution similar to that used in the above-described embodiment (Table 1) can be used. As a result, as illustrated in FIG. 13C, the oxide semiconductor layer 4A having a layered structure including the lower oxide semiconductor film 41 and the upper oxide semiconductor film 42 is formed in the TFT formation region R1. In the TFT formation region R6, the oxide semiconductor layer 4F including the two lower layers (first layers) 4Ls and 4Ld formed of the lower oxide semiconductor film 41 and the upper layer (second layer) 4U formed of the upper oxide semiconductor film 42 can be obtained. A part of the second layer 4U is arranged between the first layers 4Ls and 4Ld, and becomes the upper layer portion p2.

Figure 13D:
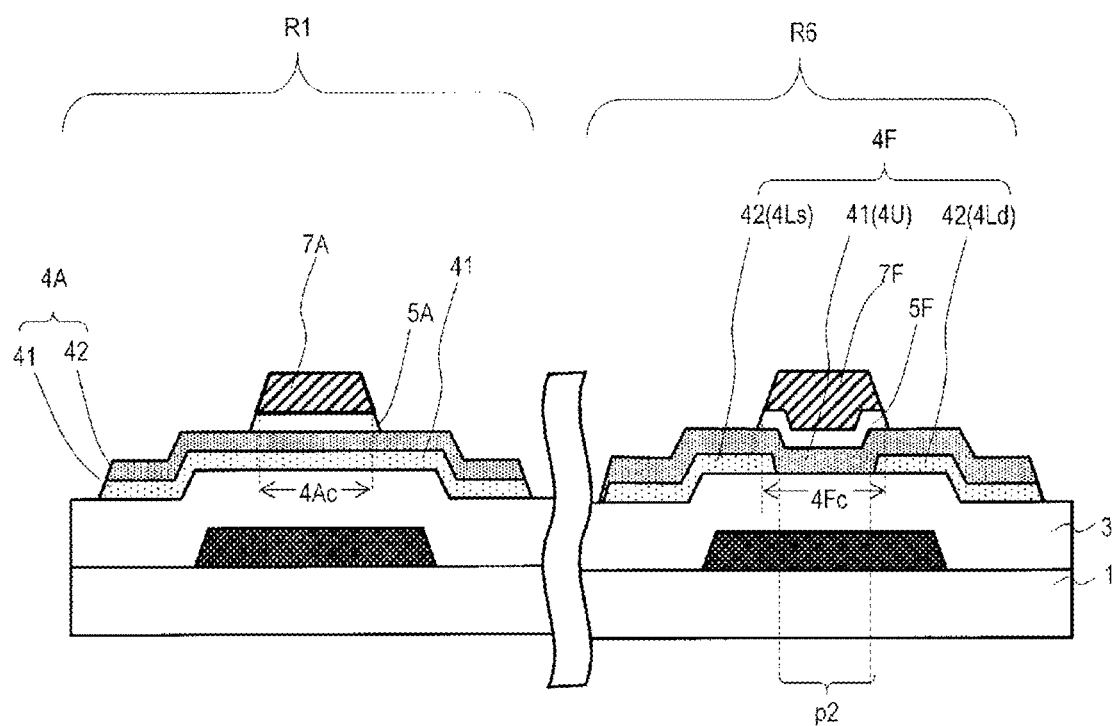
FIG. 13D is a process cross-sectional view illustrating the manufacturing method of the active matrix substrate 3000.

Subsequently, as illustrated in FIG. 13D, the gate insulating layers 5A and 5F and the gate electrodes 7A and 7F are formed on parts of the oxide semiconductor layers 4A and 4F. When viewed from the normal direction of the substrate 1, the gate electrode 7F is arranged straddling the upper layer portion p2 in the oxide semiconductor layer 4F so as to cover the end portions of the first layers 4Ls and 4Ld on the upper layer portion p2 side.

Thereafter, the interlayer insulating layer, and the source and the drain electrodes are formed by a method similar to that for manufacturing the active matrix substrate 1000, to obtain the active matrix substrate 3000.

Note that in the present embodiment as well, similarly to the embodiment described above, in the etching step of the layered film illustrated in FIG. 13C, the upper oxide semiconductor film 42 and the lower oxide semiconductor film 41 may be etched separately.

Figure 22A:
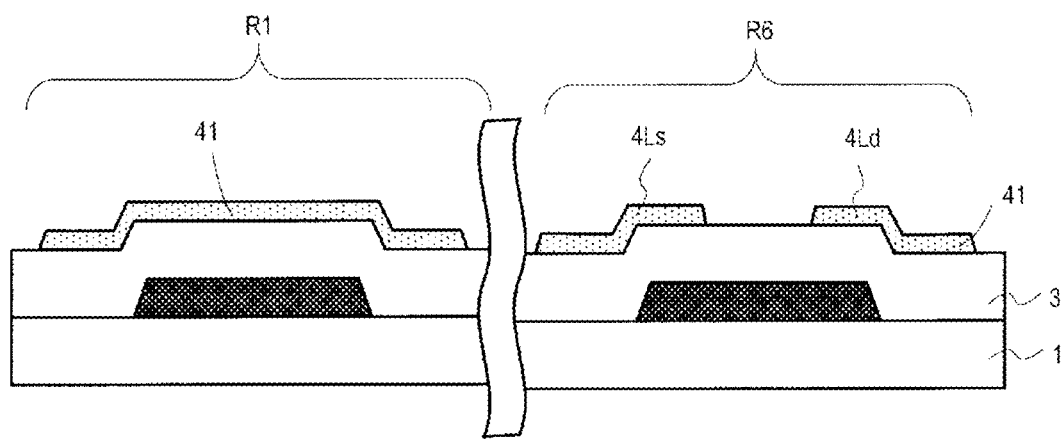
FIG. 22A is a process cross-sectional view illustrating another manufacturing method of the active matrix substrate 3000.
Figure 22B:
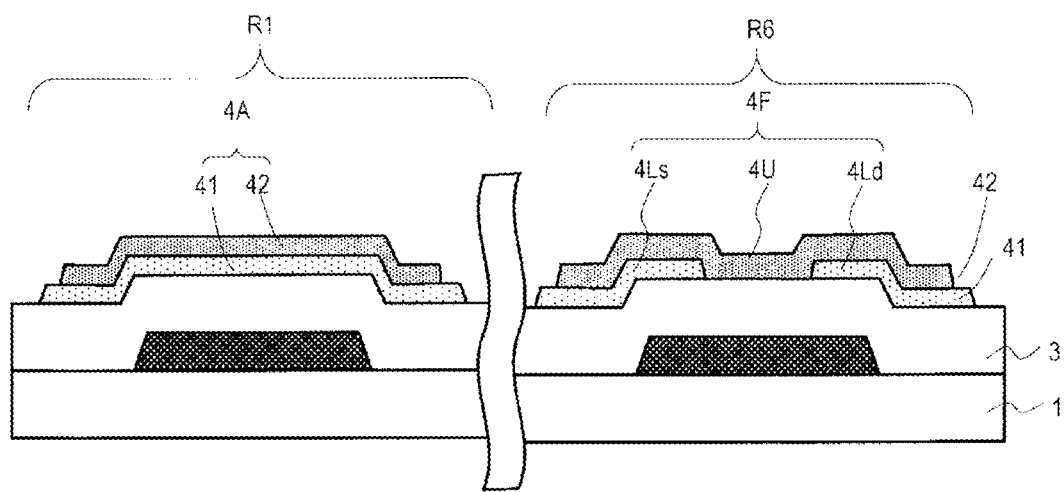
FIG. 22B is a process cross-sectional view illustrating the other manufacturing method of the active matrix substrate 3000.

Alternatively, instead of the steps illustrated in FIGS. 13B and 13C, the oxide semiconductor layers 4A and 4B may be formed as follows. First, as illustrated in FIG. 22A, the lower oxide semiconductor film 41 is formed and patterned to form the first layer of the oxide semiconductor layer 4A and the first layers 4Ls and 4Ld of the oxide semiconductor layer 4B. Subsequently, as illustrated in FIG. 22B, after the upper oxide semiconductor film 42 is formed so as to cover the lower oxide semiconductor film 41, only the upper oxide semiconductor film 42 is selectively etched. As a result, the second layers of the oxide semiconductor layers 4A and 4B are formed. For example, when the upper oxide semiconductor film 42 is an In—Ga—Zn—O based semiconductor film and the lower oxide semiconductor film 41 is an oxide semiconductor film containing Sn, it is advantageous to use the PAN-based etching solution because only the upper oxide semiconductor film 42 can be selectively etched (see Table 1). In FIG. 22B, when viewed from the normal direction of the substrate 1, the side surface of the upper oxide semiconductor film 42 is located inside relative to the side surface of the lower oxide semiconductor film 41 (the side surfaces opposite to the channel side in the first layers 4Ls and 4Ld).

Figure 22C:
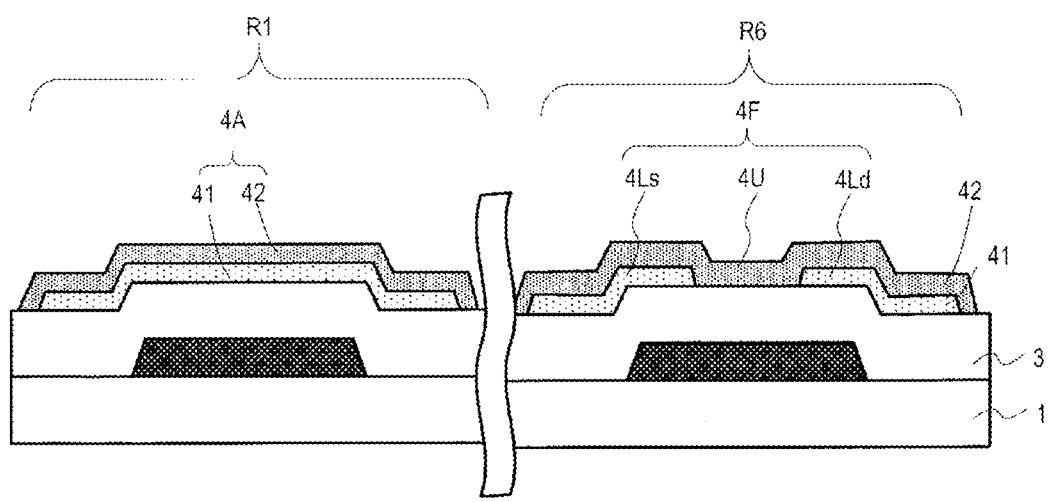
FIG. 22C is a process cross-sectional view illustrating the other manufacturing method of the active matrix substrate 3000.

Note that in the etching of the upper oxide semiconductor film 42, the upper oxide semiconductor film 42 may be formed so as to cover the upper face and the side surface of the lower oxide semiconductor film 41 as illustrated in FIG. 22C. That is, when viewed from the normal direction of the substrate 1, the lower oxide semiconductor film 41 may be located within the upper oxide semiconductor film 42.

Modification Example 4

Figure 14A:
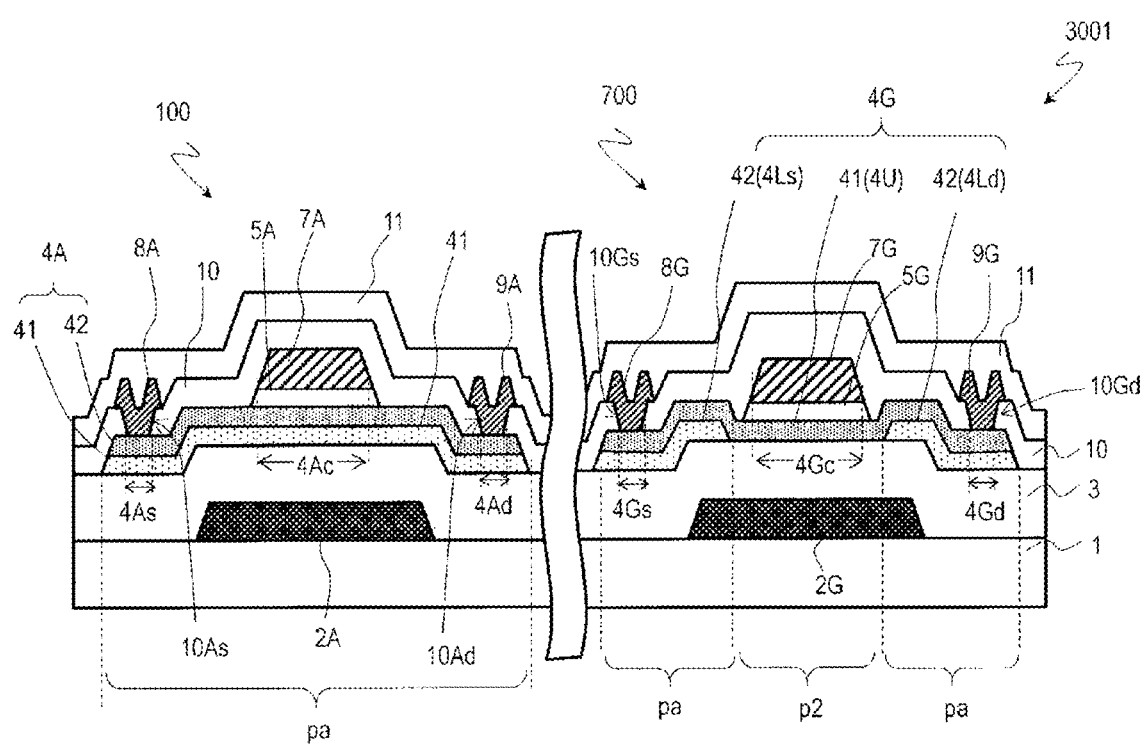
FIG. 14A is a schematic cross-sectional view illustrating the first TFT 100 and a second TFT 700 in another active matrix substrate 3001 according to the third embodiment.
Figure 14B:
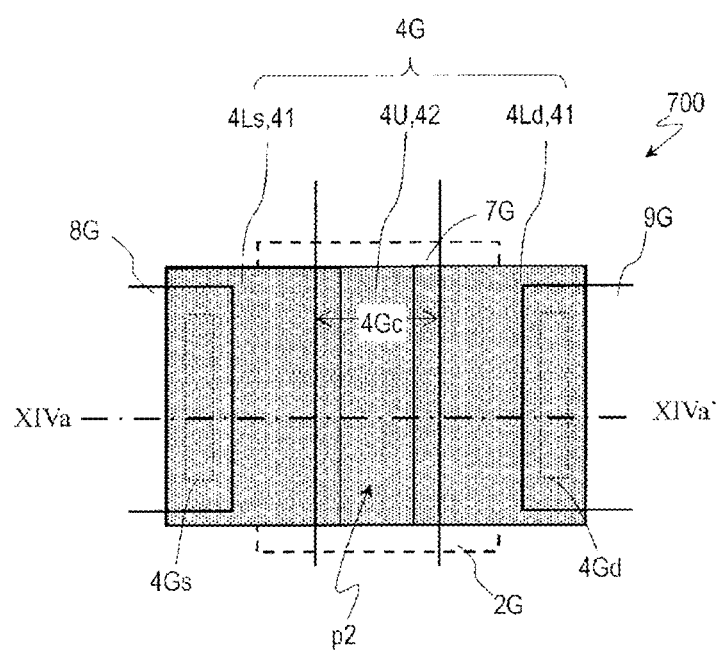
FIG. 14B is a schematic plan view of the TFT 700.

FIG. 14A is a schematic cross-sectional view illustrating the first TFT 100 and a second TFT 700 in another active matrix substrate 3001 according to the present embodiment. FIG. 14B is a schematic plan view of the TFT 700. The cross section of the TFT 700 illustrated in FIG. 14A is a cross section taken along a line XIVa-XIVa' of FIG. 14B.

Since the first TFT 100 in Modification Example 4 has a similar active layer structure to that of the TFT 100 illustrated in FIG. 2, the description thereof will be omitted.

Similar to the TFTs 100 and 600, the TFT 700 includes an oxide semiconductor layer 4G, a gate electrode 7G arranged on a part of the oxide semiconductor layer 4G with a gate insulating layer 5G interposed therebetween, and a source electrode 8G and a drain electrode 9G. The TFT 700 may further include a lower conductive layer 2G on the substrate 1 side of the oxide semiconductor layer 4G.

The TFT 700 is different from the TFT 600 illustrated in FIGS. 12A and 12B in that the upper layer portion p2 including the upper oxide semiconductor film 42 and not including the lower oxide semiconductor film 41 is provided in the entire first region 4Gc of the oxide semiconductor layer 4G. In both a first contact region 4Gs and a second contact region 4Gd of the oxide semiconductor layer 4G, the layered portions pa including the lower oxide semiconductor film 41 and the upper oxide semiconductor film 42 are provided. Note that in a part of a portion that does not overlap the gate electrode 7G in the oxide semiconductor layer 4G (second region) when viewed from the normal direction of the substrate 1, the lower oxide semiconductor film 41 may not be provided.

In the illustrated example, in the oxide semiconductor layer 4G, the two first layers 4Ls and 4Ld made of the lower oxide semiconductor film 41 are arranged so as to face each other at a distance. A second layer 4U made of the upper oxide semiconductor film 42 is formed so as to cover the first layers 4Ls and 4Ld and the gap therebetween. In the second layer 4U, a portion located between the first layers 4Ls and 4Ld is the "upper layer portion p2". The width of the gate electrode 7G in the channel length direction is smaller than the width between the first layers 4Ls and 4Ld (the width of the upper layer portion p2). When viewed from the normal direction of the substrate 1, the gate electrode 7G is arranged on a part of the upper layer portion p2 and does not overlap the second layers 4Us and 4Ud. When viewed from the normal direction of the substrate 1, in the second region not overlapping the gate electrode 7G in the oxide semiconductor layer 4G, a part of the upper layer portion p2 and the layered portion pa are provided. The structures other than the active layer are similar to the structures of the TFT 600 of the embodiment described above.

Also in the modification example, the characteristics of the TFTs 100 and 700 can be made different while suppressing an increase in contact resistance between the oxide semiconductor layers 4A and 4G and the source/drain electrodes 8A and 8G, and 9A and 9G in the TFTs 100 and 700. Also in the modification example, the mobility of the lower oxide semiconductor film 41 may be higher or lower than the mobility of the upper oxide semiconductor film 42. The magnitude relationship between the threshold voltages of the TFT 100 and the TFT 700 is similar to that in the active matrix substrate 3000.

The active matrix substrate 3001 of the modification example can be manufactured by a similar method to that for manufacturing the active matrix substrate 3000. However, the width of the opening 41p to be formed in the lower oxide semiconductor film 41 in the channel length direction is set to be sufficiently larger than the width of the gate electrode 7F. Further, the gate insulating layer 5E and the gate electrode 7E are arranged on a part of the upper layer portion p2 of the upper oxide semiconductor film 42.

Modification Example 5

The active matrix substrate of the present embodiment may include a plurality of second TFTs in which the ratio W2 of the upper layer portion p2 to the first region of the oxide semiconductor layer is different from each other.

Figure 15:
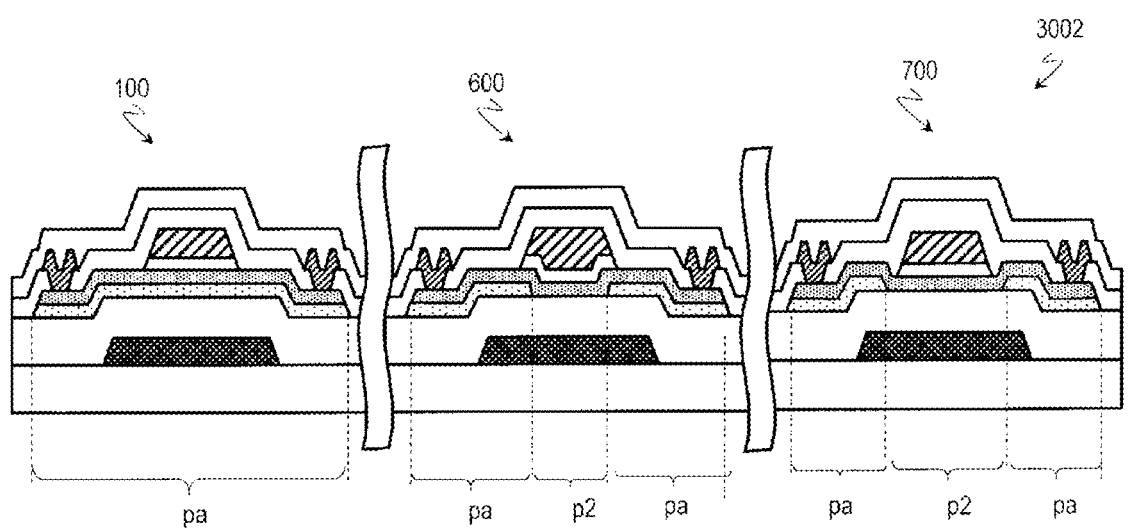
FIG. 15 is a cross-sectional view illustrating still another active matrix substrate 3002.

FIG. 15 is a cross-sectional view illustrating three oxide semiconductor TFTs in an active matrix substrate 3002 of Modification Example 5.

In the example illustrated in FIG. 15, the active matrix substrate 3002 includes the TFT 100 (W2=0), the TFT 600 (W2 is, for example, one third or more and nine tenth or less) in which the upper layer portion p2 is provided only in a part of the first region of the oxide semiconductor layer, and the TFT 700 (W2=1) in which the upper layer portion p2 is provided in the entire first region. The TFTs 600 and 700 have the structures and characteristics described above with reference to FIGS. 12A and 14A, respectively. Although not illustrated, instead of the TFT 700, the TFT 300 (W2=1) illustrated in FIG. 5A may be included.

When the upper oxide semiconductor film has a higher mobility than the lower oxide semiconductor film, the larger the ratio W2 becomes, the higher the mobility in the entire first region becomes, thereby increasing the shift amount of the threshold voltage in the negative direction. In this example, the threshold voltage of the TFT 100 (W=0) is the highest and the threshold voltage is lowered in the order of the TFT 600 and the TFT 700.

As described above, according to the modification example, the three TFTs having different characteristics can be manufactured using a process similar to that for the active matrix substrates 3000 and 3001 (without adding the masking process).

Fourth Embodiment

An active matrix substrate of the present embodiment includes three or more oxide semiconductor TFTs having different active layer structures.

In the present embodiment, the active matrix substrate is different from the above-described embodiment in that the active matrix substrate includes a TFT including the upper layer portion p2 and a TFT including the lower layer portion p1 as the second TFT.

Figure 16:
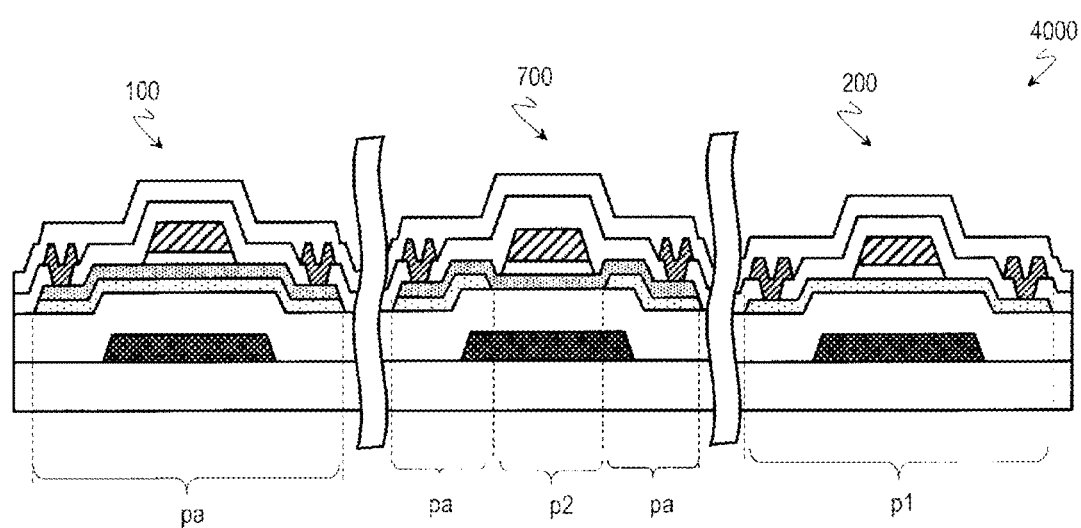
FIG. 16 is a schematic cross-sectional view illustrating an active matrix substrate 4000 of a fourth embodiment.

FIG. 16 is a schematic cross-sectional view illustrating the three oxide semiconductor TFTs in an active matrix substrate 4000 of the present embodiment.

The active matrix substrate 4000 includes the TFT 100 which is the first TFT, the TFT 700 in which the upper layer portion p2 is provided in the first region, and the TFT 200 in which the lower layer portion p1 is provided in the first region. The TFTs 100, 700, and 200 may each have similar structures and characteristics to the TFTs 100, 700, and 200 of the above-described embodiments and may be used for similar uses.

The active matrix substrate 4000 may be manufactured in a similar method to those for the above-described embodiments. However, etching steps for forming the oxide semiconductor layers of the respective TFTs are added. Specifically, in the present embodiment, after etching a lower oxide semiconductor film, an upper oxide semiconductor film is formed, and then the lower oxide semiconductor film and the upper oxide semiconductor film are collectively etched. Subsequently, only the upper oxide semiconductor film is etched. The respective etching methods and conditions may be similar to those for the embodiments described above.

Figure 17:
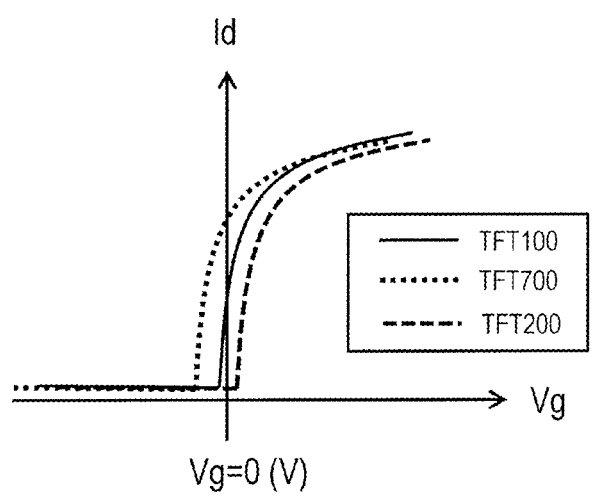
FIG. 17 is a diagram illustrating Id-Vg characteristics of the TFTs 100, 700, and 200 when a lower oxide semiconductor film has a lower mobility than an upper oxide semiconductor film.

FIG. 17 is a diagram illustrating the Id-Vg characteristics of the TFTs 100, 700, and 200 when the lower oxide semiconductor film has a lower mobility than the upper oxide semiconductor film. A threshold voltage of the TFT 700, which has the highest mobility in the entire first region, shifts in a negative direction from that of the TFT 100, and a threshold voltage of the TFT 200, which has the lowest mobility in the entire first region, shifts in a positive direction from that of the TFT 100.

In an active matrix substrate to be used in a liquid crystal display device, for example, the TFT 100 may be used as a pixel TFT, the TFT 700 may be used as an SDD circuit TFT, and the TFT 200 may be used as a drive circuit TFT. The drive circuit TFT may include, for example, the TFT 700 as an output transistor in addition to the TFT 200.

In an active matrix substrate to be used in an organic EL display device, for example, the TFT 100 may be used as the drive circuit TFT, the TFT 700 may be used as a selection TFT in a pixel circuit, and the TFT 200 may be used as a drive TFT in the pixel circuit.

Note that when the lower oxide semiconductor film has a higher mobility than the upper oxide semiconductor film, the threshold voltage of the TFT 700 shifts in the positive direction relative to that of the TFT 100, and the threshold voltage of the TFT 200 shifts in the negative direction relative to that of the TFT 100.

Figure 18:
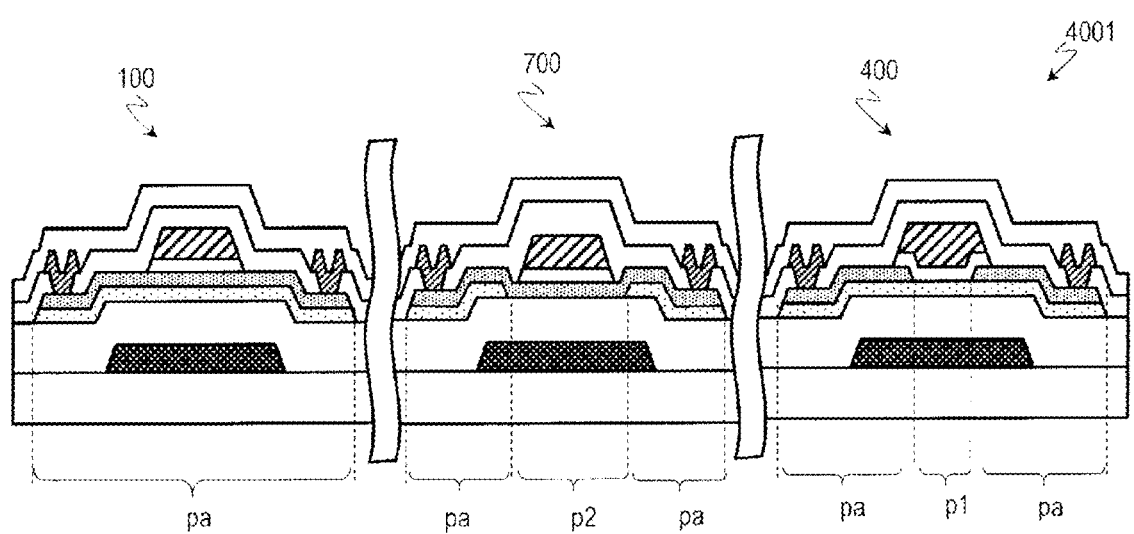
FIG. 18 is a schematic cross-sectional view illustrating another active matrix substrate 4001 of the fourth embodiment.
Figure 19:
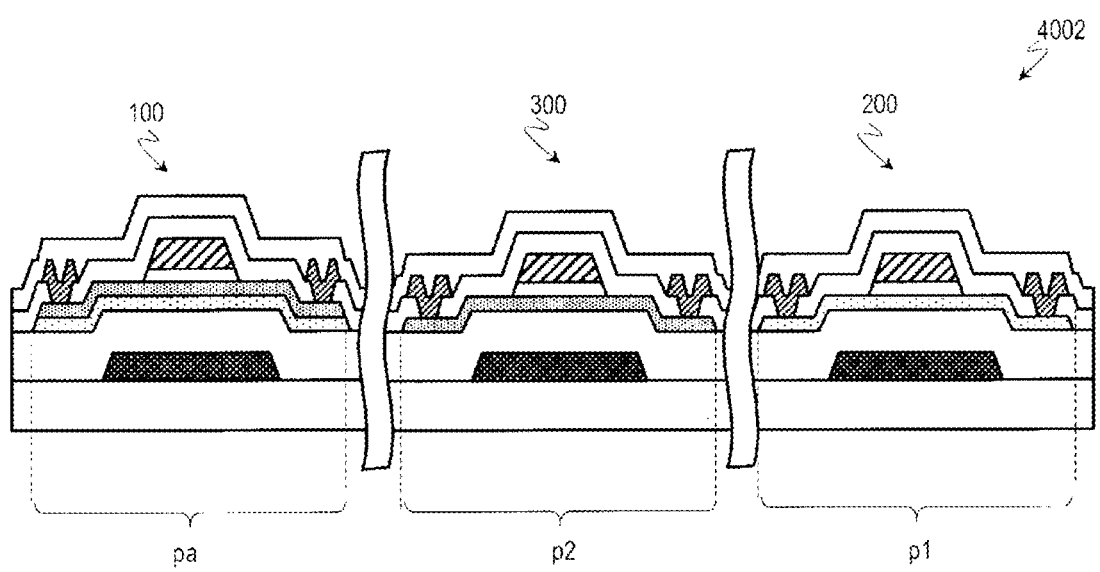
FIG. 19 is a schematic cross-sectional view illustrating still another active matrix substrate 4002.

FIGS. 18 and 19 are schematic cross-sectional views illustrating three oxide semiconductor TFTs in other active matrix substrates 4001 and 4002 of the present embodiment, respectively.

The active matrix substrate 4001 illustrated in FIG. 18 includes the TFT 100, the TFT 700 in which the upper layer portion p2 is provided in the first region of the oxide semiconductor layer, and the TFT 400 in which the lower layer portion p1 is provided in the first region of the oxide semiconductor layer.

The active matrix substrate 4002 illustrated in FIG. 19 includes the TFT 100, the TFT 300 in which the upper layer portion p2 is provided in the first region of the oxide semiconductor layer, and the TFT 200 in which the lower layer portion p1 is provided in the first region of the oxide semiconductor layer.

The TFTs included in the active matrix substrate of the present embodiment are not limited to the illustrated example, and the various TFTs described above can be used in combination.

Circuit Configuration Using TFT

Hereinafter, an example of a circuit configuration monolithically formed in the active matrix substrates of the first to fourth embodiments will be described.

Configuration and Operation of Gate Drive Circuit

The gate drive circuit includes a shift register. The shift register includes a plurality of unit shift register circuits connected in multiple stages.

Figure 24:
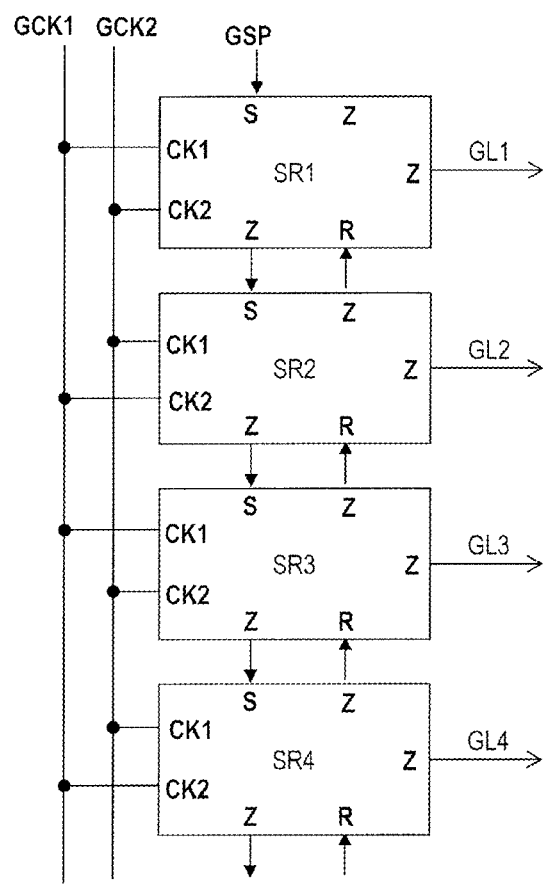
FIG. 24 is a diagram illustrating a shift register circuit in a gate drive circuit.

FIG. 24 is a diagram illustrating the shift register circuit.

The shift register circuit includes a plurality of unit shift register circuits SR1 to SRz (z is an integer of 2 or more) (hereinafter, collectively referred to as "unit shift register circuit SR"). The unit shift register circuit SR in each stage includes a set terminal S that receives a set signal, an output terminal Z that outputs an output signal, a reset terminal R that receives a reset signal, and clock input terminals CK1 and CK2 that receive clock signals GCK1 and GCK2. In the unit shift register circuit SRα (α≥2), the output signal of the unit shift register circuit SR in the previous stage is inputted to the set terminal S. The set terminal S of the unit shift register circuit SR1 in the first stage receives a gate start pulse signal GSP. The unit shift register circuit SR in each stage also outputs the output signal to a corresponding gate bus line GL arranged in the display region. The reset terminal R receives an output signal from the unit shift register circuit in the next stage. The reset terminal R of the unit shift register circuit SRz in the final stage receives a clear signal.

The two clock input terminals receive two-phase clock signals GCK1 and GCK2, respectively. One of the clock input terminals receives the clock signal GCK1, and the other of the clock input terminals receives the clock signal GCK2. The clock signals to be inputted to the respective clock input terminals are configured to be alternately switched between adjacent stages.

Figure 25:
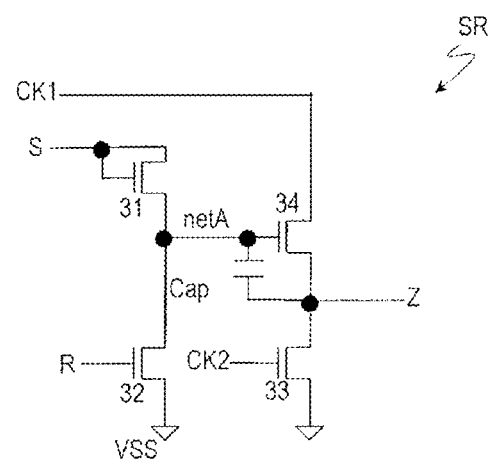
FIG. 25 is a diagram illustrating a unit shift register circuit SR.

FIG. 25 is a diagram illustrating an example of the unit shift register circuit SR. In the example, the unit shift register circuit SR includes four TFTs 31 to 34 and a capacitance portion Cap.

The TFT 31 is an input transistor. A gate and a drain of the TFT 31 are connected to the set terminal, and a source of the TFT 31 is connected to a gate of the TFT 34. The TFT 34 is an output transistor. A drain of the TFT 34 is connected to the clock input terminal CK1, and a source of the TFT 34 is connected to the output terminal Z. That is, the TFT 34 serves as a transmission gate to pass and block the clock signal to be inputted to the clock input terminal CK1.

The capacitance portion Cap is connected between the gate and the source of the TFT 34 being the output transistor. In the description, a node connected to the gate of the TFT 34 is referred to as a "node netA" and a node connected to the output terminal Z is referred to as a "node Z". One electrode of the capacitance portion Cap is connected to the gate of the TFT 34 and the node netA, and another electrode is connected to the source of the TFT 34 and the node Z.

The TFT 32 is arranged between a low power supply input terminal and the node netA. The TFT 32 serves as a pull-down transistor to reduce a potential at the node netA. A gate of the TFT 32 is connected to the reset terminal, a drain of the TFT 32 is connected to the node netA, and a source of the TFT 32 is connected to the low power supply input terminal.

The TFT 33 is connected to the node Z. A gate of the TFT 33 is connected to the input terminal of the clock signal CK2, a drain of the TFT 33 is connected to the node Z, and a source of the TFT 33 is connected to the low power supply input terminal.

In the embodiment of the present disclosure, as the TFTs 31 to 34, TFTs having a lower mobility than, for example, the SSD circuit TFT or the pixel TFT and having enhancement characteristics may be used.

Alternatively, two types of TFTs having different characteristics can be mixed in the gate drive circuit depending on the use. For example, the TFT having a large current driving force (high mobility) may be used as some TFTs including at least the TFT 34 (output transistor), and the TFT having a lower mobility than the TFT 34 may be used as the other TFTs.

Note that the configuration of the drive circuit is not limited to the illustrated configuration. For example, the unit shift register circuit may have five or more TFTs including an output transistor.

Configuration and Operation of SSD Circuit

Figure 26:
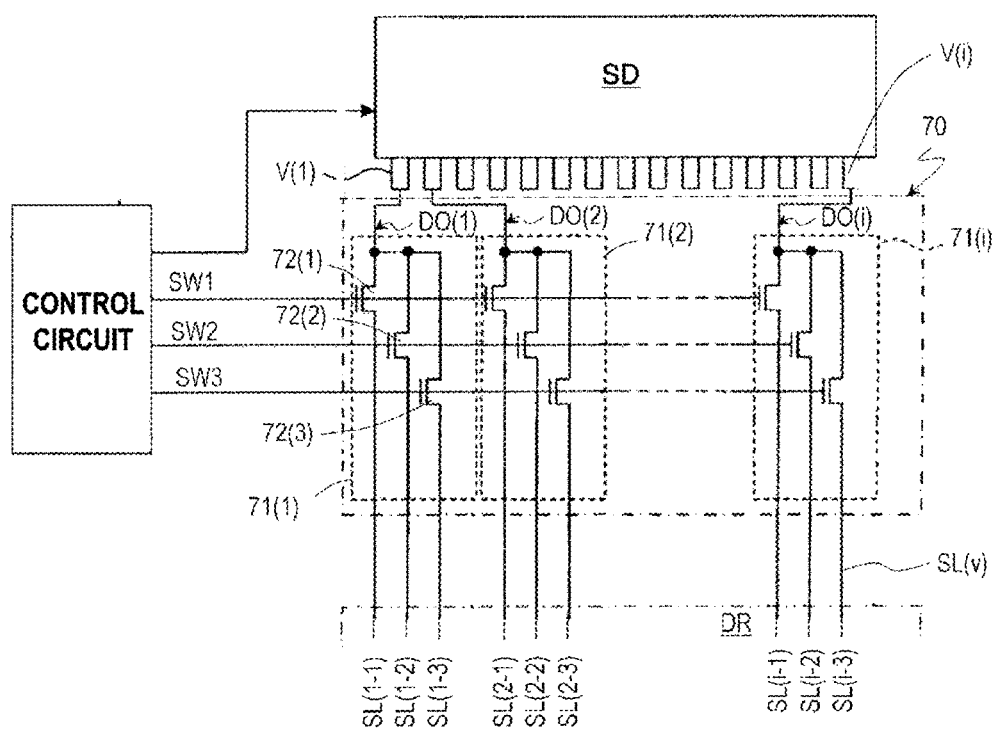
FIG. 26 is a diagram illustrating an SSD circuit.

FIG. 26 is a diagram illustrating an SSD circuit 70.

The SSD circuit 70 is arranged between the source driver SD and the display region DR. The SSD circuit 600 includes a plurality of SSD unit circuits 71(1) to 71(i) (i is an integer of 2 or more) (collectively referred to as "SSD unit circuit 71" in some cases) and control signal trunk lines SW1 to SWn (n is an integer of 2 or more, here, n=3). The SSD circuit 600 and the source driver SD are controlled by a control circuit provided in the non-display region FR. The control signal trunk lines SW1 to SWn are connected to the control circuit.

Each of output terminals V(1) to V(i) of the source driver SD (hereafter, collectively referred to as "V terminal" in some cases) is connected to one of a plurality of video signal lines DO(1) to DO(i) (collectively referred to as "video signal line DO" in some cases). A grouped n source bus lines SL are associated with one video signal line DO. For each video signal line, the SSD unit circuit 71 is provided between the video signal line DO and the grouped source bus lines SL. The SSD unit circuit 71 distributes video data from one video signal line DO to the n source bus lines SL.

In the present embodiment, the N-th video signal line among the plurality of video signal lines DO(1) to DO(i) is designated as DO(N) (N is an integer from 1 to i), and the SSD unit circuit 71 and the source bus lines SL associated with the video signal line DO(N) are designated as 71(N) and SL(N–1) to SL(N–n), respectively. The source bus lines SL(N–1) to SL(N–n) may be associated, for example, with R, G, and B pixels (i.e., n=3).

Each SSD unit circuit 71(N) includes at least n (here, three) thin film transistors (SSD circuit TFTs) 72(1) to 72(n) (which may be collectively referred to as "SSD circuit TFT 72").

The SSD circuit TFT 72 functions as a selection switch. A gate electrode of the SSD circuit TFT 72 is electrically connected to corresponding one among the n control signal trunk lines SW1 to SWn. A source electrode of the SSD circuit TFT 72 is electrically connected to a branch wiring line of the video signal line DO(N). A drain electrode of the SSD circuit TFT 72 is connected to corresponding one among the source bus lines SL(N–1) to SL(N–3).

A selection signal (control signal) is supplied to the gate electrode of the SSD circuit TFT 72 from one of the control signal trunk lines SW1 to SW3. The control signal defines an on period of the selection switch within the same group and is synchronized with the time-sequential signal outputted from the source driver SD. The SSD unit circuit 71(N) writes the data potentials obtained by time-dividing the output of the video signal line DO(N) to the plurality of source bus lines from SL(N-1) to SL(N-n) (time division drive) time-sequentially. As a result, the number of V terminals of the source driver SD can be reduced, so that the area of the non-display region FR can be further reduced (the frame can be narrowed).

The current driving force is required for the SSD circuit TFT 72. When a TFT having a small current driving force is used for the SSD circuit TFT 72, it may be difficult to charge the source bus line at a predetermined time. On the other hand, when the channel width of the TFT is increased in order to ensure the desired current driving force, the size of the TFT may increase, and the frame narrowing may not be achieved. According to the embodiment of the present disclosure, as the SSD circuit TFT 72, a TFT having a higher mobility than other circuit TFTs or pixel TFTs, that is, a TFT having a larger current driving force can be used. The SSD circuit TFT 72 may have depletion characteristics.

Note that the configuration of the SSD circuit is not limited to the illustrated configuration. The configuration, operation, and the like of the SSD circuit are disclosed in JP 2008-225036 A, JP 2006-119404 A, WO 2011/118079, and the like. In the description, the entire contents of the disclosures of JP 2008-225036 A, JP 2006-119404 A, and WO 2011/118079 are incorporated herein by reference.

Here, Table 2 illustrates suitable characteristics of the pixel TFT, the drive circuit TFT, and the SSD circuit TFT in liquid crystal display devices. The characteristics and numerical ranges set forth in Table 2 are examples, and are not limited to the characteristics of each TFT.

TABLE 2

| Use of TFT | Pixel TFT | Drive circuit TFT | SSD circuit TFT Drive circuit TFT (output transistor) |
|---|---|---|---|
| Threshold voltage | Depletion to enhancement −1 V or more | Enhancement 0 V or more | Depletion is possible for SSD circuit TFT −2 V or more |
| Mobility | Low to medium 5 cm²/Vs or more 20 cm²/Vs or less | Low to medium 5 cm²/Vs or more 20 cm²/Vs or less | High 20 cm²/Vs or more |

Configuration and Operation of Pixel Circuit

An active matrix substrate used as a backplane for an organic EL device includes pixel circuits in the respective pixel areas.

Figure 27:
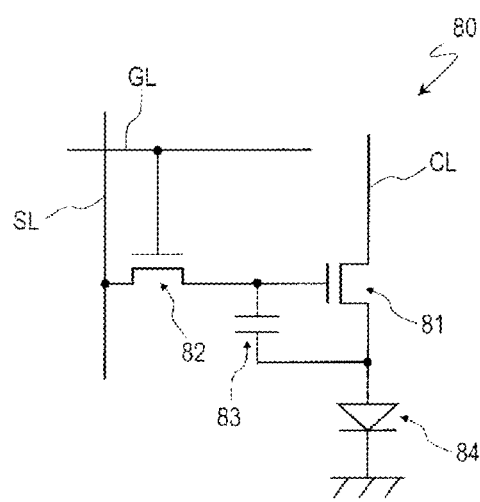
FIG. 27 is a diagram illustrating a pixel circuit.

FIG. 27 is a diagram illustrating a pixel circuit 80.

The pixel circuit 80 includes a drive TFT 81, a selection TFT 82, and a capacitance element (holding capacitor) 83. The drive TFT 81 and the selection TFT 82 are oxide semiconductor TFTs supported on the substrate 1, respectively.

A gate electrode of the selection TFT 82 is connected to the gate bus line GL. A source electrode of the selection TFT 82 is connected to the source bus line SL. A drain electrode of the selection TFT 82 is connected to a gate electrode of the drive TFT 81 and the capacitance element 83. A source electrode of the drive TFT 81 is connected to a current supply line CL. A drain electrode of the drive TFT 81 is connected to an organic light emitting diode (OLED) 84 formed on the active matrix substrate.

When an on signal is supplied from the gate bus line GL to the gate electrode of the selection TFT 82, the selection TFT 82 is brought into an on state, and thus a signal voltage from the source bus line SL (corresponding to desired light emission luminance of the OLED 84) is applied to the capacitance element 83 and the gate electrode of the drive TFT 81 via the selection TFT 82. When the drive TFT 81 is brought into the on state by the signal voltage, a current from the current supply line CL flows through the drive TFT 81 to the OLED 84, and then the OLED 84 emits light.

According to the embodiment of present disclosure, a plurality of oxide semiconductor TFTs (here, the drive TFT 81 and the selection TFT 82) having different required characteristics can be produced separately in the pixel circuit 80. For example, a TFT having a lower mobility (having the threshold voltage shifted in the positive direction) than the selection TFT 82 may be used as the drive TFT 81.

Note that the configuration of the pixel circuit is not limited to the configuration illustrated in FIG. 27. Each pixel circuit may include three or more TFTs including the drive TFT 81 and the selection TFT 82.

Table 3 illustrates suitable characteristics of the drive TFT and the selection TFT in the pixel circuit and the drive circuit TFT for the organic EL display devices. The characteristics and numerical ranges set forth in Table 3 are examples, and are not limited to the characteristics of each TFT.

TABLE 3

| Use of TFT | Drive TFT in pixel circuit | Selection TFT in pixel circuit | Output transistor in drive circuit |
|---|---|---|---|
| Threshold voltage | Enhancement 1 V or more | Depletion to enhancement −1 V or more | Enhancement 0 V or more |
| Mobility | Low to medium 10 cm²/Vs or less | High 20 cm²/Vs or more | High 20 cm²/Vs or more |
| S value | Large | Small | Small |

Oxide Semiconductor

The oxide semiconductor included in the oxide semiconductor layer of each TFT according to the present embodiment may be an amorphous oxide semiconductor or a crystalline oxide semiconductor including a crystalline portion. Examples of the crystalline oxide semiconductor include a polycrystalline oxide semiconductor, a microcrystalline oxide semiconductor, and a crystalline oxide semiconductor having a c-axis oriented substantially perpendicular to the layer surface.

The oxide semiconductor layer may have a layered structure including two or more layers. When the oxide semiconductor layer has the layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. The oxide semiconductor layer may include a plurality of amorphous oxide semiconductor layers. In a case where the oxide semiconductor layer has a dual-layer structure including an upper layer and a lower layer, an energy gap of the oxide semiconductor included in a layer positioned on the gate electrode side of the dual-structure (that is the lower layer in the case of the bottom gate structure, and the upper layer in the case of the top gate structure) may be smaller than an energy gap of the oxide semiconductor included in a layer positioned opposite to the gate electrode (that is the upper layer in the case of the bottom gate structure, and the lower layer in the case of the top gate structure). However, in a case where a difference in the energy gap between these layers is relatively small, the energy gap of the oxide semiconductor included in the layer positioned on the gate electrode side may be greater than the energy gap of the oxide semiconductor included in the layer positioned opposite to the gate electrode.

Materials, structures, and film formation methods of an amorphous oxide semiconductor and the above-described crystalline oxide semiconductors, a configuration of an oxide semiconductor layer having a layered structure, and the like are described in, for example, JP 2014-007399 A. The entire contents of the disclosure of JP 2014-007399 A are incorporated herein by reference.

The oxide semiconductor layer may include, for example, at least one metal element selected from In, Ga, and Zn. In the present embodiment, the oxide semiconductor layer includes, for example, an In—Ga—Zn—O based semiconductor (for example, an indium gallium zinc oxide). Here, the In—Ga—Zn—O based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, or In:Ga:Zn=1:1:2, or the like. Such an oxide semiconductor layer can be formed of an oxide semiconductor film including an In—Ga—Zn—O based semiconductor.

The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that the crystal structure of the crystalline In—Ga—Zn—O based semiconductor is disclosed in, for example, JP 2014-007399 A, JP 2012-134475 A, and JP 2014-209727 A described above. The entire contents of the disclosure of JP 2012-134475 A and JP 2014-209727 A are incorporated herein by reference. A TFT including an In—Ga—Zn—O based semiconductor layer has a high mobility (more than 20 times as compared to an a-Si TFT) and a low leakage current (less than $1/100$-th as compared to the a-Si TFT). Thus, such a TFT can be suitably used as a drive TFT (for example, a TFT included in a drive circuit provided in a periphery of a display region including a plurality of pixels, and on the same substrate as the display region) and a pixel TFT (TFT provided in a pixel).

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, an In—W—Zn—O based semiconductor, and the like.

INDUSTRIAL APPLICABILITY

Embodiments of the present disclosure may be suitably applied to an active matrix substrate including the mono- lithically formed peripheral circuits. Such an active matrix substrate can be applied to various electronic devices such as a display device such as a liquid crystal display device, an organic electroluminescence (EL) display device, and an inorganic electroluminescence display device and the like, an imaging device such as an image sensor, an image input device, a fingerprint reader, and a semiconductor memory and the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An active matrix substrate having a display region including a plurality of pixel areas and a non-display region arranged around the display region, the active matrix substrate comprising:
   a substrate; and
   a plurality of oxide semiconductor TFTs supported on the substrate and provided in the display region or the non-display region, each of the plurality of oxide semiconductor TFTs includes an oxide semiconductor layer and a gate electrode arranged on a part of the oxide semiconductor layer with a gate insulating layer interposed between the oxide semiconductor layer and the gate electrode,
   wherein the oxide semiconductor layer has a first region covered with the gate electrode with the gate insulating layer interposed between the oxide semiconductor layer and the gate electrode,
   a first TFT and a second TFT are included in the plurality of oxide semiconductor TFTs,
   in the first TFT, in the first region, the oxide semiconductor layer has a layered structure including a lower oxide semiconductor film and an upper oxide semiconductor film arranged on the lower oxide semiconductor film throughout and a mobility of the upper oxide semiconductor film is higher than a mobility of the lower oxide semiconductor film,
   in the second TFT, in at least a part of the first region of the oxide semiconductor layer, of the lower oxide semiconductor film and the upper oxide semiconductor film, one oxide semiconductor film is provided and another oxide semiconductor film is not provided, and
   in the at least a part of the first region in the second TFT, the lower oxide semiconductor film is provided and the upper oxide semiconductor film is not provided.

2. The active matrix substrate according to claim 1,
   wherein in the first TFT, the gate insulating layer is in contact with an upper face of the upper oxide semiconductor film, and
   in the second TFT, the gate insulating layer is in contact with an upper face of the one oxide semiconductor film.

3. The active matrix substrate according to claim 1,
   wherein the first TFT is arranged in each of the plurality of pixel areas, and
   the second TFT is included in a peripheral circuit arranged in the non-display region.

4. The active matrix substrate according to claim 1,
   wherein in each of the plurality of pixel areas, a pixel circuit including at least a drive TFT, a selection TFT, and a capacitance element is provided, and
   of the first TFT and the second TFT, one TFT is the drive TFT and another TFT is the selection TFT.

5. An active matrix substrate having a display region including a plurality of pixel areas and a non-display region arranged around the display region, the active matrix substrate comprising:
- a substrate; and
- a plurality of oxide semiconductor TFTs supported on the substrate and provided in the display region or the non-display region, each of the plurality of oxide semiconductor TFTs includes an oxide semiconductor layer, a gate electrode arranged on a part of the oxide semiconductor layer with a gate insulating layer interposed between the oxide semiconductor layer and the gate electrode, a source electrode, and a drain electrode,
- wherein the oxide semiconductor layer has a first region covered with the gate electrode with the gate insulating layer interposed between the oxide semiconductor layer and the gate electrode, and a first contact region and a second contact region located on both sides of the first region, and the first contact region is electrically connected to the source electrode, and the second contact region is electrically connected to the drain electrode,
- a first TFT and a second TFT are included in the plurality of oxide semiconductor TFTs,
- in the first TFT, in the first region, the oxide semiconductor layer has a layered structure including a lower oxide semiconductor film and an upper oxide semiconductor film arranged on the lower oxide semiconductor film throughout, and mobilities of the upper oxide semiconductor film and the lower oxide semiconductor film are different from each other,
- in the second TFT, in the first contact region and the second contact region, the oxide semiconductor film has the layered structure, but in at least a part of the first region, of the lower oxide semiconductor film and the upper oxide semiconductor film, one oxide semiconductor film is provided and another oxide semiconductor film is not provided, and
- a mobility of the upper oxide semiconductor film is lower than a mobility of the lower oxide semiconductor film.

6. The active matrix substrate according to claim 5, wherein in the at least a part of the first region in the second TFT, the lower oxide semiconductor film is provided and the upper oxide semiconductor film is not provided.

7. The active matrix substrate according to claim 5, wherein in the at least a part of the first region in the second TFT, the upper oxide semiconductor film is provided and the lower oxide semiconductor film is not provided.

8. The active matrix substrate according to claim 5, wherein in the second TFT, the oxide semiconductor layer has the layered structure in a part of the first region, and includes the one oxide semiconductor film and does not include the other oxide semiconductor film, in another part of the first region.

9. The active matrix substrate according to claim 5, wherein in the second TFT, in the entirety of the first region of the oxide semiconductor layer, the one oxide semiconductor film is provided, and the other oxide semiconductor film is not provided.

10. The active matrix substrate according to claim 5, wherein each of the plurality of oxide semiconductor TFTs further includes an insulating layer covering the oxide semiconductor layer and the gate electrode, and the source electrode is in contact with the first contact region in a first opening formed in the insulating layer, and the drain electrode is in contact with the second contact region in a second opening formed in the insulating layer.

11. The active matrix substrate according to claim 5, wherein in the first TFT, the gate insulating layer is in contact with an upper face of the upper oxide semiconductor film, and
in the second TFT, the gate insulating layer is in contact with an upper face of the one oxide semiconductor film.

12. The active matrix substrate according to claim 5, wherein a third TFT is further included in the plurality of oxide semiconductor TFTs, and
in the third TFT, in the at least a part of the first region in the oxide semiconductor layer, the other oxide semiconductor film is provided, and the one oxide semiconductor film is not provided.

13. The active matrix substrate according to claim 5, wherein the first TFT is arranged in each of the plurality of pixel areas, and
the second TFT is included in a peripheral circuit arranged in the non-display region.

14. The active matrix substrate according to claim 5, wherein in each of the plurality of pixel areas, a pixel circuit including at least a drive TFT, a selection TFT, and a capacitance element is provided, and
of the first TFT and the second TFT, one TFT is the drive TFT and another TFT is the selection TFT.

15. An active matrix substrate having a display region including a plurality of pixel areas and a non-display region arranged around the display region, the active matrix substrate comprising:
- a substrate; and
- a plurality of oxide semiconductor TFTs supported on the substrate and provided in the display region or the non-display region, each of the plurality of oxide semiconductor TFTs includes an oxide semiconductor layer, a gate electrode arranged on a part of the oxide semiconductor layer with a gate insulating layer interposed between the oxide semiconductor layer and the gate electrode, a source electrode, and a drain electrode,
- wherein the oxide semiconductor layer has a first region covered with the gate electrode with the gate insulating layer interposed between the oxide semiconductor layer and the gate electrode, and a first contact region and a second contact region located on both sides of the first region, and the first contact region is electrically connected to the source electrode, and the second contact region is electrically connected to the drain electrode,
- a first TFT and a second TFT are included in the plurality of oxide semiconductor TFTs,
- in the first TFT, in the first region, the oxide semiconductor layer has a layered structure including a lower oxide semiconductor film and an upper oxide semiconductor film arranged on the lower oxide semiconductor film throughout, and mobilities of the upper oxide semiconductor film and the lower oxide semiconductor film are different from each other,
- in the second TFT, in the first contact region and the second contact region, the oxide semiconductor film has the layered structure, but in at least a part of the first region, of the lower oxide semiconductor film and the upper oxide semiconductor film, one oxide semiconductor film is provided and another oxide semiconductor film is not provided,
- a third TFT is further included in the plurality of oxide semiconductor TFTs, in the second TFT, in the entirety of the first region, of the lower oxide semiconductor film and the upper oxide semiconductor film, one oxide semiconductor film is provided and another oxide semiconductor film is not provided, and in the third TFT, in the first contact region, the second contact region, and a part of the first region, the oxide semiconductor layer has the layered structure, in another part of the first region, the one oxide semiconductor film is provided and the other oxide semiconductor film is not provided.

16. The active matrix substrate according to claim 15, wherein in the at least a part of the first region in the second TFT, the lower oxide semiconductor film is provided and the upper oxide semiconductor film is not provided.

17. The active matrix substrate according to claim 15, wherein in the at least a part of the first region in the second TFT, the upper oxide semiconductor film is provided and the lower oxide semiconductor film is not provided.

18. An active matrix substrate having a display region including a plurality of pixel areas and a non-display region arranged around the display region, the active matrix substrate comprising:

a substrate; and a plurality of oxide semiconductor TFTs supported on the substrate and provided in the display region or the non-display region, each of the plurality of oxide semiconductor TFTs includes an oxide semiconductor layer and a gate electrode arranged on a part of the oxide semiconductor layer with a gate insulating layer interposed between the oxide semiconductor layer and the gate electrode, wherein the oxide semiconductor layer has a first region covered with the gate electrode with the gate insulating layer interposed between the oxide semiconductor layer and the gate electrode, a first TFT and a second TFT are included in the plurality of oxide semiconductor TFTs, in the first TFT, in the first region, the oxide semiconductor layer has a layered structure including a lower oxide semiconductor film and an upper oxide semiconductor film arranged on the lower oxide semiconductor film throughout and a mobility of the upper oxide semiconductor film is higher than a mobility of the lower oxide semiconductor film, in the second TFT, in at least a art of the first region of the oxide semiconductor layer, of the lower oxide semiconductor film and the upper oxide semiconductor film, one oxide semiconductor film is provided and another oxide semiconductor film is not provided, a third TFT is further included in the plurality of oxide semiconductor TFTs, and in the third TFT, in the at least a part of the first region in the oxide semiconductor layer, the other oxide semiconductor film is provided, and the one oxide semiconductor film is not provided.

19. The active matrix substrate according to claim 18, wherein the first TFT is arranged in each of the plurality of pixel areas, and the second TFT is included in a peripheral circuit arranged in the non-display region.

20. The active matrix substrate according to claim 18, wherein in each of the plurality of pixel areas, a pixel circuit including at least a drive TFT, a selection TFT, and a capacitance element is provided, and of the first TFT and the second TFT, one TFT is the drive TFT and another TFT is the selection TFT.

* * * * *